(12) United States Patent
Ramaswamy et al.

(10) Patent No.: US 12,250,825 B2
(45) Date of Patent: Mar. 11, 2025

(54) INTEGRATED ASSEMBLIES AND METHODS OF FORMING INTEGRATED ASSEMBLIES

(71) Applicant: Micron Technology, Inc., Boise, ID (US)

(72) Inventors: Durai Vishak Nirmal Ramaswamy, Boise, ID (US); Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/429,677

(22) Filed: Feb. 1, 2024

(65) Prior Publication Data

US 2024/0215258 A1 Jun. 27, 2024

Related U.S. Application Data

(63) Continuation of application No. 17/381,040, filed on Jul. 20, 2021, now Pat. No. 11,917,834.

(51) Int. Cl.
| | |
|---|---|
| *H10B 53/50* | (2023.01) |
| *G11C 11/22* | (2006.01) |
| *H10B 53/10* | (2023.01) |
| *H10B 53/30* | (2023.01) |
| *H10B 53/40* | (2023.01) |

(52) U.S. Cl.
CPC ............ *H10B 53/50* (2023.02); *G11C 11/221* (2013.01); *H10B 53/10* (2023.02); *H10B 53/30* (2023.02); *H10B 53/40* (2023.02)

(58) Field of Classification Search
None
See application file for complete search history.

(56) References Cited

U.S. PATENT DOCUMENTS

| | | |
|---|---|---|
| 5,406,447 A | 4/1995 | Miyazaki |
| 8,901,704 B2 | 12/2014 | Kang |
| 8,934,283 B2 | 1/2015 | Matsudaira et al. |
| 9,245,893 B1 | 1/2016 | Sukekawa |
| 9,837,420 B1 | 12/2017 | Ramaswamy |
| 10,020,360 B1 | 7/2018 | Ramaswamy |
| 11,706,927 B2 | 7/2023 | Servalli et al. |

(Continued)

FOREIGN PATENT DOCUMENTS

JP 2009-010424 1/2009

OTHER PUBLICATIONS

WO PCT/US2022/037148 Search Rprt., Nov. 3, 2022, Micron Technology, Inc.

(Continued)

*Primary Examiner* — Tan T. Nguyen
(74) *Attorney, Agent, or Firm* — Wells St. John P.S.

(57) ABSTRACT

Some embodiments include an integrated assembly having a first bottom electrode adjacent to a second bottom electrode. An intervening region is directly between the first and second bottom electrodes. Capacitor-insulative-material is adjacent to the first and second bottom electrodes. The capacitor-insulative-material is substantially not within the intervening region. Top-electrode-material is adjacent to the capacitor-insulative-material. Some embodiments include methods of forming integrated assemblies.

14 Claims, 68 Drawing Sheets

(56) References Cited

U.S. PATENT DOCUMENTS

| | | | |
|---|---|---|---|
| 2001/0022372 A1* | 9/2001 | Kanaya | H10B 53/00 257/295 |
| 2005/0127428 A1 | 6/2005 | Mokhlesi et al. | |
| 2006/0002192 A1 | 1/2006 | Forbes et al. | |
| 2006/0244023 A1* | 11/2006 | Kanaya | H10B 53/30 257/295 |
| 2007/0216467 A1 | 9/2007 | Akiyama et al. | |
| 2008/0096341 A1 | 4/2008 | Lai et al. | |
| 2009/0020797 A1* | 1/2009 | Wang | H01L 28/56 257/295 |
| 2010/0085800 A1 | 4/2010 | Yeom | |
| 2011/0062504 A1* | 3/2011 | Hamamoto | H10B 53/10 257/295 |
| 2011/0284939 A1 | 11/2011 | Chung et al. | |
| 2012/0153365 A1 | 6/2012 | Sung | |
| 2013/0043525 A1 | 2/2013 | Yu et al. | |
| 2013/0320433 A1 | 12/2013 | Cho et al. | |
| 2015/0016180 A1 | 1/2015 | Lu et al. | |
| 2015/0091070 A1 | 4/2015 | Cho et al. | |
| 2015/0123067 A1 | 5/2015 | Lee | |
| 2017/0309322 A1 | 10/2017 | Ramaswamy et al. | |
| 2018/0061468 A1 | 3/2018 | Derner et al. | |
| 2018/0331029 A1 | 11/2018 | Sukekawa | |
| 2019/0237470 A1 | 8/2019 | Mine et al. | |
| 2020/0381290 A1 | 12/2020 | Ramaswamy | |
| 2021/0210491 A1 | 7/2021 | Servalli | |

OTHER PUBLICATIONS

WO PCT/US2022/037148 Writ. Opin., Nov. 3, 2022, Micron Technology, Inc.

WO PCT/US2022/037148 IPRP, Jan. 18, 2024, Micron Technology, Inc.

* cited by examiner

US 12,250,825 B2

INTEGRATED ASSEMBLIES AND METHODS OF FORMING INTEGRATED ASSEMBLIES

RELATED PATENT DATA

This patent resulted from a continuation application of U.S. patent application Ser. No. 17/381,040, filed Jul. 20, 2021, the disclosure of which is incorporated by reference.

TECHNICAL FIELD

Integrated assemblies. Methods of forming integrated assemblies. Memory devices (e.g., devices comprising FeRAM configurations). Methods of forming memory devices.

BACKGROUND

Memory devices may utilize memory cells which individually comprise an access transistor in combination with a capacitor. In some applications the capacitor may be a ferroelectric capacitor and the memory may be ferroelectric random-access memory (FeRAM).

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within (through) dielectric material of memory cells can be problematic for at least the reasons that such may make it difficult to reliably store data, and may otherwise waste power. Leakage may be become increasingly difficult to control as circuitry is scaled to increasingly smaller dimensions. Also, cross-talk (cell-to-cell disturbance mechanisms) associated with neighboring memory cells may be problematic.

It would be desirable to develop architectures which alleviate, or even prevent, undesired leakage and cross-talk; and to develop methods for fabricating such architectures. It would be desirable to develop improved memory architecture, and improved methods of forming memory architecture. It would also be desirable for such methods to be applicable for fabrication of FeRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIGS. 1A-1 and 1B-1 are diagrammatic cross-sectional side views along the lines A-A and B-B, respectively, of FIG. 1, and show materials that may be associated with a gap shown in FIGS. 1A and 1B.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIGS. 7A and 7B are cross-sectional side views along the lines A-A and B-B, respectively, of FIG. 7.

FIG. 8 is a top view. FIGS. 8A and 8B are cross-sectional side views along the lines A-A and B-B, respectively, of FIG. 8.

FIG. 9 is a top view. FIGS. 9A and 9B are cross-sectional side views along the lines A-A and B-B, respectively, of FIG. 9.

FIG. 10 is a top view. FIGS. 10A and 10B are cross-sectional side views along the lines A-A and B-B, respectively, of FIG. 10.

FIG. 11 is a top view. FIG. 11C is a three-dimensional view.

FIG. 12 is a top-down sectional view along the lines C-C of FIGS. 12A and 12B, and shows materials beneath the plane of the sectional view. FIGS. 12A and 12B are cross-sectional side views along the lines A-A and B-B, respectively, of FIG. 12.

FIG. 13 is a top view. FIGS. 13A and 13B are cross-sectional side views along the lines A-A and B-B, respectively, of FIG. 13.

FIG. 14 is a top-down sectional view along the lines C-C of FIGS. 14A and 14B, and shows materials beneath the plane of the sectional view. FIGS. 14A and 14B are cross-sectional side views along the lines A-A and B-B, respectively, of FIG. 14.

FIG. 15 a is a top-down sectional view along the lines C-C of FIGS. 15A and 15B, and shows materials beneath the plane of the sectional view. FIGS. 15A and 15B are cross-sectional side views along the lines A-A and B-B, respectively, of FIG. 15.

FIG. 16 is a top-down sectional view along the lines C-C of FIGS. 16A and 16B, and shows materials beneath the plane of the sectional view. FIGS. 16A and 16B are cross-sectional side views along the lines A-A and B-B, respectively, of FIG. 16.

FIG. 17 is a top-down sectional view along the lines C-C of FIGS. 17A and 17B, and shows materials beneath the plane of the sectional view. FIGS. 17A and 17B are cross-sectional side views along the lines A-A and B-B, respectively, of FIG. 17.

FIG. 18 is a top-down sectional view along the lines C-C of FIGS. 18A and 18B, and shows materials beneath the plane of the sectional view. FIGS. 18A and 18B are cross-sectional side views along the lines A-A and B-B, respectively, of FIG. 18.

FIG. 19 is a top view. FIGS. 19A and 19B are cross-sectional side views along the lines A-A and B-B, respectively, of FIG. 19.

FIG. 20 is a top view. FIGS. 20A and 20B are cross-sectional side views along the lines A-A and B-B, respectively, of FIG. 20. The construction of FIGS. 20-20B may be considered to be a region of an example integrated assembly or a region of an example memory device.

DETAILED DESCRIPTION OF THE ILLUSTRATED EMBODIMENTS

Some embodiments include methods of forming memory architecture (e.g., FeRAM, etc.) in which bottom electrodes are configured as angle plates (e.g., "L-shaped" plates) having vertically-extending legs joining to horizontally-extending legs. The angle plates may be supported by insulative structures (rails) that extend along the angle plates and are adjacent to the vertically-extending legs. The insulative structures may extend along a same direction as digit lines (e.g., a column direction). Capacitor-insulative-material (e.g., ferroelectric-insulative-material) may be along the bottom electrodes. Leaker-device-structures may be provided to extend between the bottom electrodes and top-electrode-material. One or more slits may pass through the top-electrode-material and may be aligned with the insulative structures to pattern the top-electrode-material into two or more plates. Voltage of the individual plates may be controlled during various operations associated with a memory array (e.g., READ/WRITE operations). The capacitor-insulative-material of the (e.g., ferroelectric-insulative-material) may be substantially absent from regions directly between neighboring bottom electrodes. Example embodiments are described with reference to FIGS. 1-22.

Figure 1:
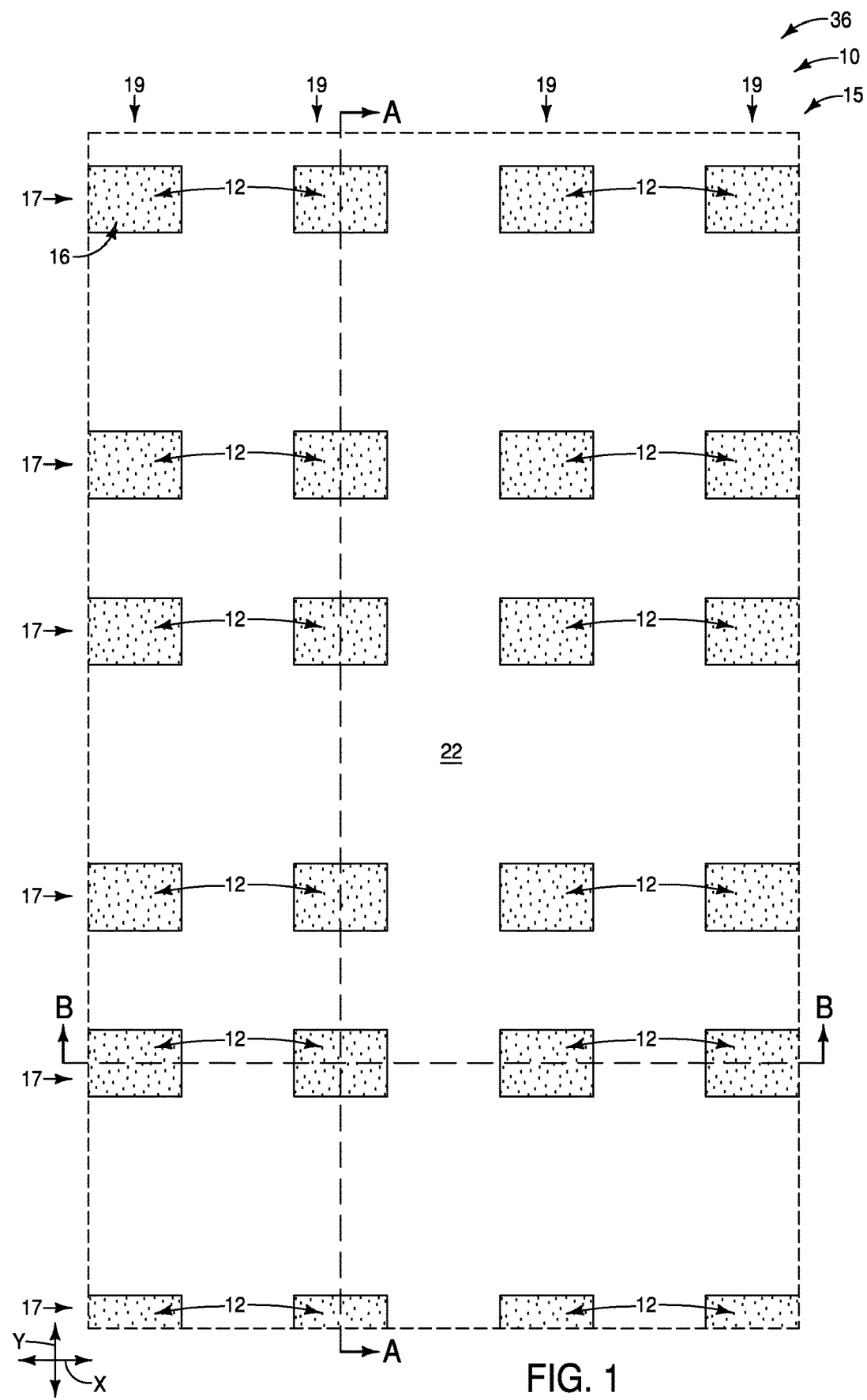
FIGS. 1-1B are diagrammatic views of a region of an example construction at an example process stage of an example method for forming an example integrated assembly.
Figure 1A:
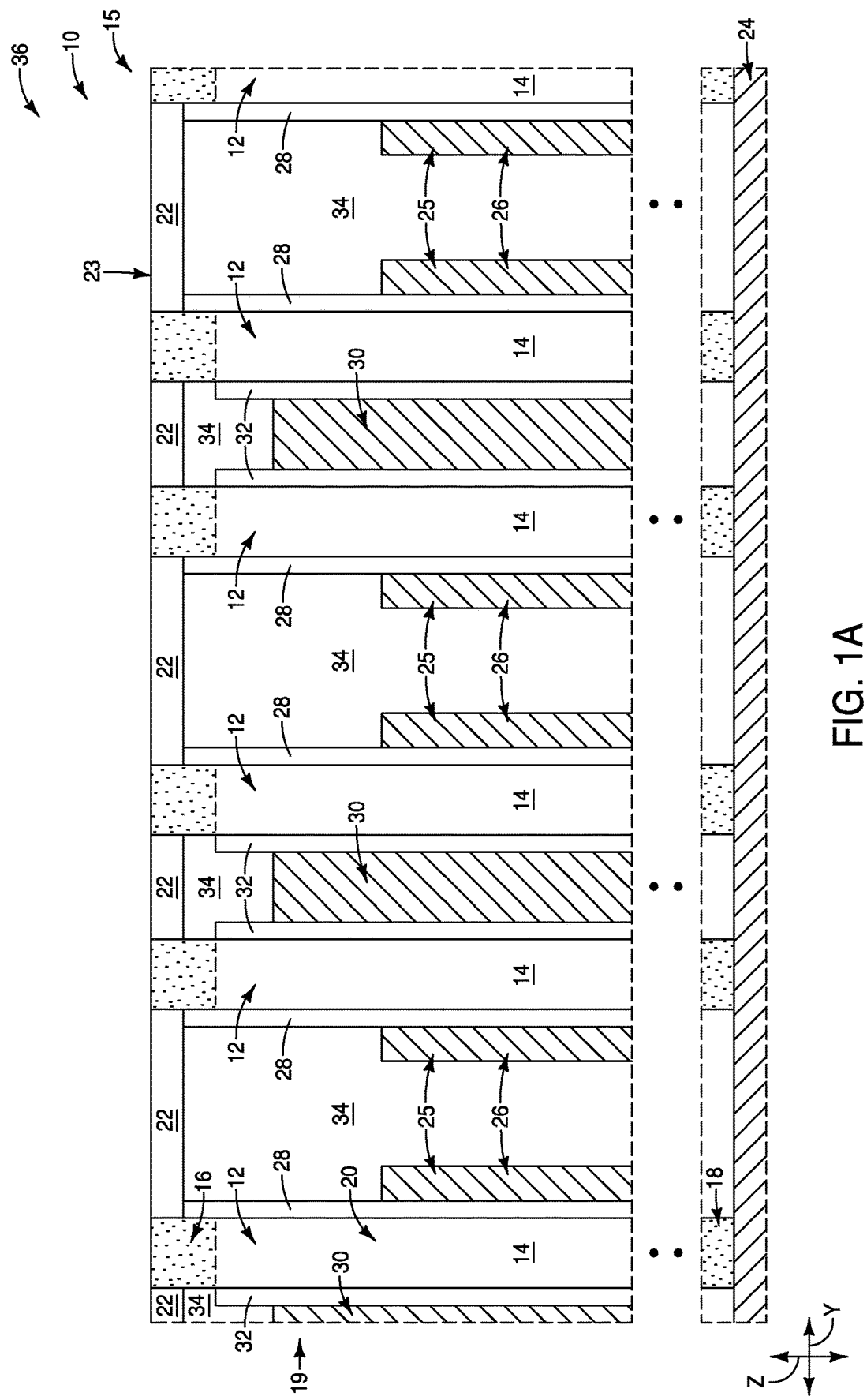
Figure 1B:
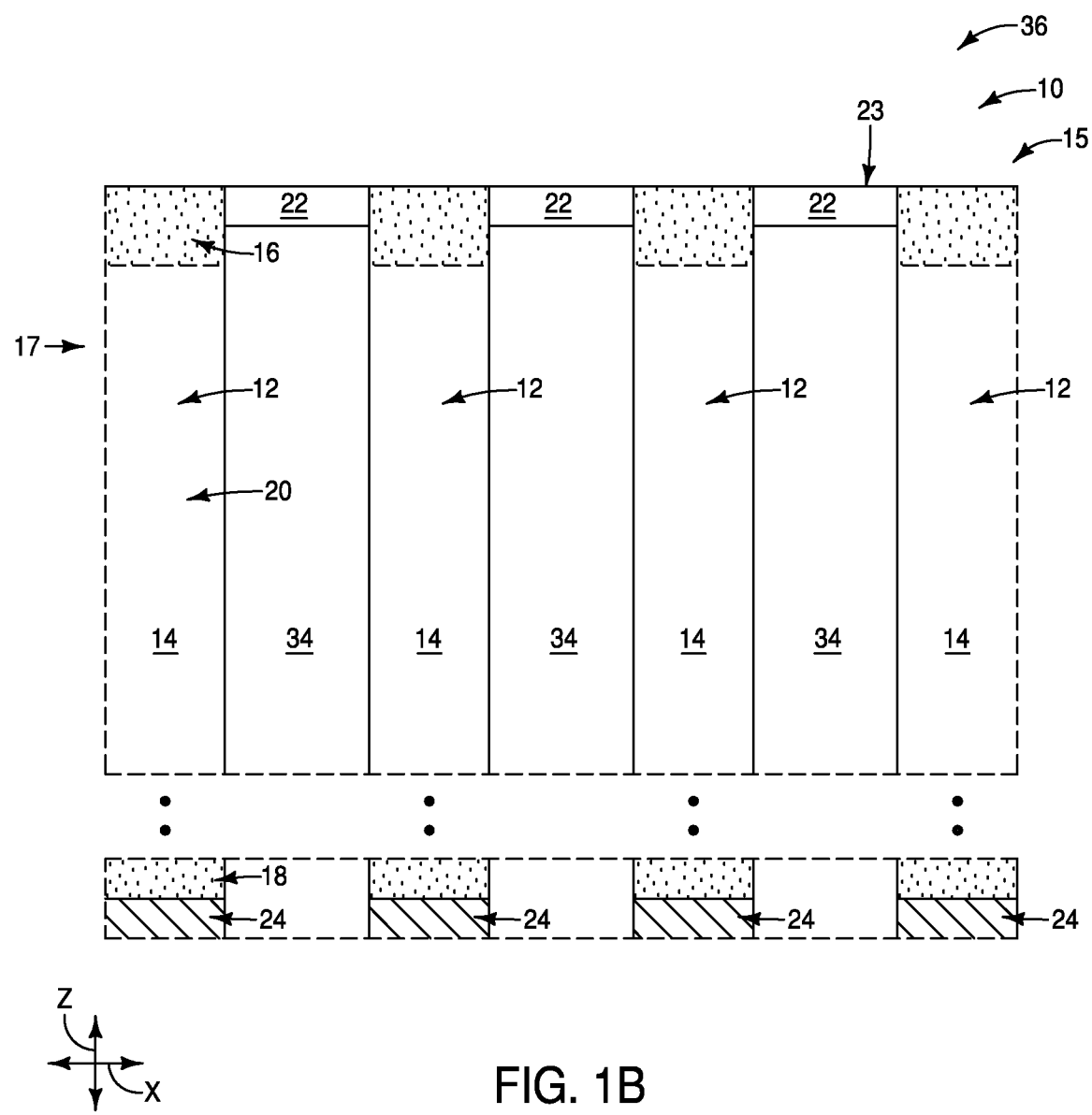
Figures 1, 1A:
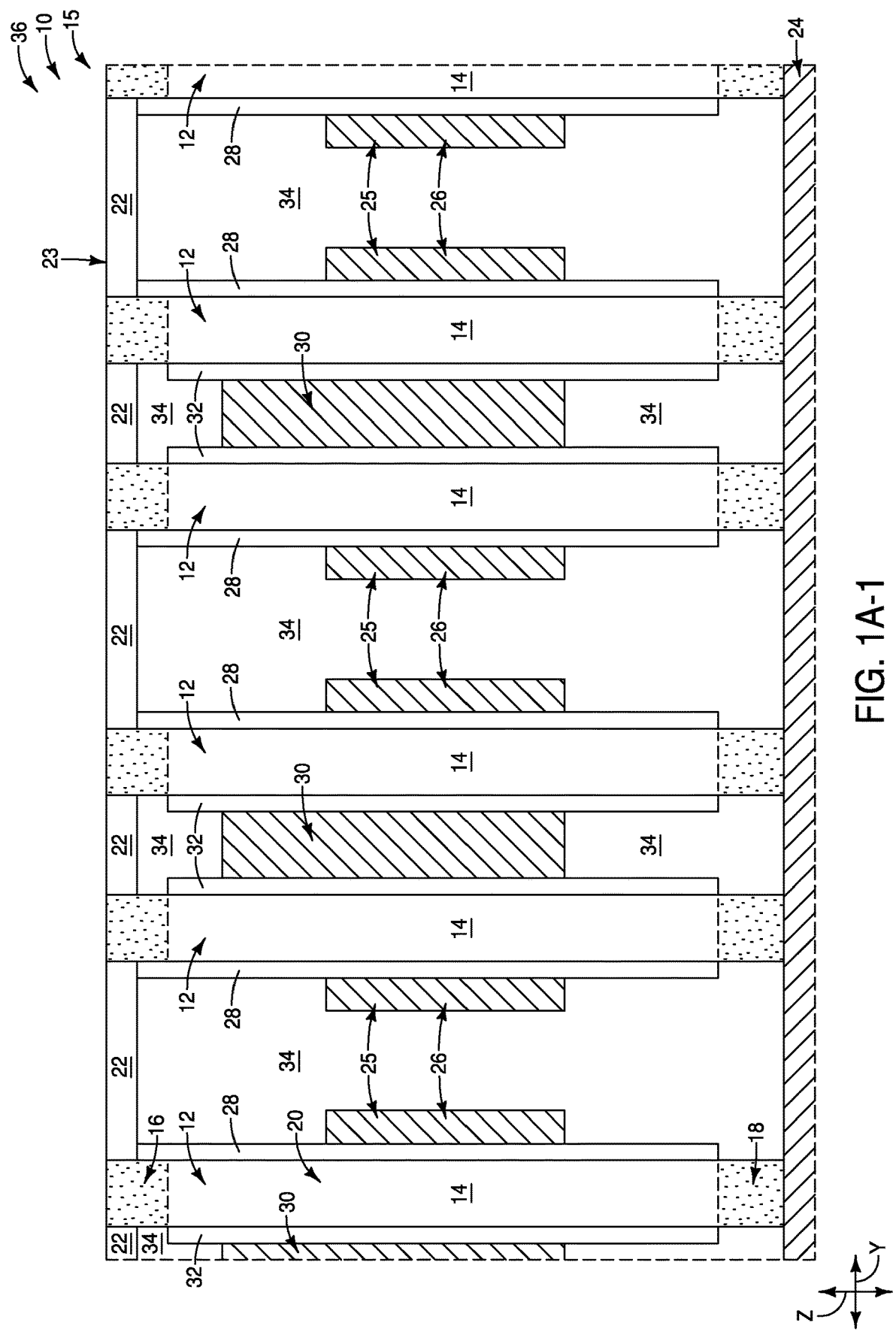
Figures 1, 1B:
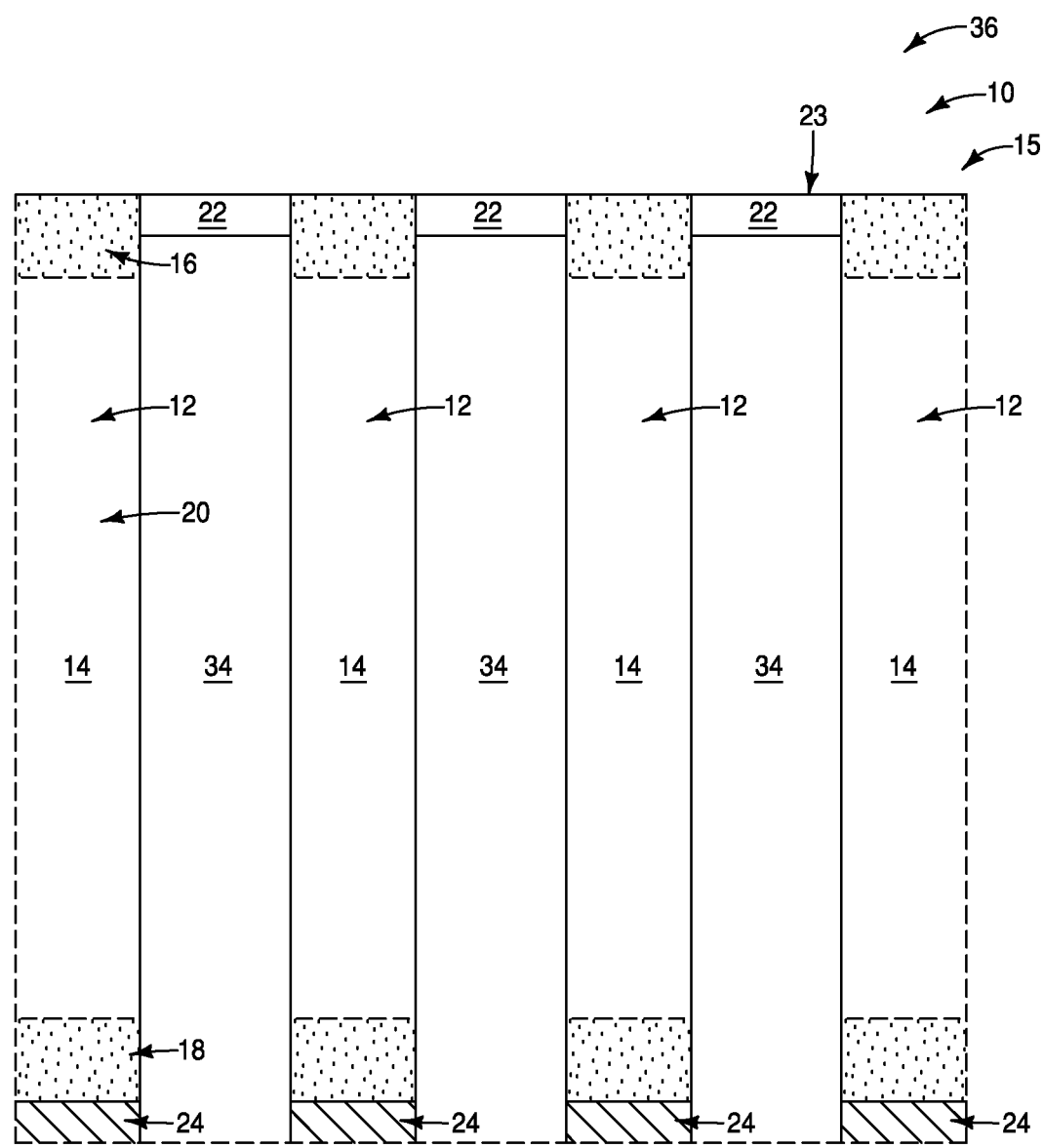

Referring to FIGS. 1-1B, a construction 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Stippling is utilized in the drawings to indicate that the source/drain regions 16 and 18 are heavily doped. In some embodiments, the source/drain regions 16 and 18 may be n-type doped by incorporating one or both of phosphorus and arsenic into the semiconductor material (e.g., silicon) 14 of the pillars 12. In some embodiments, one or both of the source/drain regions 16 and 18 may comprise additional conductive material besides the conductively-doped semiconductor material 14. For instance, one or both of the source/drain regions 16 and 18 may include metal silicide (e.g., titanium silicide, tungsten silicide, etc.) and/or other suitable conductive materials (e.g., titanium, tungsten, etc.). In some embodiments, the pillars 12 may be considered to be capped by the upper source/drain regions 16, with the term "capped" indicating that the upper source/drain regions may or may not include the semiconductor material 14 of the pillars 12.

The pillars 12 may be considered to be arranged in an array 15. The array may be considered to comprise rows 17 extending along an indicated x-axis direction, and to comprise columns 19 extending along an indicated y-axis direction.

Insulative material 22 extends between the upper source/drain regions 16. The insulative material 22 may comprise any suitable composition(s); and in some embodiments may comprise, consist essentially of, or consist of silicon nitride, silicon dioxide, aluminum oxide, etc. In some embodiments, the insulative material 22 may be referred to as a first insulative material.

A planarized upper surface 23 extends across the insulative material 22 and the source/drain regions 16. The planarized surface 23 may be formed utilizing chemical-mechanical polishing (CMP) and/or any other suitable process(es). In some embodiments, the surface 23 may be referred to as an upper surface of the construction 10.

The construction includes conductive structures (digit lines) 24 under the pillars 12. The digit lines 24 extend along the column direction (the illustrated y-axis direction) and are electrically coupled with the lower source/drain regions 18 of the pillars. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide may be present where the silicon of the source/drain regions 18 interfaces with the digit lines 24.

Gating structures (wordlines) 25 are alongside the pillars 12 and comprise gates 26. The gates 26 are spaced from the pillars by dielectric material (also referred to as gate dielectric material) 28. The gating structures 25 extend along the row direction (i.e., along the illustrated x-axis direction), and thus extend in and out of the page relative to the cross-sectional view of FIG. 1A.

The gating structures 25 (and associated gates 26) may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, etc.

The dielectric material 28 is provided between the gates 26 and the channel regions 20, and may extend to any suitable vertical dimension. In the shown embodiment the dielectric material 28 extends upwardly beyond the uppermost surfaces of the gates 26. In other embodiments the dielectric material 28 may or may not extend vertically beyond the gates 26.

The gates (transistor gates) 26 may be considered to be operatively adjacent to (operatively proximate to) the channel regions 20 such that a sufficient voltage applied to an individual gate 26 (specifically along a wordline 25 comprising the gate) will induce an electric field on a channel region near the gate which enables current flow through the channel region to electrically couple the source/drain regions on opposing sides of the channel region with one another. If the voltage to the gate is below a threshold level, the current will not flow through the channel region, and the source/drain regions on opposing sides of the channel region will not be electrically coupled with one another. The selective control of the coupling/decoupling of the source/drain regions through the level of voltage applied to the gate may be referred to as gated coupling of the source/drain regions.

Shield lines 30 are alongside the pillars 12, and are spaced from the pillars by dielectric material 32. The shield lines may be electrically coupled with ground or any other suitable reference voltage. The shield lines 30 extend along the row direction (i.e., along the illustrated x-axis direction). The shield lines 30 may be considered to be within regions between the pillars 12 along the cross-sectional view of FIG. 1A.

The dielectric material 32 may comprise any suitable composition(s); and in some embodiments may comprise, consist essentially of, or consist of one or more of silicon dioxide, silicon nitride, aluminum oxide, hafnium oxide, etc. In the shown embodiment the dielectric material 32 extends vertically beyond the shield lines 30. In other embodiments the dielectric material 32 may or may not extend vertically beyond the shield lines 30.

The shield lines 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, each of the pillars 12 shown along the cross-section of FIG. 1A has one side adjacent a gate 26, and has an opposing side adjacent a shield line 30.

In the shown embodiment, insulative material 34 is over the gates 26 and the shield lines 30. The insulative material 34 may comprise any suitable composition(s); and may, for example, comprise silicon dioxide, silicon nitride, aluminum oxide, etc. In some embodiments the material 34 may comprise a same composition as one or both of the dielectric materials 28 and 32, and in other embodiments the material 34 may comprise a different composition than at least one of the dielectric materials 28 and 32.

The construction 10 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the construction 10 of FIGS. 1-1B may be considered to represent a portion of an integrated assembly 36.

In the embodiment of FIGS. 1A and 1B, a gap is provided within the construction 10 to break a region of the pillars 12 above the lower source/drain regions 18. The gap enables the view of construction 10 to be collapsed into a smaller area, which leaves more room for additional materials formed over the construction 10 at subsequent process stages. It is to be understood that the pillars 12 extend across the illustrated gap. FIGS. 1A-1 and 1B-1 show views along the same cross-sections as FIG. 1A and FIG. 1B, and show the construction 10 without the gap of FIGS. 1A and 1B. FIGS. 1A-1 and 1B-1 are provided to assist the reader in understanding the arrangement of construction 10. The views of FIGS. 1A and 1B (i.e., the views with the gaps in construction 10) will be used for the remaining figures of this disclosure.

Figure 2:
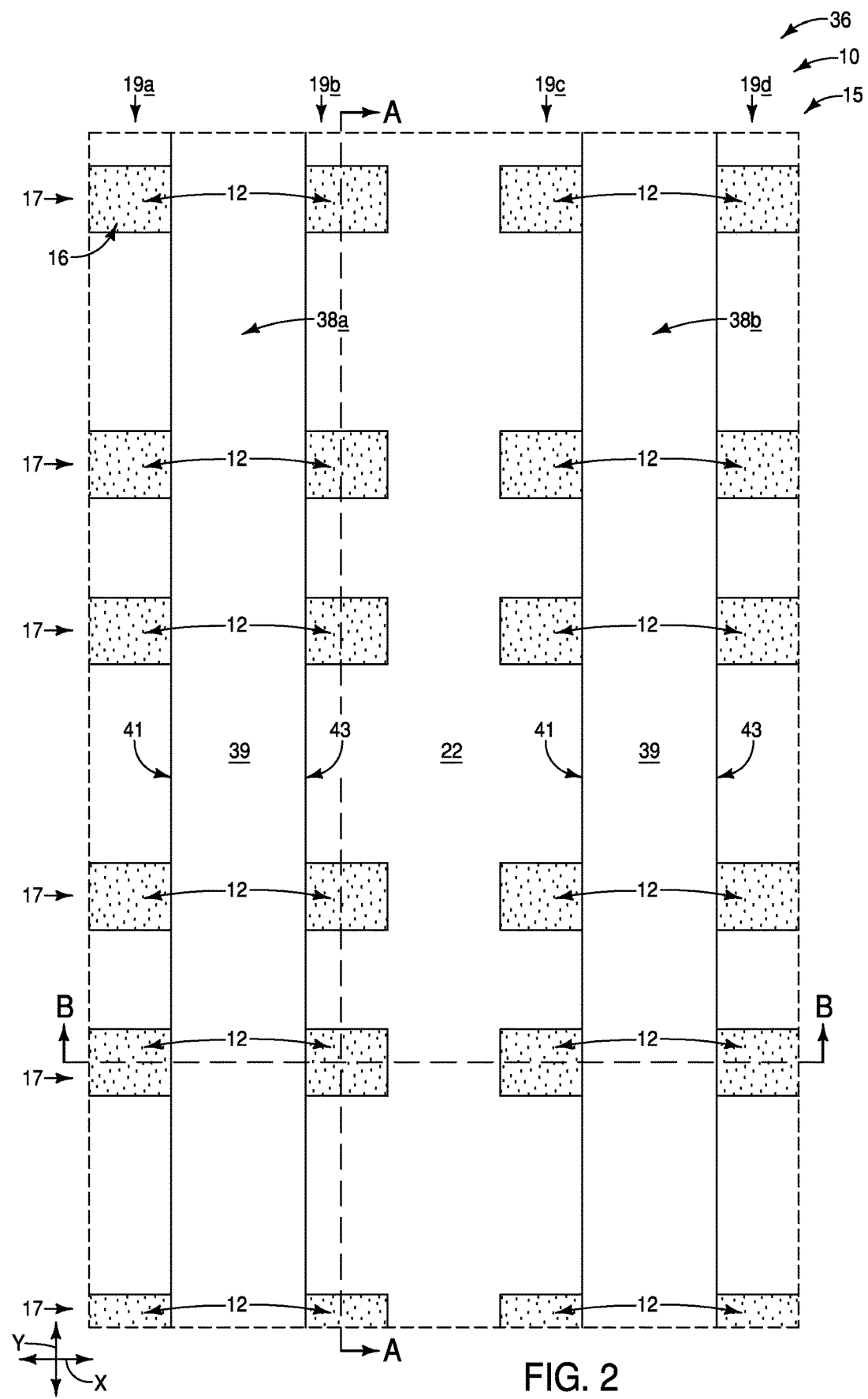
FIGS. 2-2B are diagrammatic views of the region of FIGS. 1-1B at an example process stage following that of FIGS. 1-1B.
Figure 2A:
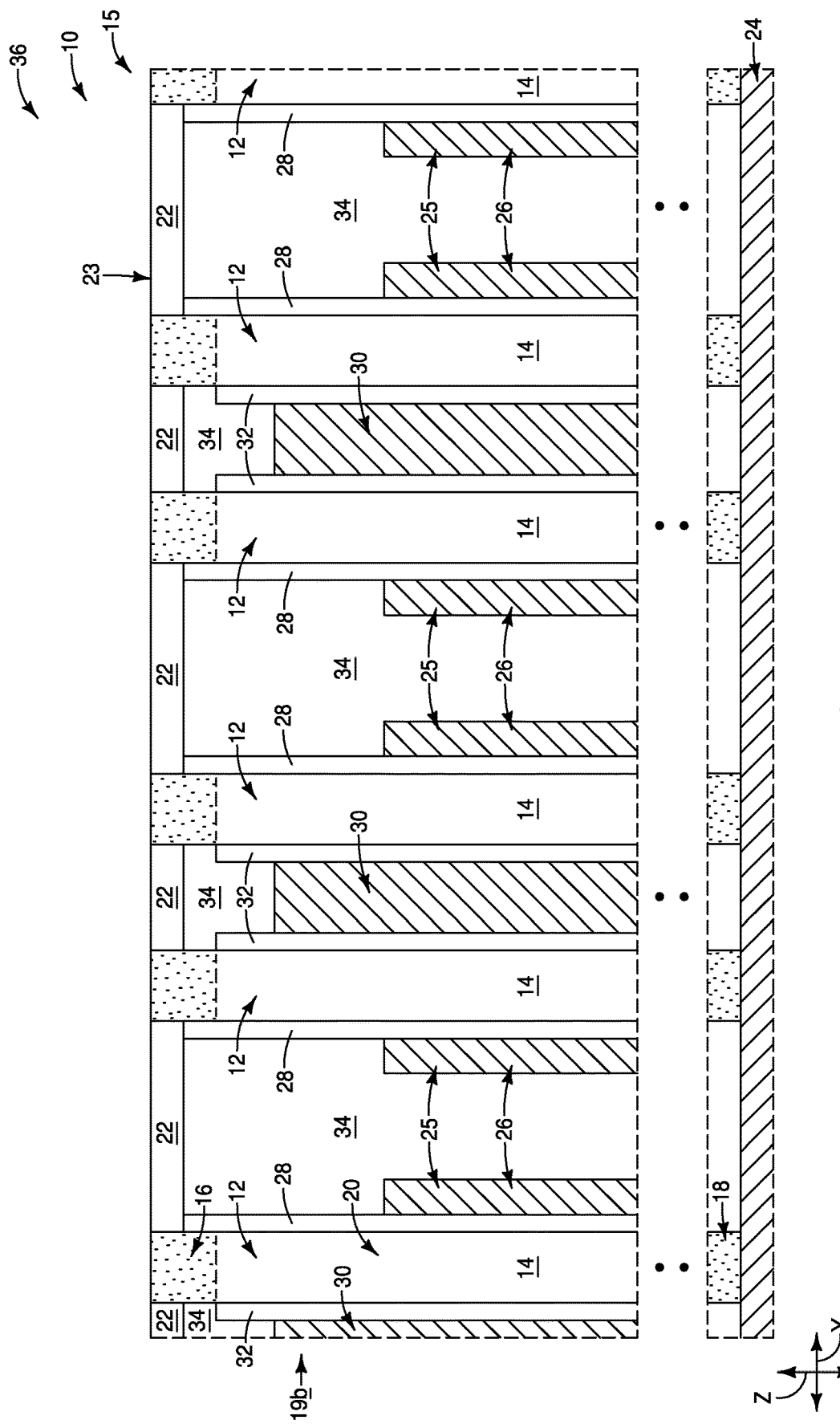
Figure 2B:
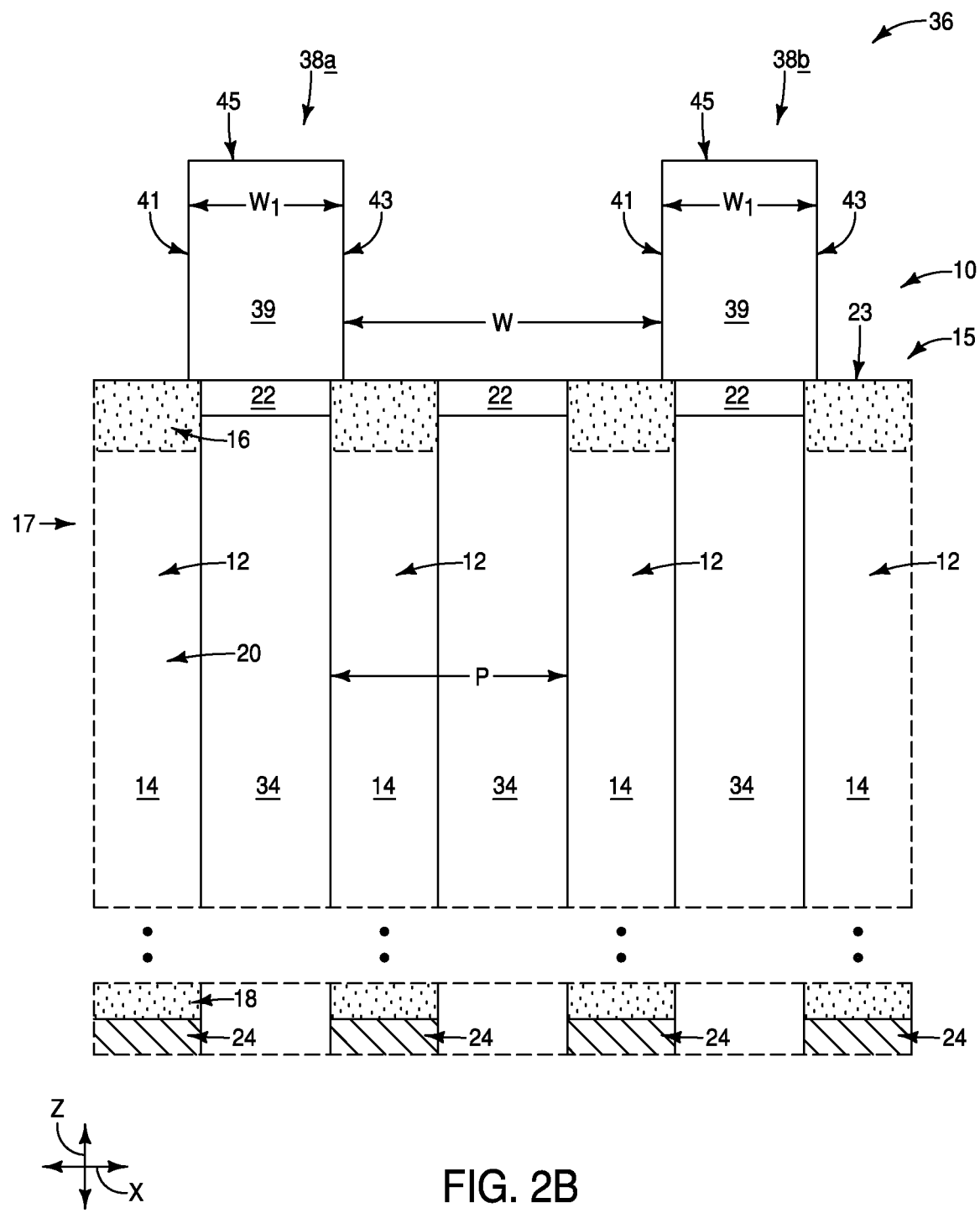

Referring to FIGS. 2-2B, the assembly 36 is shown at a process stage subsequent to that of FIGS. 1-1B. Linear insulative structures (rails, beams) 38 are formed over the upper surface 23 of construction 10. The structures 38 comprise sacrificial material 39. The material 39 may comprise any suitable composition(s); and in some embodiments may comprise, consist essentially of, or consist of silicon (e.g., amorphous silicon and/or polycrystalline silicon), low-density silicon dioxide, carbon, etc.

The illustrated linear structures 38 are labeled 38a and 38b so that they may be distinguished relative to one another.

The linear structures 38 extend along the column direction (the illustrated y-axis direction), and are formed to be between columns of the pillars 12. Each of the linear structures 38 has a pair of opposing lateral surfaces 41 and 43. The surfaces 41 and 43 may be referred to as first and second lateral sides, respectively, of the linear structures 38. Each of the linear structures also has a top surface 45.

Each of the linear structures 38 may be considered to be associated with a pair of the columns 19 of the pillars 12, with such associated columns being along the sides 41 and 43. For instance, the columns 19 of FIG. 2 are labeled as 19a-d. Columns 19a and 19b are along the sides 41 and 43 of the linear structure 38a and may be considered to be associated with such linear structure. Similarly, columns 19c and 19d are along the sides 41 and 43 of the linear structure 38b and may be considered to be associated with such linear structure.

In the shown embodiment, the linear structures 38 laterally overlap portions of the source/drain regions 16 of the associated columns 19, as shown in FIG. 2B. In other embodiments, the linear structures 38 may be formed between the associated columns and may not laterally overlap the source/drain regions 16 of the associated columns.

The linear structures 38 may be formed with any suitable processing. For instance, an expanse of the material 39 may be formed across the upper surface 23, and such expanse may be patterned utilizing a patterned mask (not shown) and one or more suitable etches.

In the illustrated embodiment, the sidewall surfaces (sidewalls) 41 and 43 are substantially vertical and extend substantially orthogonally relative to the substantially horizontal upper surface 23. The term "substantially vertical" means vertical to within reasonable tolerances of fabrication and measurement, the term "substantially orthogonal" means orthogonal to within reasonable tolerances of fabrication and measurement, and the term "substantially horizontal" means horizontal to within reasonable tolerances of fabrication and measurement.

FIG. 2B shows the pillars 12 to be on a pitch P along the cross-section of the figure. The linear structures 38a and 38b are spaced from one another by a gap having width W. The linear structures 38a and 38b have widths $W_1$ along the cross-section of FIG. 2B. The widths $W_1$ may be any suitable dimension, and in some embodiments may be within a range of from about one-fourth of the pitch P to about three-fourths of the pitch P. In some embodiments, the widths $W_1$ may be within a range of from about 15 nm to about 40 nm. The width W may be any suitable dimension, and in some embodiments may be within a range of from about 20 nanometers (nm) to about 60 nm, within a range of from about 20 nm to about 100 nm, etc.

Figure 3:
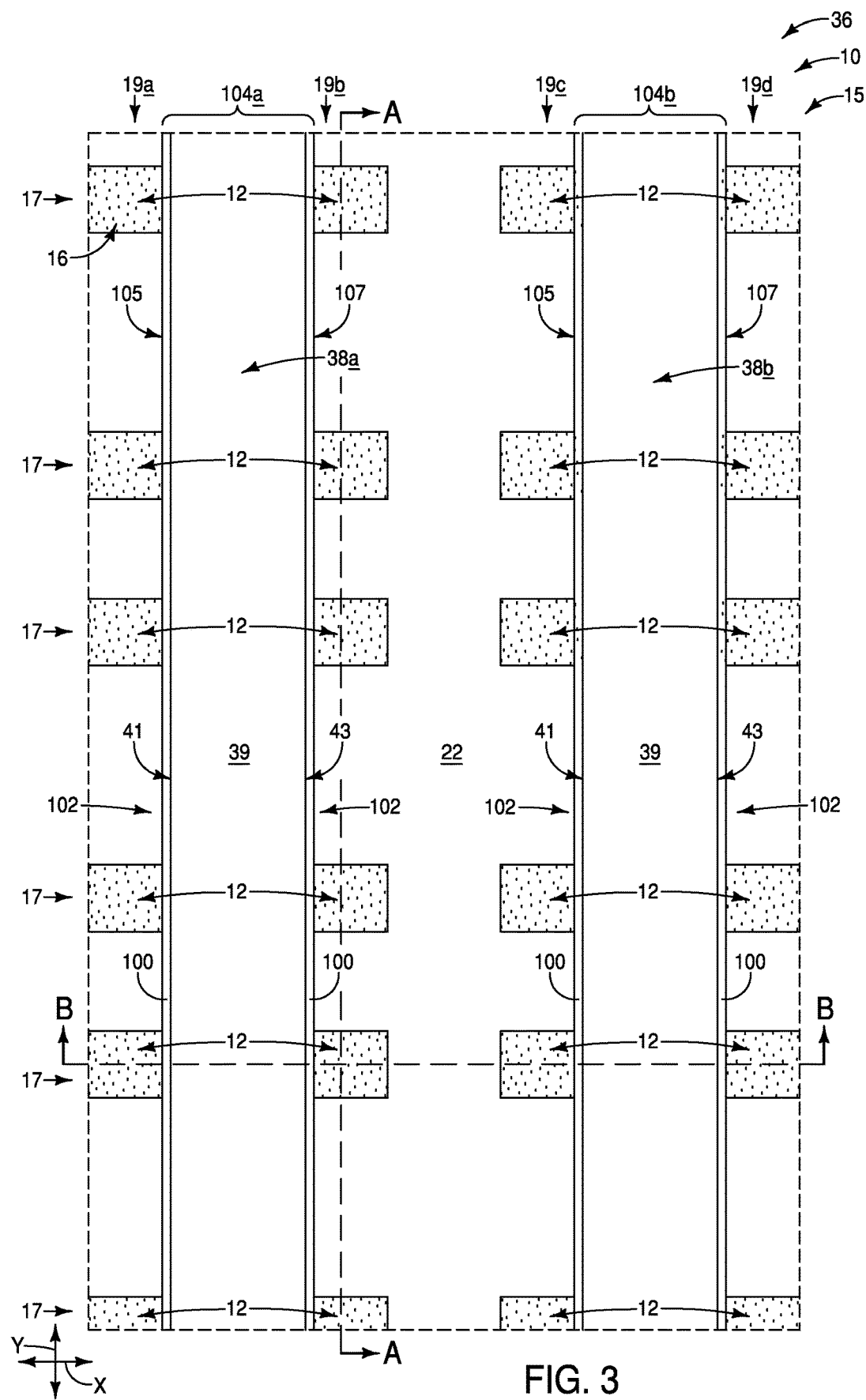
FIGS. 3-3B are diagrammatic views of the region of FIGS. 1-1B at an example process stage following that of FIGS. 2-2B.
Figure 3A:
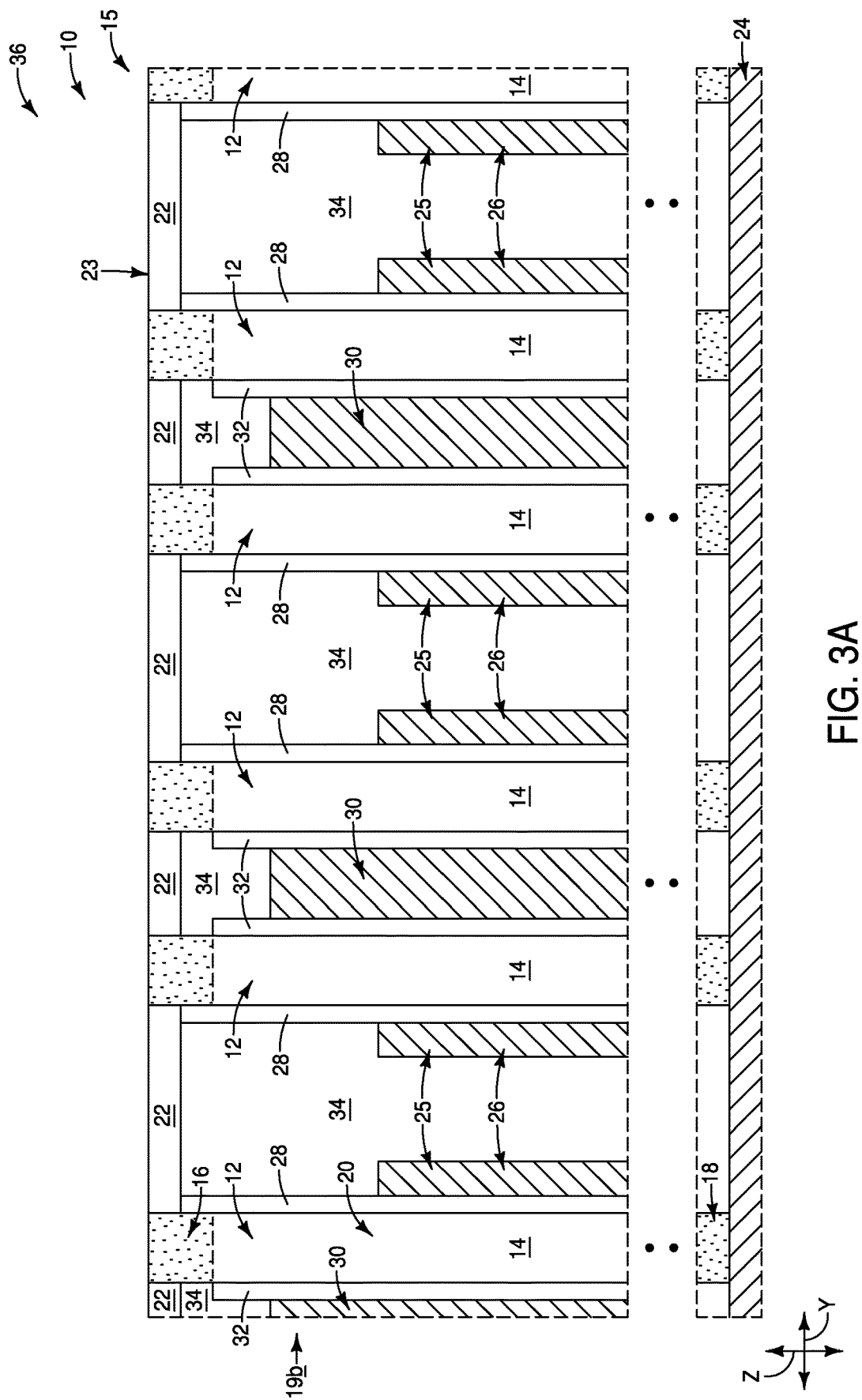
Figure 3B:
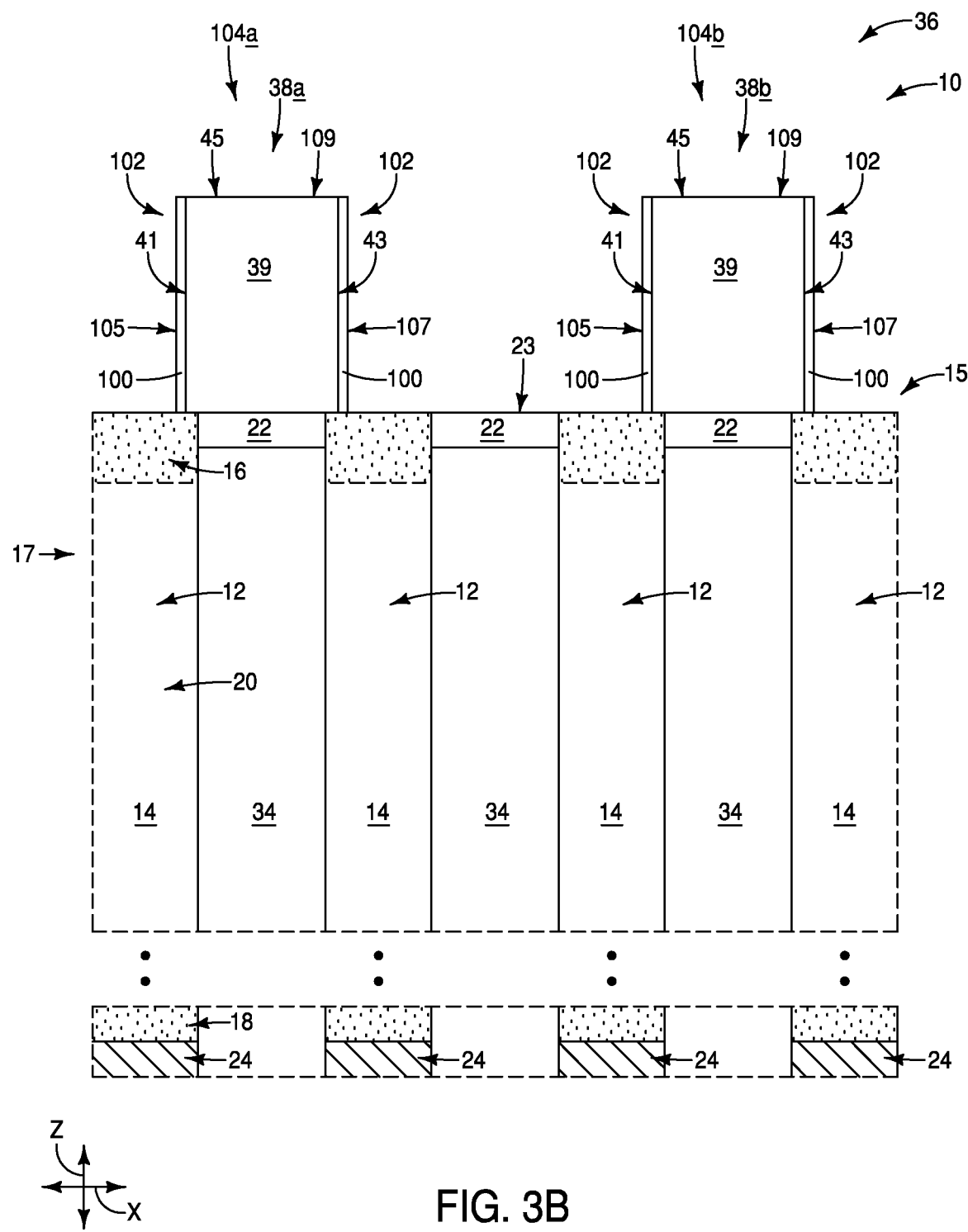

Referring to FIGS. 3-3B, protective material 100 is formed along the sidewall surfaces 41 and 43 of the sacrificial material 39. In some embodiments, the protective material 100 may be referred to as "other" material, to indicate that it is other material relative to the sacrificial material 39.

The protective material 100 may comprise any suitable composition(s), including, for example, one or more of silicon nitride, aluminum oxide, hafnium oxide, zirconium oxide, etc. The protective material 100 may be formed to any suitable lateral thickness along the sidewalls 41 and 41, and in some embodiments such lateral thickness may be within a range of from about 1 nm to about 4 nm.

The protective material 100 may be configured as spacers (liners) 102 along the sidewall surfaces 41 and 43. Such spacers may be formed with any suitable processing. For instance, a layer of material 100 may be formed over an upper surface of the assembly 36 and then such layer may be patterned with an anisotropic etch to form the spacers 102.

The structures 38a and 38b, and spacers 102, together form linear structures 104a and 104b. The linear structures 104a and 104b have outer sidewalls (sidewall surfaces) 105 and 107 along the spacers 102, and have top surfaces 109 extending across the materials 39 and 100.

Figure 4:
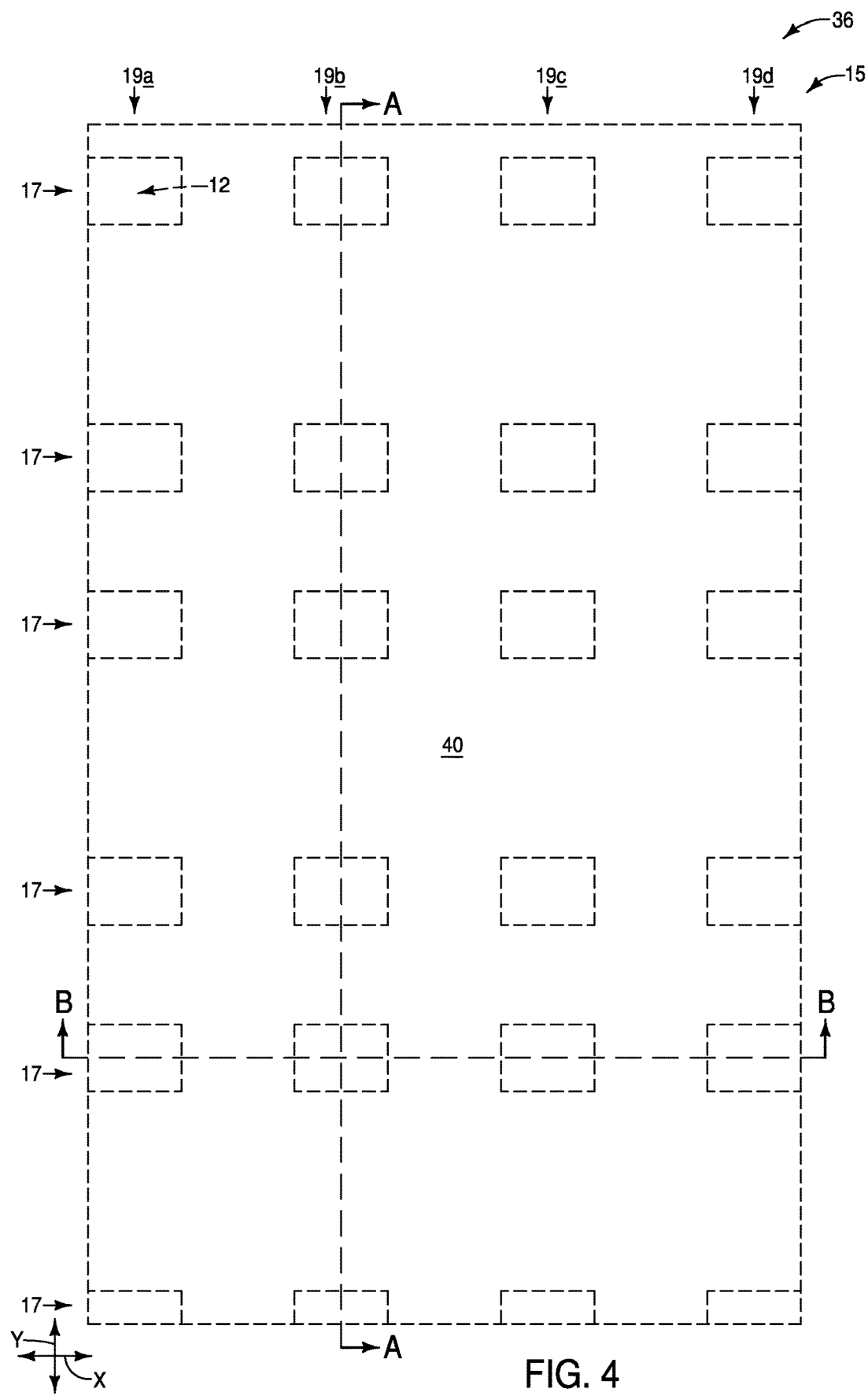
FIGS. 4-4B are diagrammatic views of the region of FIGS. 1-1B at an example process stage following that of FIGS. 3-3B.
Figure 4A:
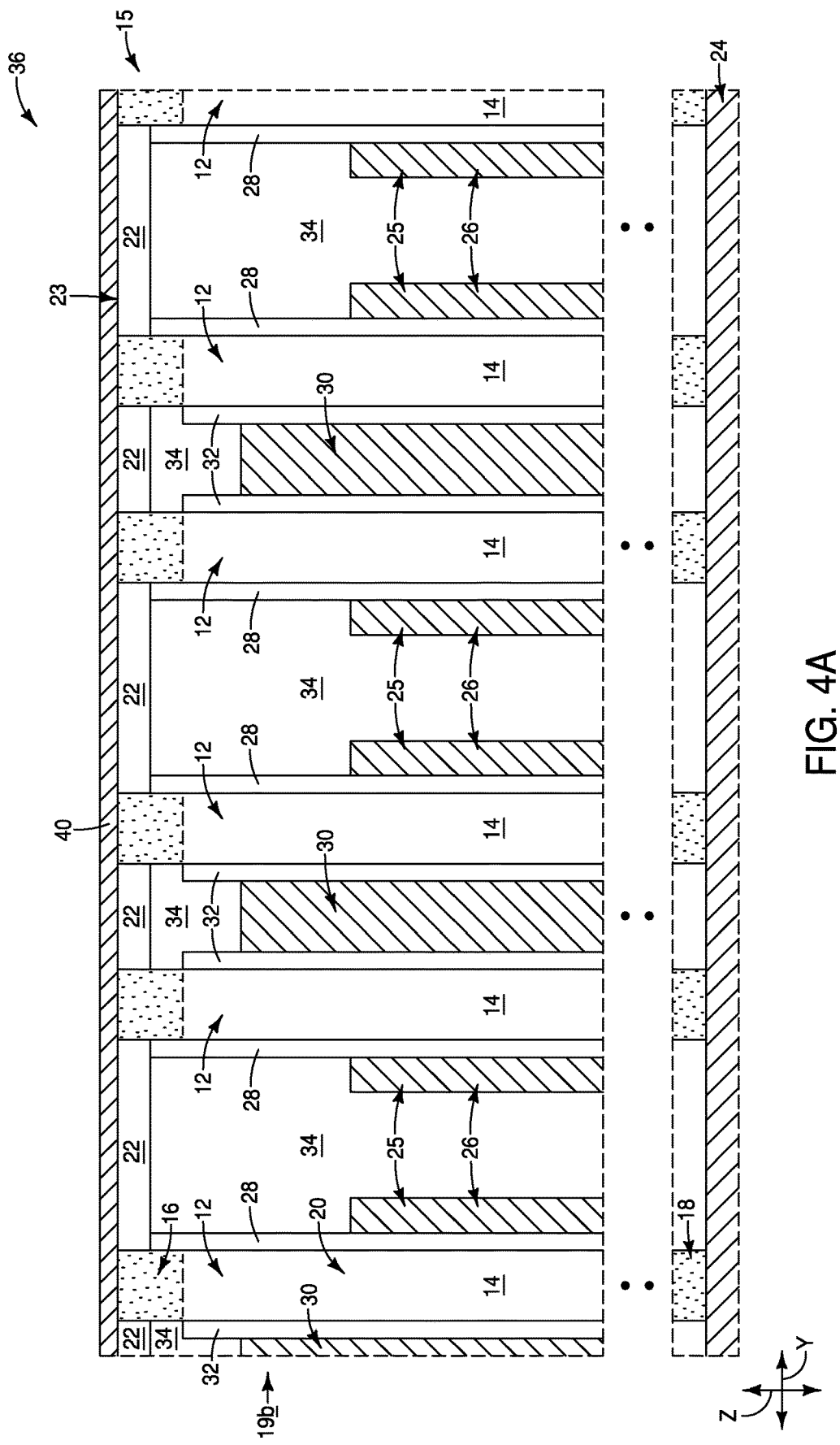
Figure 4B:
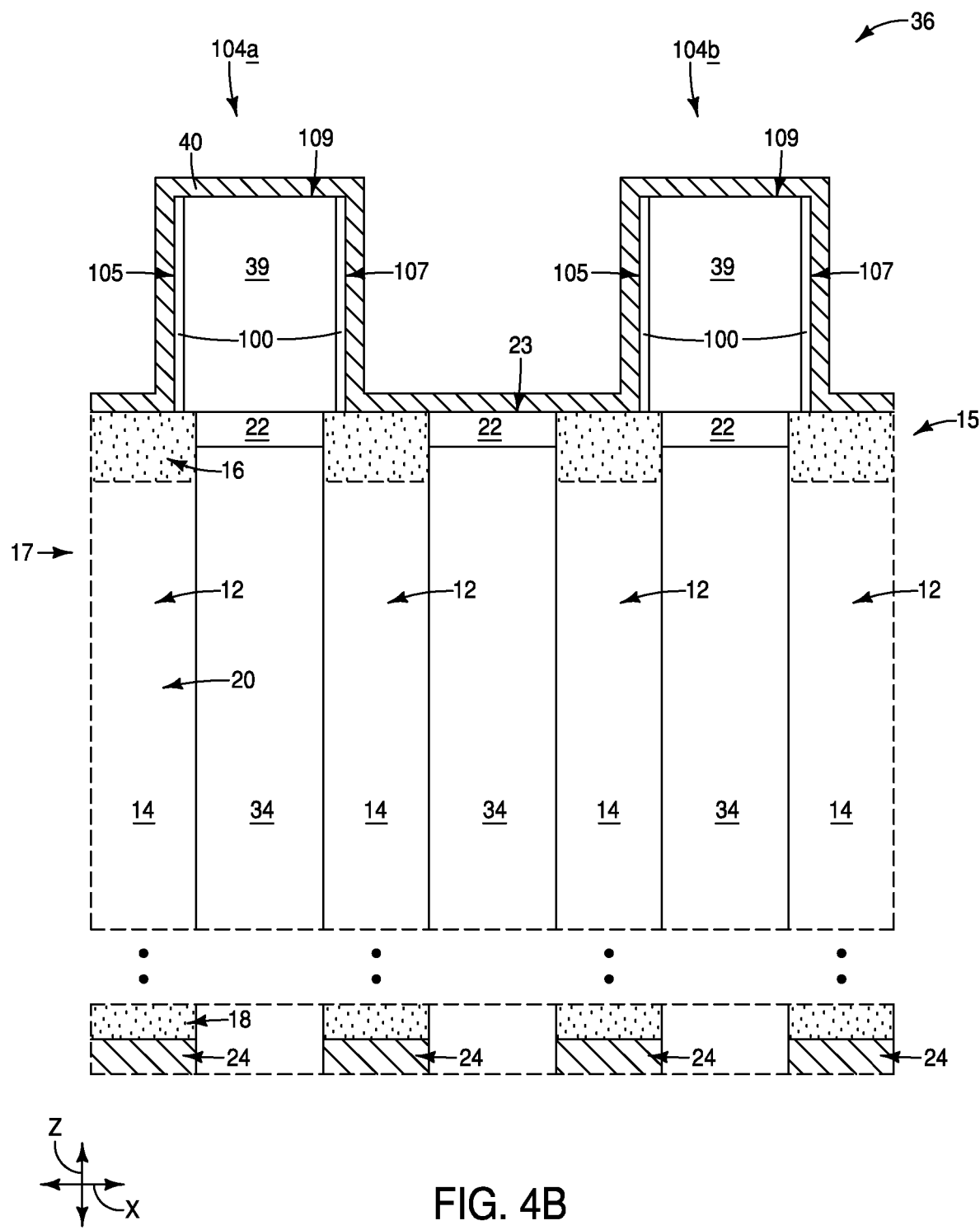

Referring to FIGS. 4-4B, bottom-electrode-material 40 is formed to extend conformally along the linear structures 104, and along regions of the upper surface 23 between the linear structures. The bottom-electrode-material 40 extends across the upper source/drain regions 16, and is electrically coupled with such source/drain regions. In the illustrated embodiment, the bottom-electrode-material 40 is directly against upper surfaces of the source/drain regions 16. The bottom-electrode-material 40 may have any suitable thickness. In some embodiments, the material 40 may have a thickness within a range of from about 1 nm to about 5 nm. The source/drain regions 16 and associated pillars 12 are shown in dashed-line (phantom) view in FIG. 4 to indicate that they are under other materials.

The bottom-electrode-material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bottom-electrode-material 40 may comprise, consist essentially of, or consist of titanium nitride.

Figure 5:
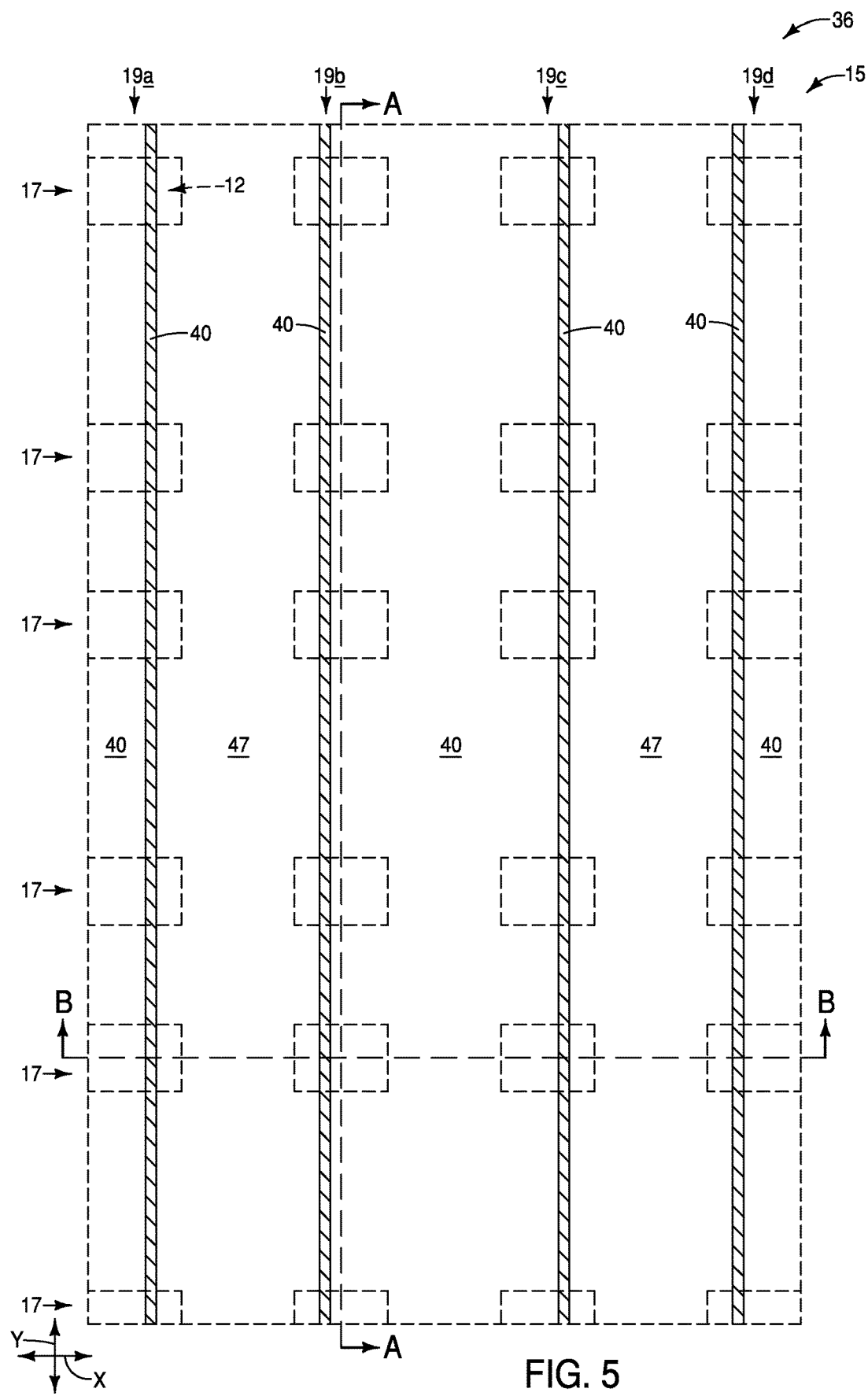
FIGS. 5-5B are diagrammatic views of the region of FIGS. 1-1B at an example process stage following that of FIGS. 4-4B.
Figure 5A:
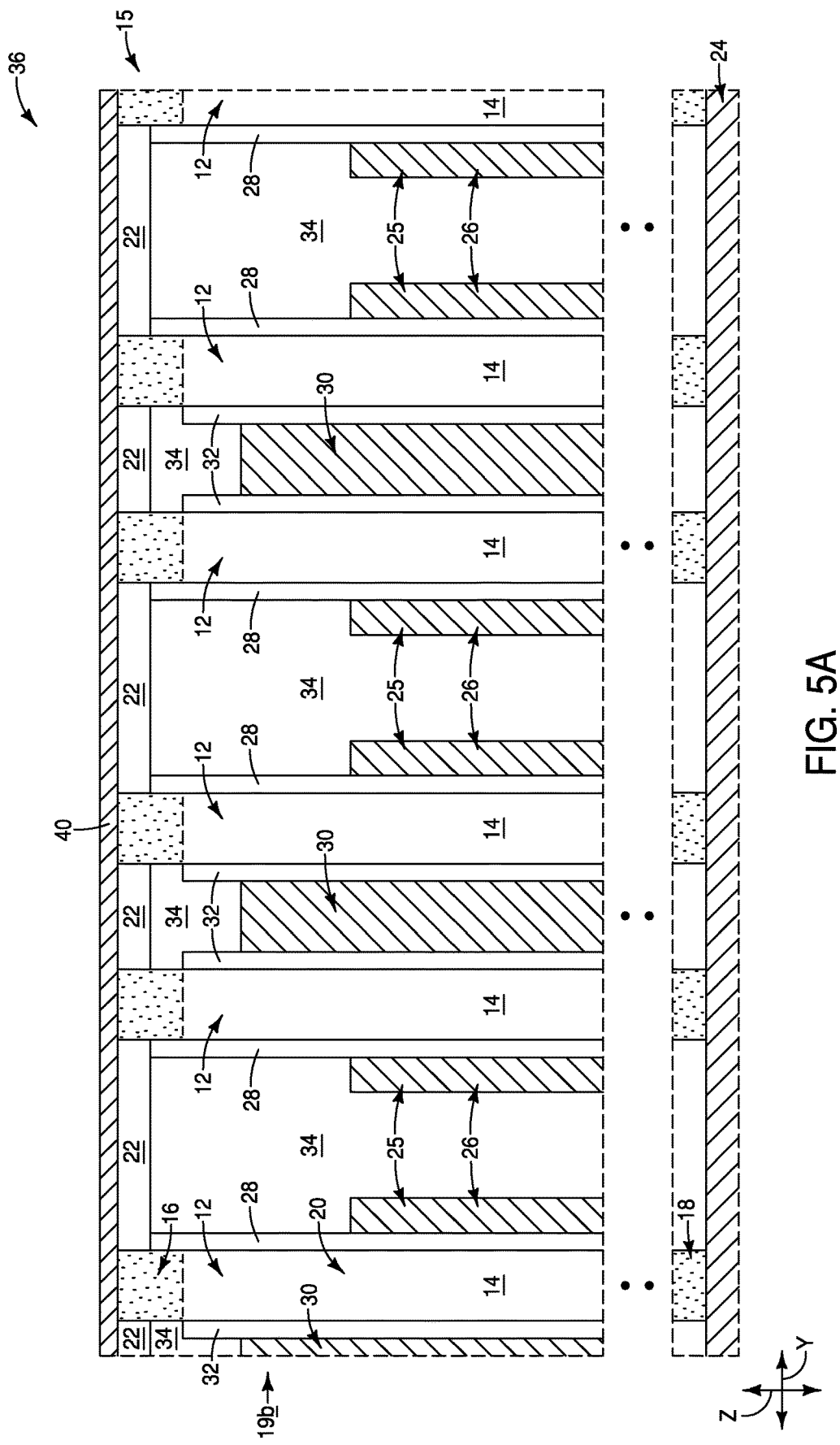
Figure 5B:
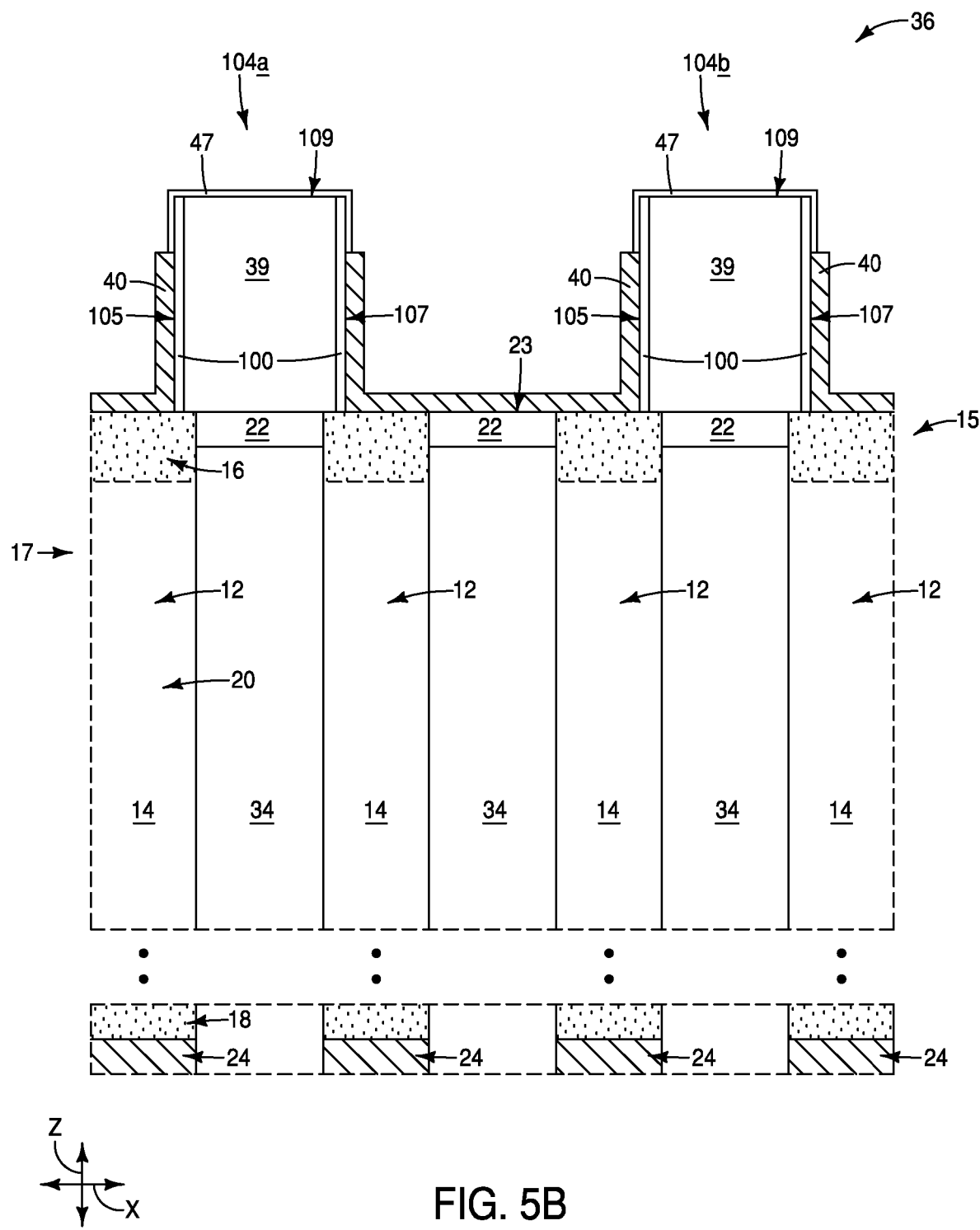

Referring to FIGS. 5-5B, the bottom electrode material 40 is etched back from upper portions of the linear structures 104 to expose upper portions of the linear structures (bottom portions of the bottom electrode material may be protected with suitable material (not shown) during such etch-back). Subsequently, leaker-device-material 47 is formed along the top surfaces 109 and sidewall surfaces 105/107 of the exposed upper portions of the linear structures 104. The leaker-device-material 47 may be, for example, deposited over an entirety of the upper surface of the assembly 36 and then patterned to remain only along the upper portions of the linear structures 104.

The leaker-device-material 47 may comprise any suitable composition or combination of compositions. In some embodiments, the leaker-device-material 47 may comprise, consist essentially of, or consist of one or more of titanium, nickel and niobium in combination with one or more of germanium, silicon, oxygen, nitrogen and carbon. In some embodiments, the leaker device material may comprise, consist essentially of, or consist of one or more of Si, Ge, SiN, TiSiN, TiO, TiN, NIO, NiON and TiON, where the chemical formulas indicate primary constituents rather than particular stoichiometries. In some embodiments, the leaker-device-material may comprise, consist essentially of, or consist of titanium, oxygen and nitrogen. In some embodiments, the leaker-device-material may comprise amorphous silicon, niobium monoxide, silicon-rich silicon nitride, etc., either alone or in any suitable combination.

In some embodiments, the leaker-device-material 47 may be a continuous layer having a thickness within a range of from about 2 angstroms (Å) to about 20 Å. In some embodiments, the leaker-device-material may be a continuous layer having a thickness within a range of from about 6 Å to about 15 Å.

Figure 6:
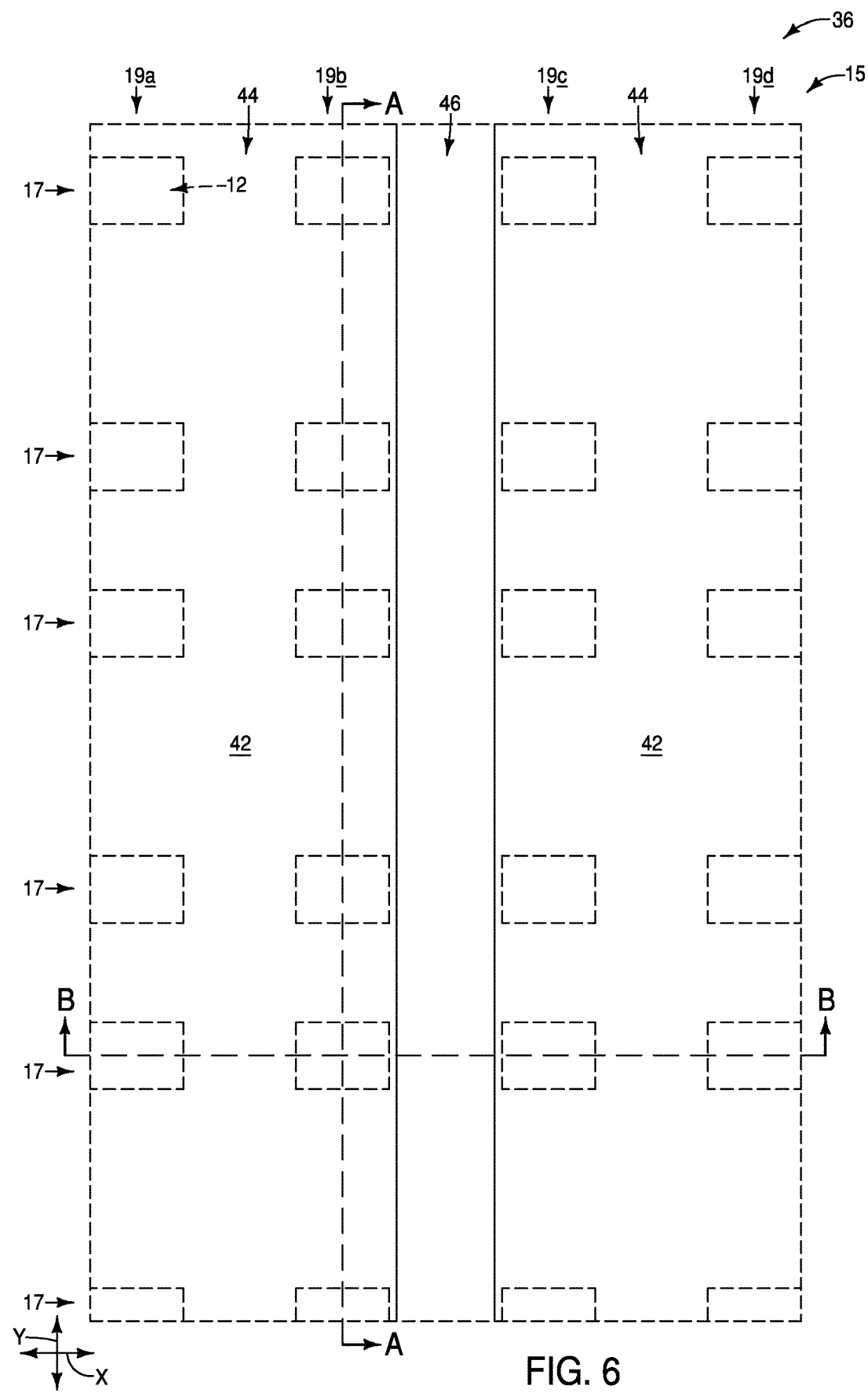
FIGS. 6-6B are diagrammatic views of the region of FIGS. 1-1B at an example process stage following that of FIGS. 5-5B.
Figure 6A:
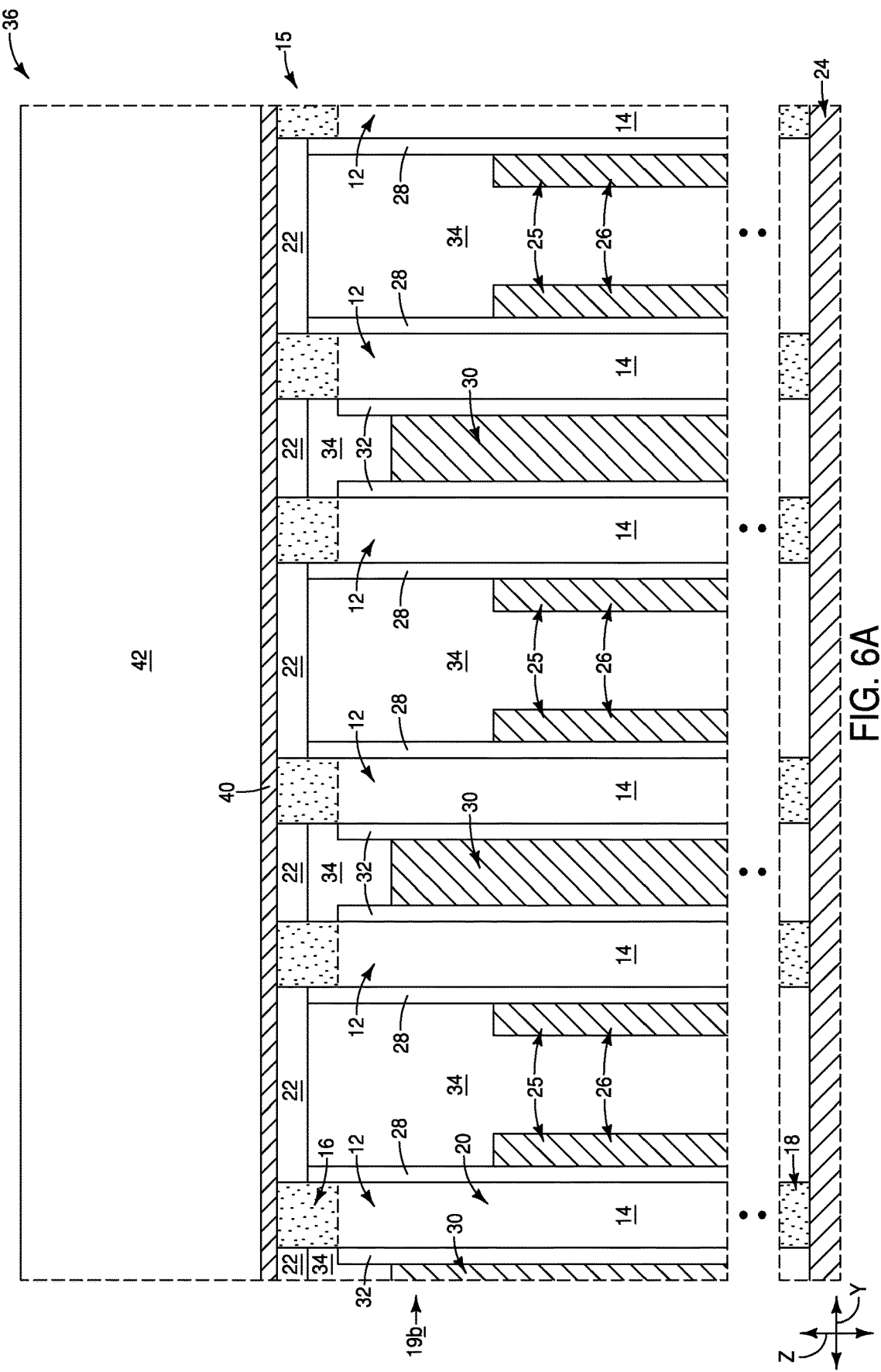
Figure 6B:
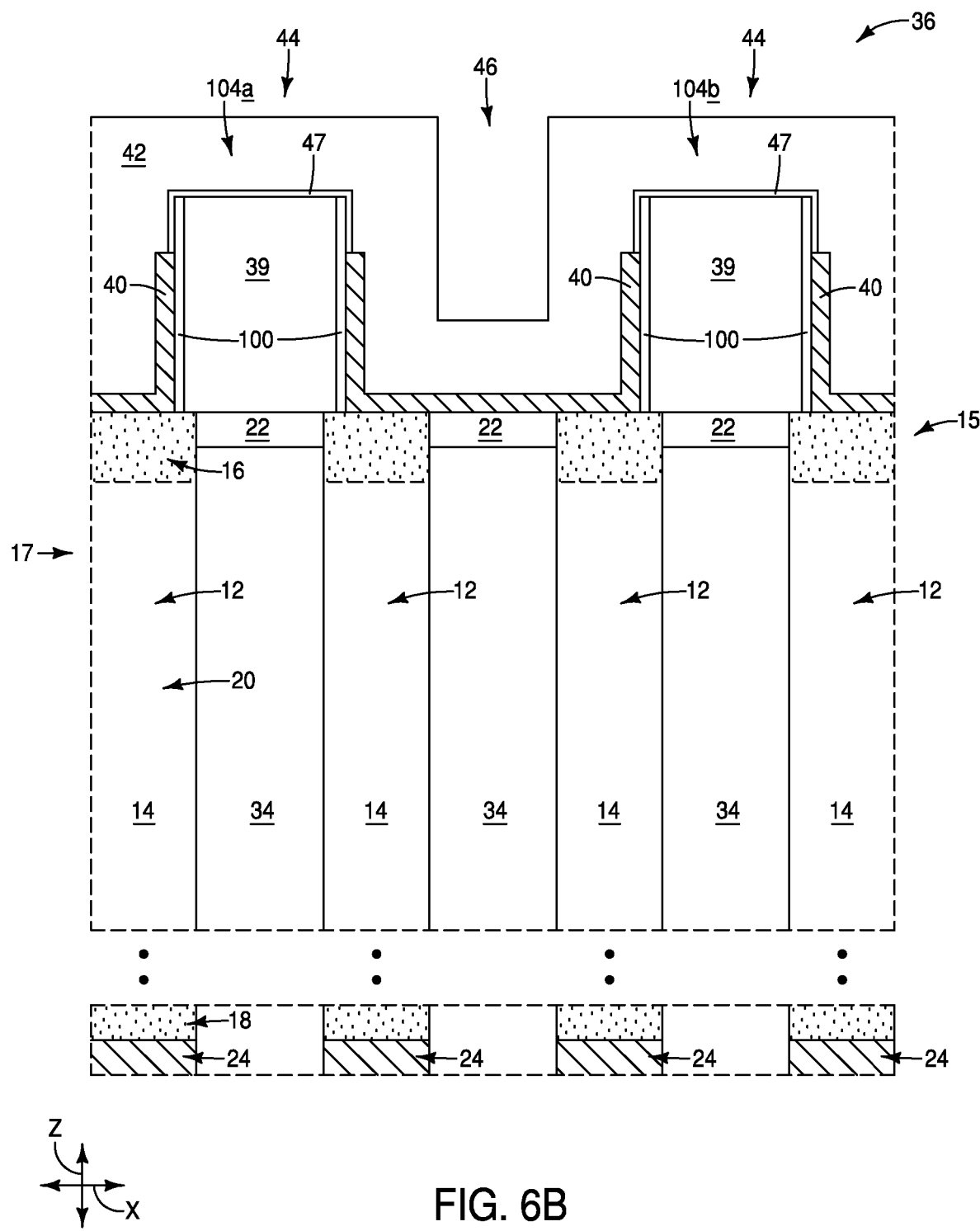

Referring to FIGS. 6-6B, a patterning material 42 is formed over the bottom-electrode-material 40. The patterning material 42 has an undulating topography which includes peaks 44 over the structures 38, and valleys 46 between the peaks. The material 42 may be formed to any suitable thickness (e.g., a thickness within a range of from about 10 nm to about 30 nm); and may comprise any suitable composition(s). In some embodiments, the material 42 may comprise, consist essentially of, or consist of one or more of silicon dioxide, silicon nitride and silicon oxynitride.

Figure 7:
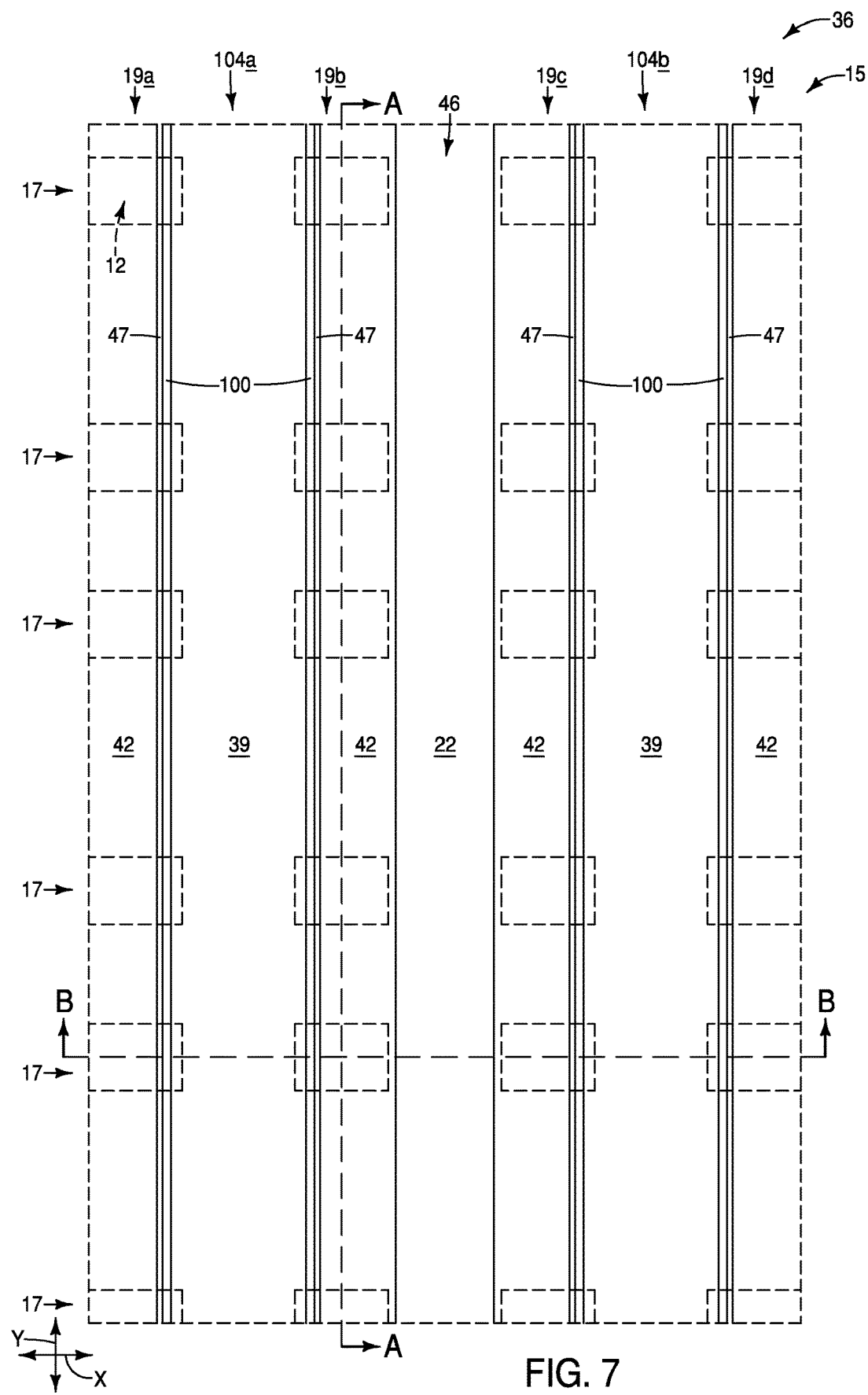
FIGS. 7-7B are diagrammatic views of the region of FIGS. 1-1B at an example process stage following that of FIGS. 6-6B.
Figure 7A:
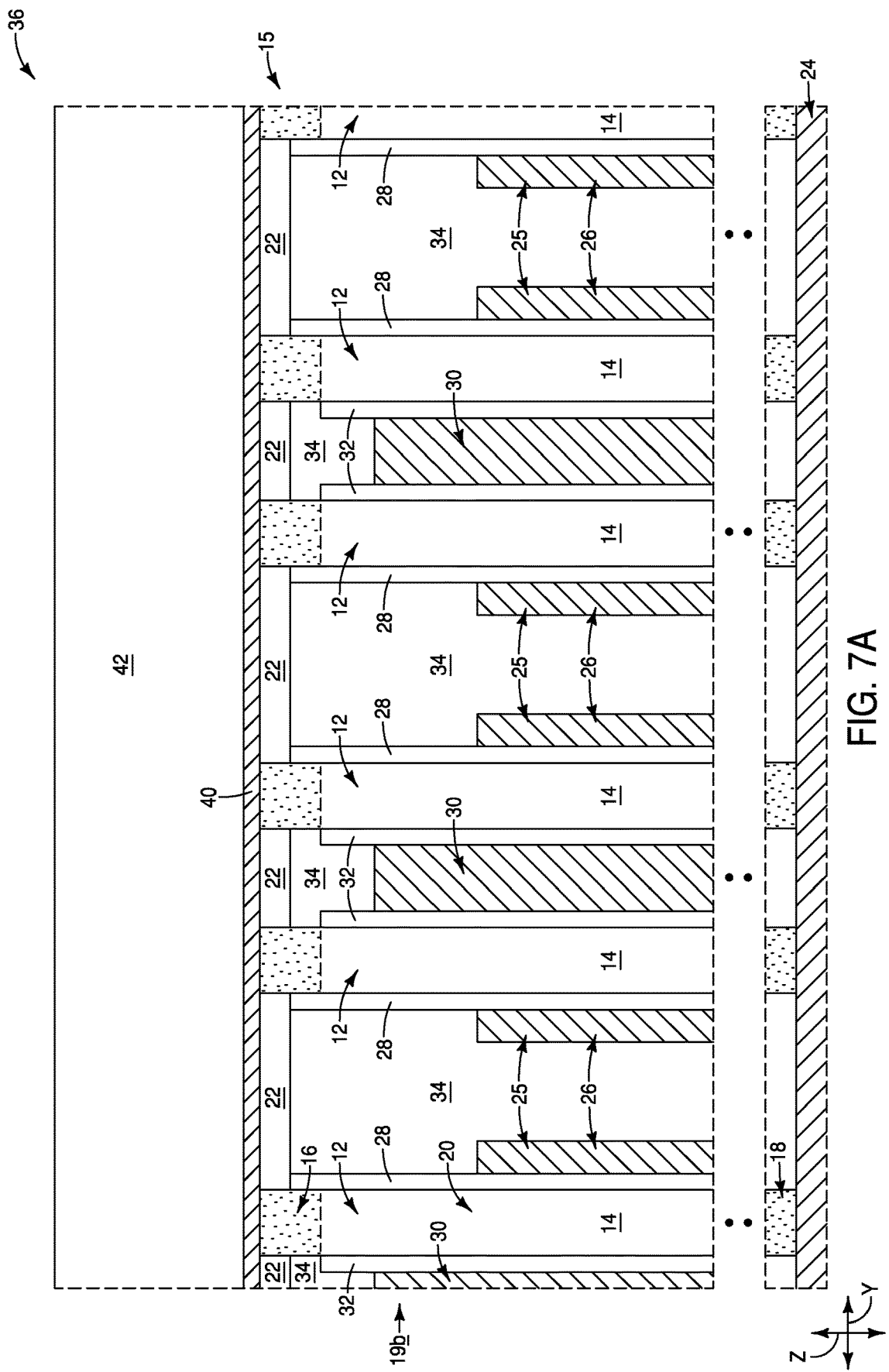
Figure 7B:
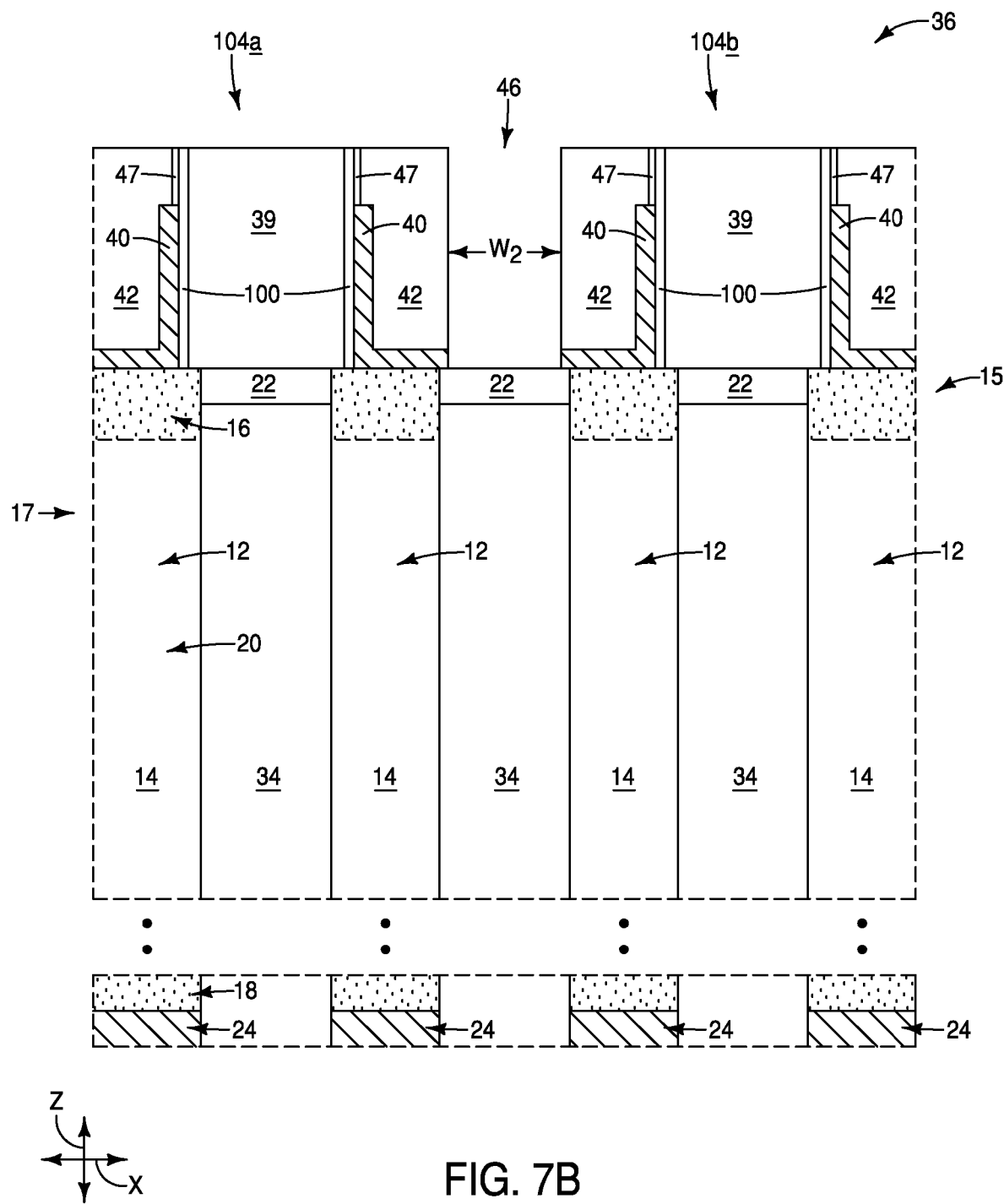

Referring to FIGS. 7-7B, the assembly 36 is subjected to one or more etches, and possibly also planarization, to remove the materials 47 and 42 from over the linear structures 104; and to extend the valleys 46 through the materials 40 and 42, and to the insulative material 22. The valleys 46 thus become openings 46 which extend through the materials 42 and 40 to the material 22. In the illustrated embodiment, the openings 46 stop at an upper surface of the material 22. In other embodiments, the openings 46 may penetrate into the material 22 (or may even penetrate through the material 22 and stop at the underlying material 34).

The illustrated embodiment shows the upper surfaces of materials 39, 100, 47 and 42 being substantially coplanar. In other embodiments at least one of such upper surfaces may be at a different elevational level relative to one or more of the others of such upper surfaces.

The illustrated opening 46 may, for example, have a width $W_2$ along the cross-section of FIG. 7A within a range of from about 10 nm to about 30 nm.

Figure 8:
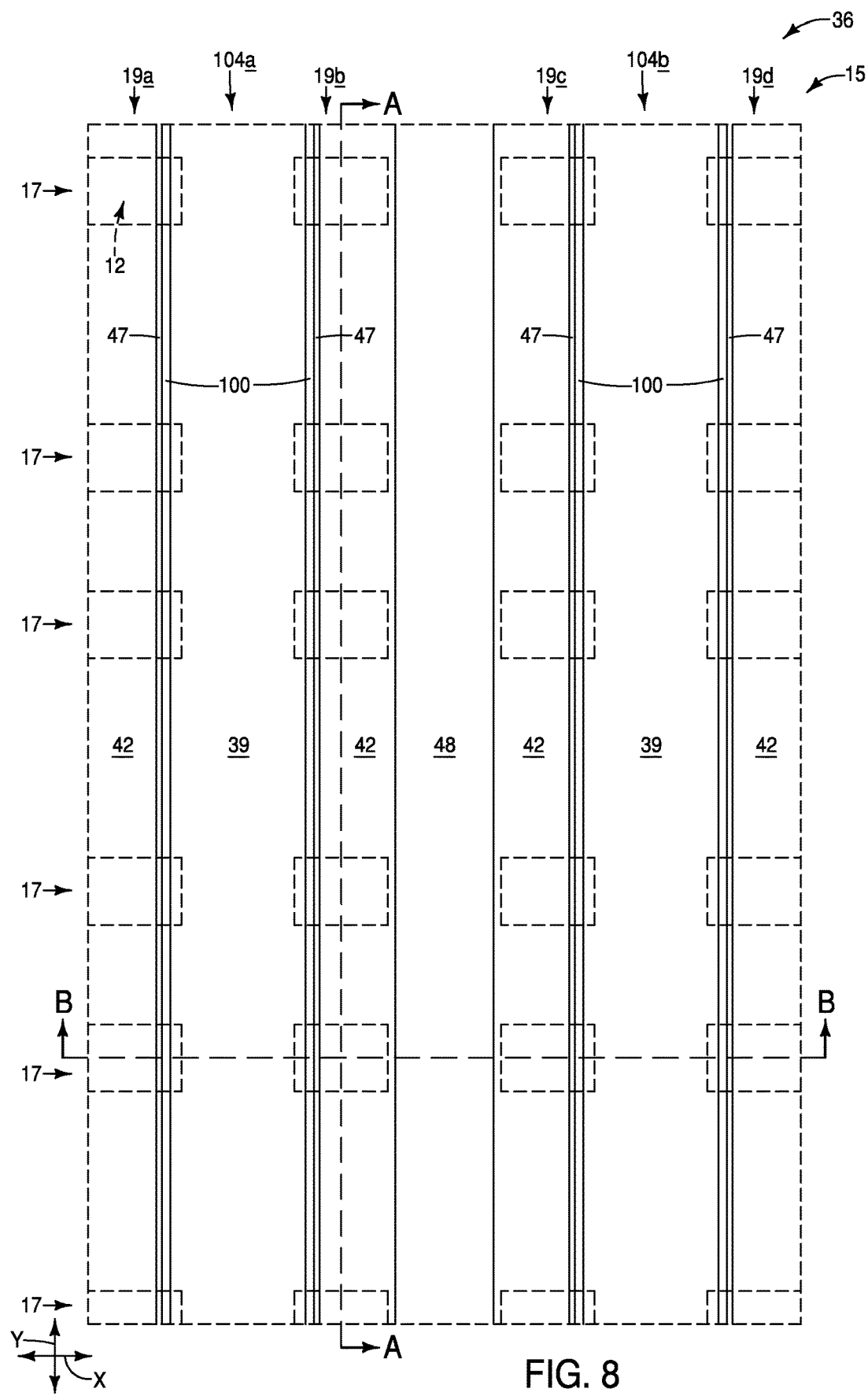
FIGS. 8-8B are diagrammatic views of the region of FIGS. 1-1B at an example process stage following that of FIGS. 7-7B.
Figure 8A:
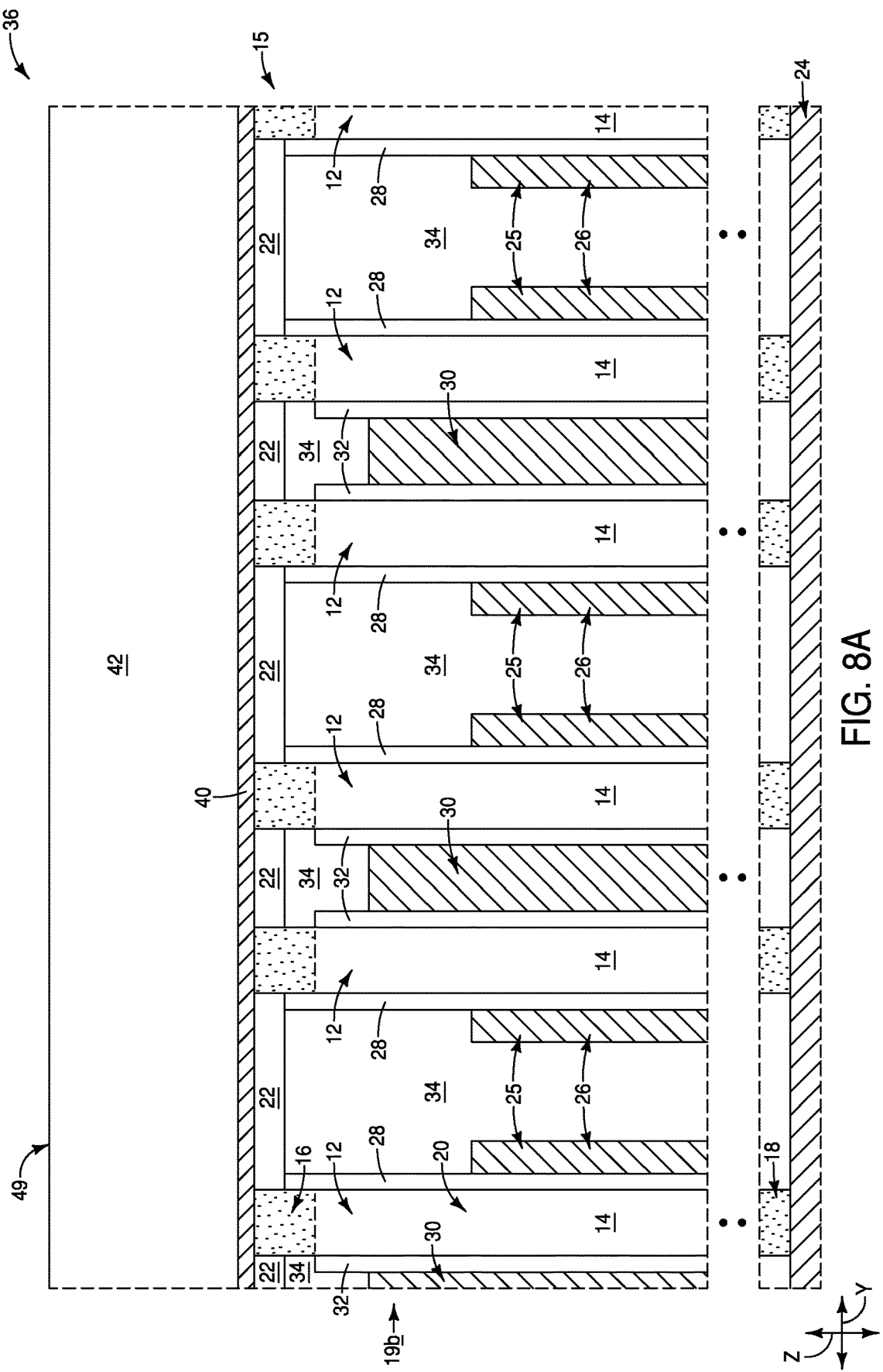
Figure 8B:
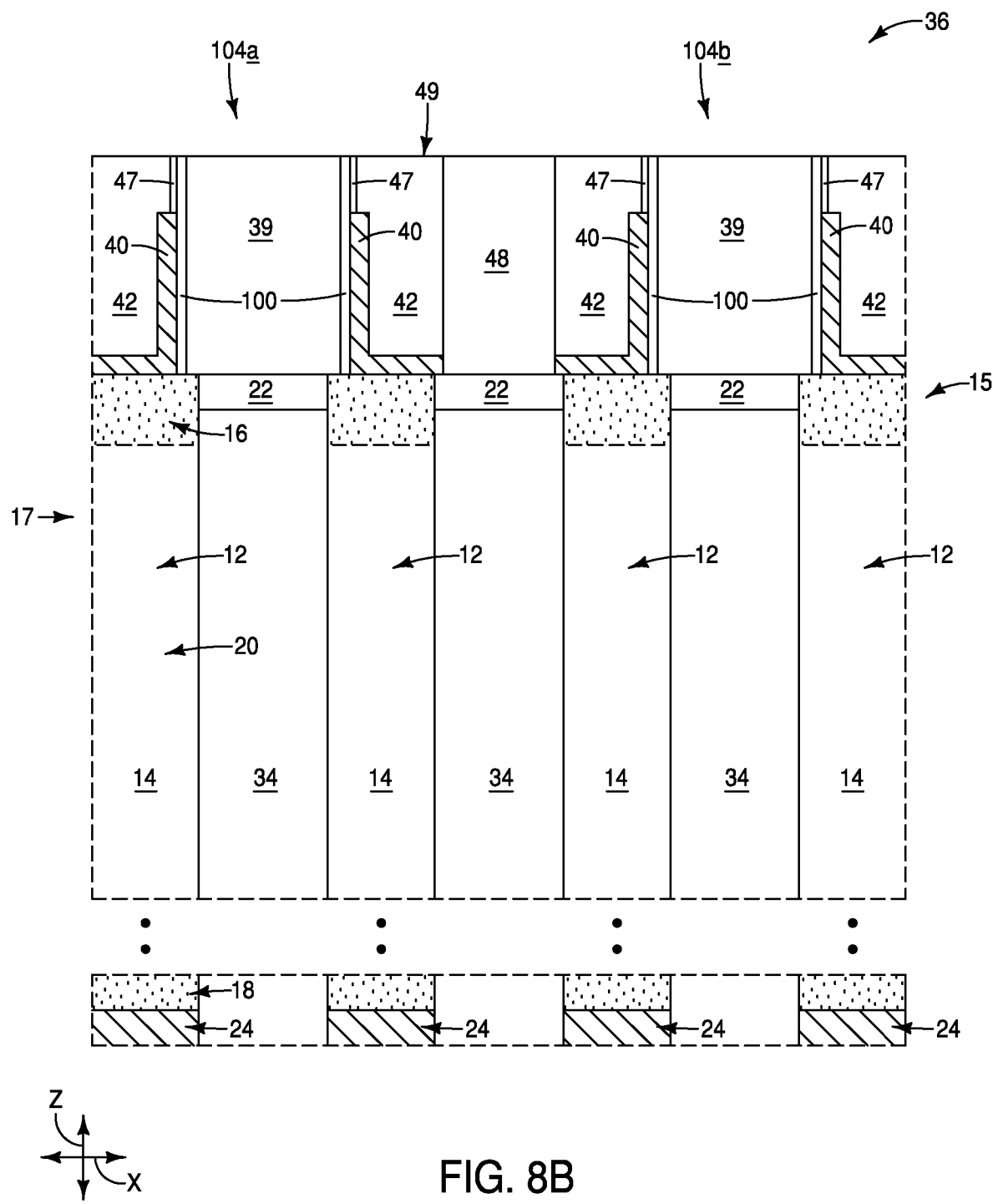

Referring to FIGS. 8-8B, fill material 48 is formed within the opening 46. Subsequently, CMP and/or other suitable planarization is utilized to form a planar surface 49 extending across the materials 39, 100, 42, 47 and 48.

The fill material 48 may comprise any suitable composition(s); and in some embodiments may comprise, consist essentially of, or consist of one or more of silicon dioxide, silicon nitride and silicon oxynitride. Accordingly, the fill material 48 may or may not be a same composition as the patterning material 42.

Figure 9:
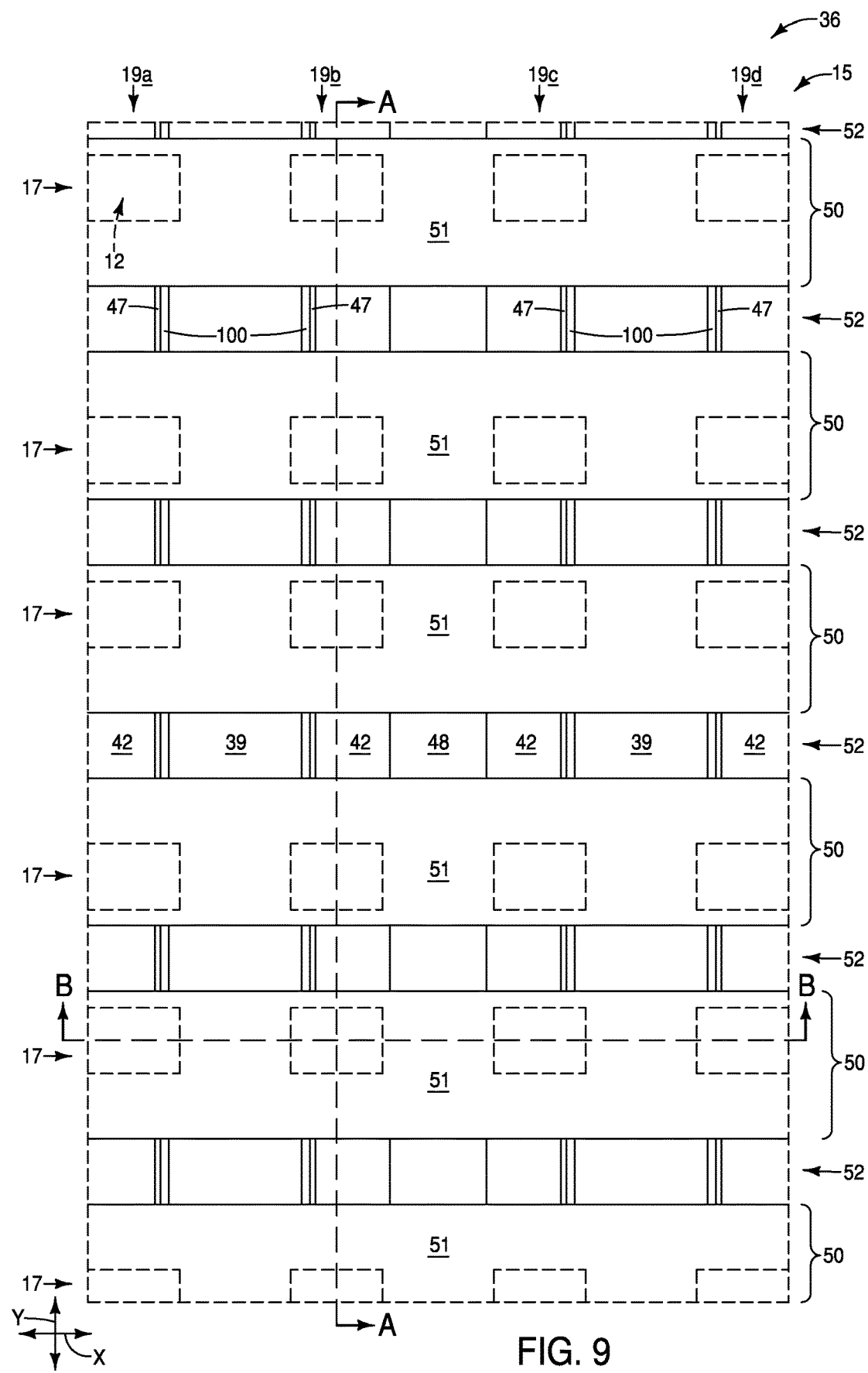
FIGS. 9-9B are diagrammatic views of the region of FIGS. 1-1B at an example process stage following that of FIGS. 8-8B.
Figure 9A:
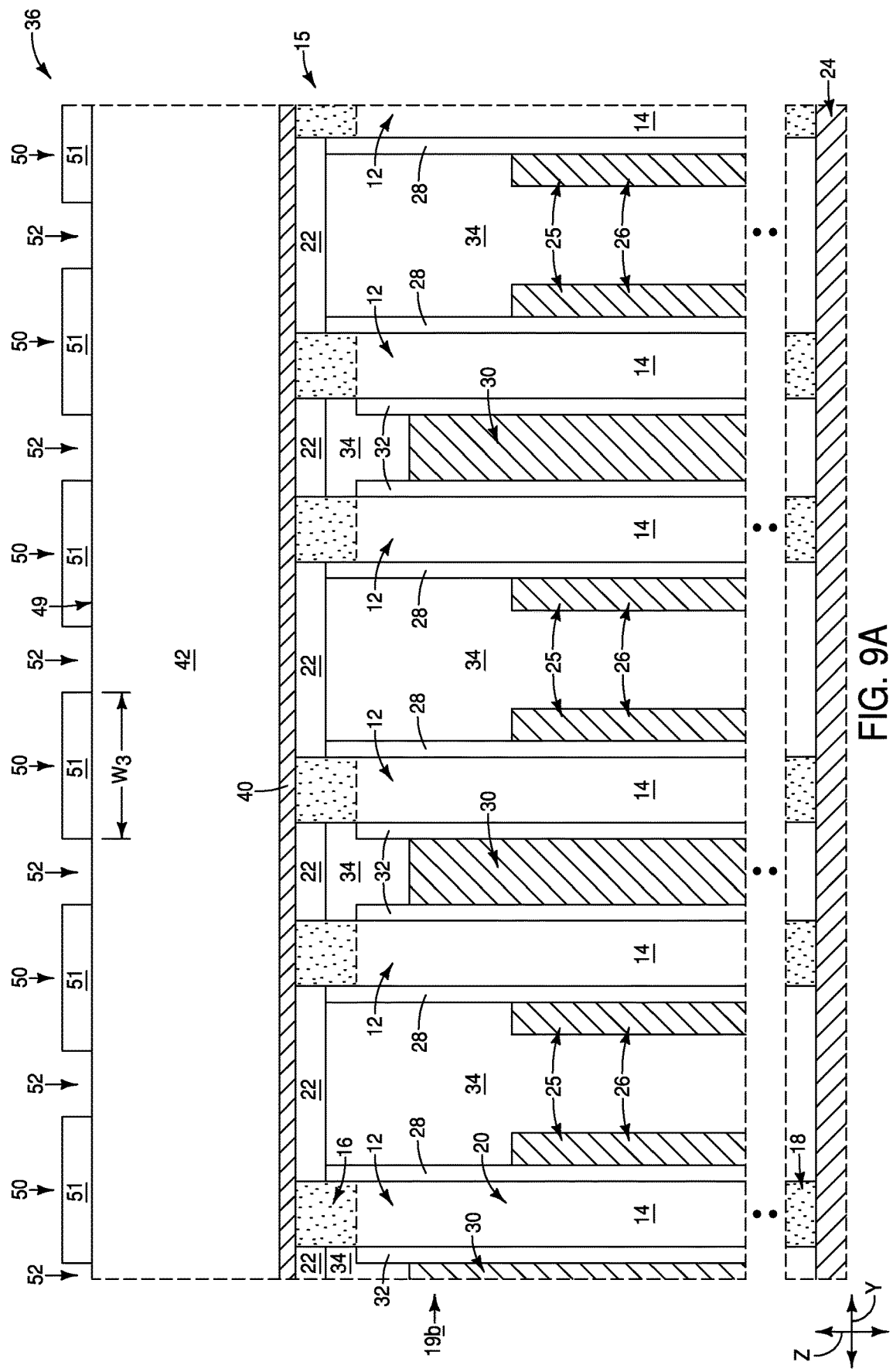
Figure 9B:
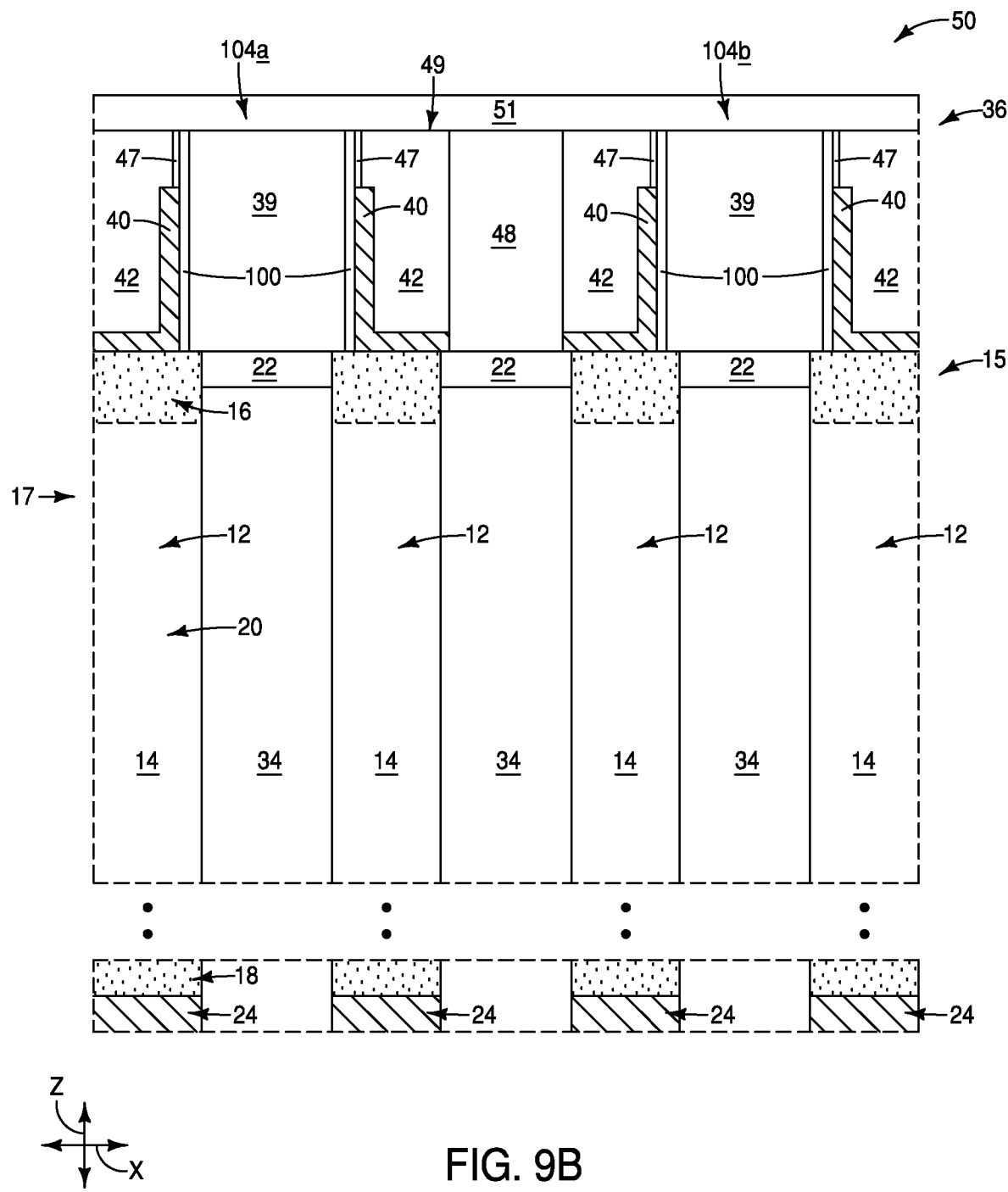

Referring to FIGS. 9-9B, mask structures (beams, rails) 50 are formed on the planar surface 49, and extend along the row direction (the illustrated x-axis direction). The mask structures 50 may comprise any suitable composition(s) 51; and in some embodiments may comprise, consist essentially of, or consist of carbon-containing material (e.g., amorphous carbon, resist, etc.).

The mask structures 50 are spaced from one another by intervening gaps 52.

The mask structures 50 may have any suitable dimensions; and may, for example, have widths $W_3$ along the cross-section of FIG. 9A within a range of from about 10 nm to about 30 nm.

The embodiment of FIGS. 9 and 9A shows the spacings 52 to all be of about the same width along the y-axis direction. In other embodiments (not shown), some of the spacings 52 may vary in width relative to others.

Figure 10:
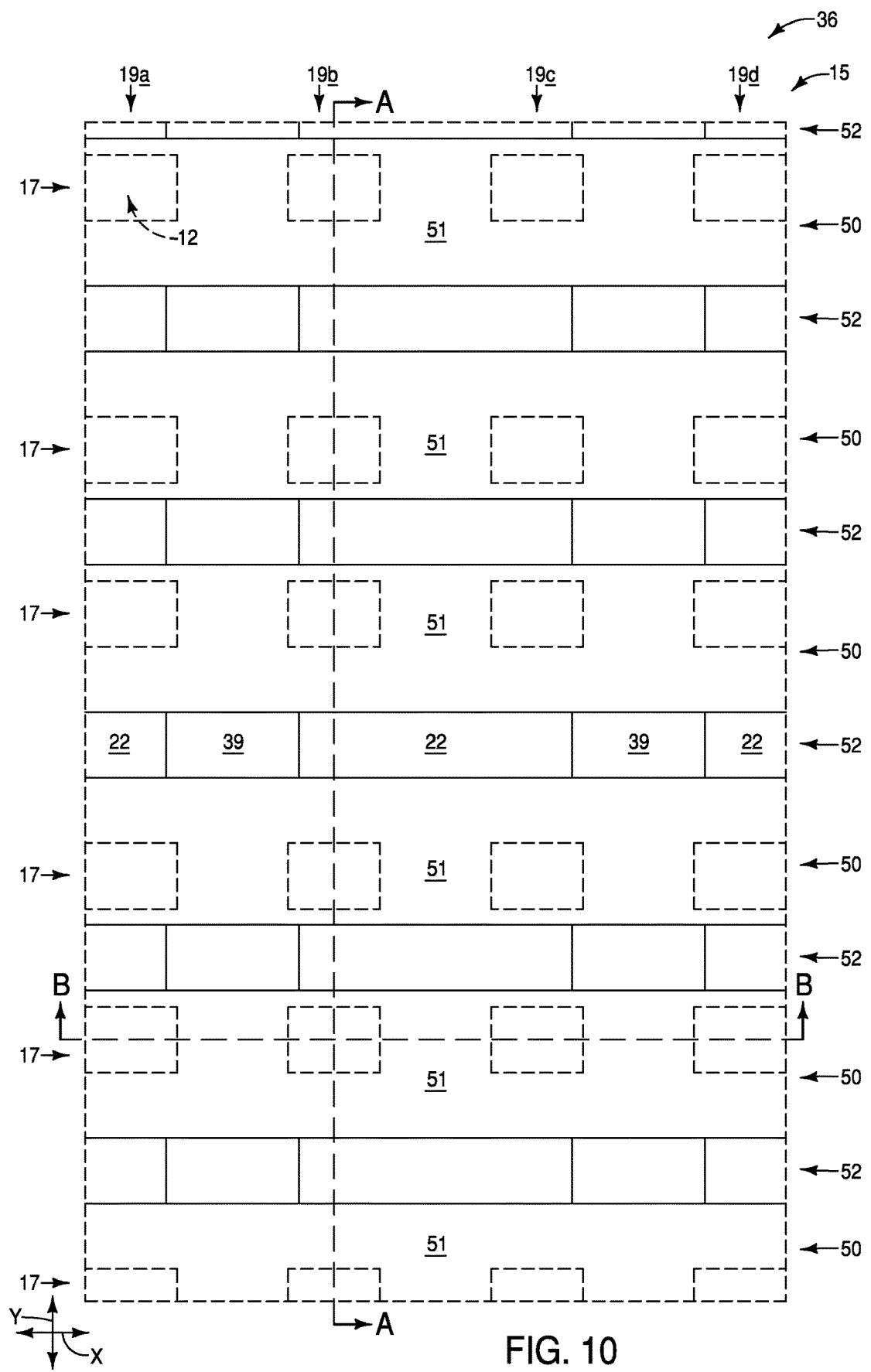
FIGS. 10-10B are diagrammatic views of the region of FIGS. 1-1B at an example process stage following that of FIGS. 9-9B.
Figure 10A:
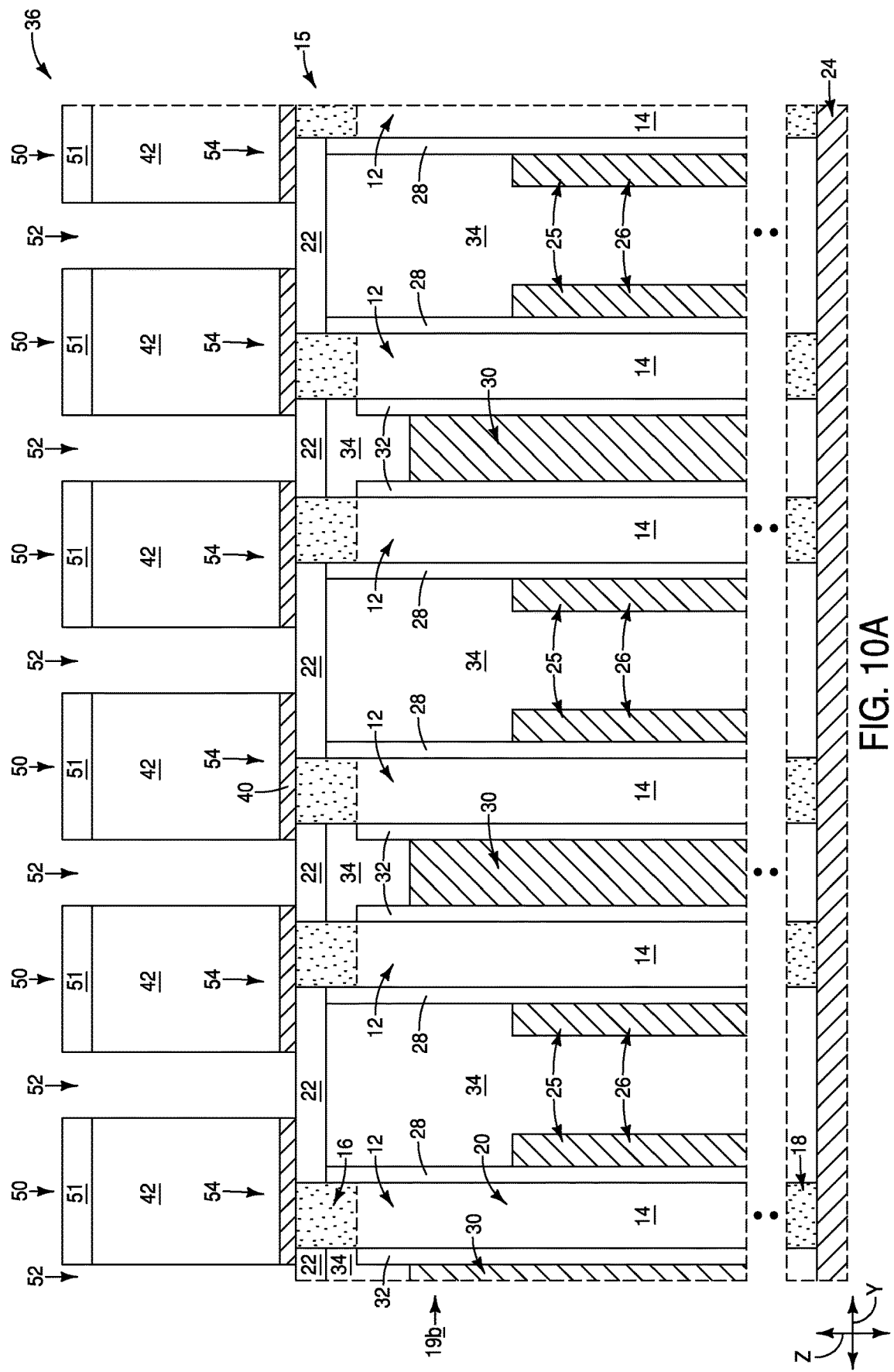
Figure 10B:
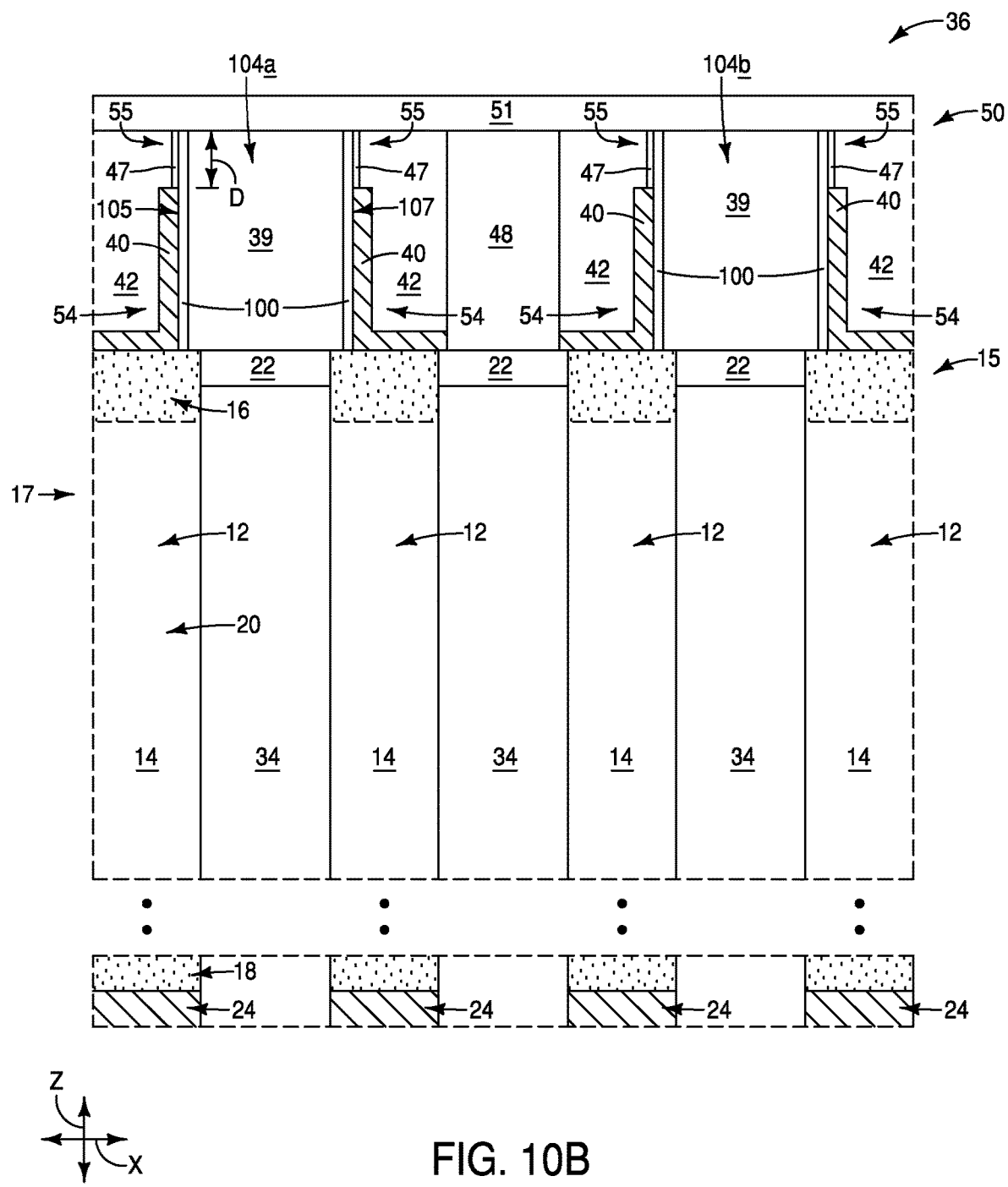

Referring to FIGS. 10-10B, the gaps 52 are extended through the materials 40, 42, 47, 48 and 100, and to an upper surface of the insulative material 22. In other embodiments (not shown), the gaps 52 may punch into the material 22, or even through the material 22 and into the underlying insulative material 34.

The gaps 52 may be extended through the materials 40, 42, 47, 48 and 100 with any suitable processing, including, for example, dry etching to anisotropically etch through the materials 40, 42, 47, 48 and 100. Alternatively, dry etching may be utilized to anisotropically etch through the materials 42, 47, 48 and 100, and then a wet etch may be utilized to extend the openings 52 through the thin layer corresponding to the bottom-electrode-material 40.

The patterning of the bottom-electrode-material 40 at the process stage of FIGS. 7-7B (which forms the bottom-electrode-material 40 into strips extending along the y-axis), and the subsequent processing shown in FIGS. 10-10B (which subdivides the strips utilizing the trenches 52 that extend along the x-axis direction) may be considered to pattern the bottom-electrode-material 40 into bottom-electrode-structures (bottom electrodes) 54. Each of the bottom-electrode-structures is over one of the source/drain regions 16, and may be considered to be associated with a corresponding one of the vertically-extending pillars 12.

The processing of FIGS. 10-10B may also be considered to pattern strips of the leaker-device-material 47 (such strips are shown in the top-down view of FIG. 7) into leaker-device-structures 55 (shown in FIG. 10B). The leaker-device-structures 55 are along the sidewalls 105 and 107 of the structures 104, and are over (and directly against) the bottom-electrode-structures 54. The leaker-device-structures 55 may have any suitable vertical dimensions (vertical lengths) D, and in some embodiments such vertical dimensions may be less than or equal to about 10 nm.

Figure 11:
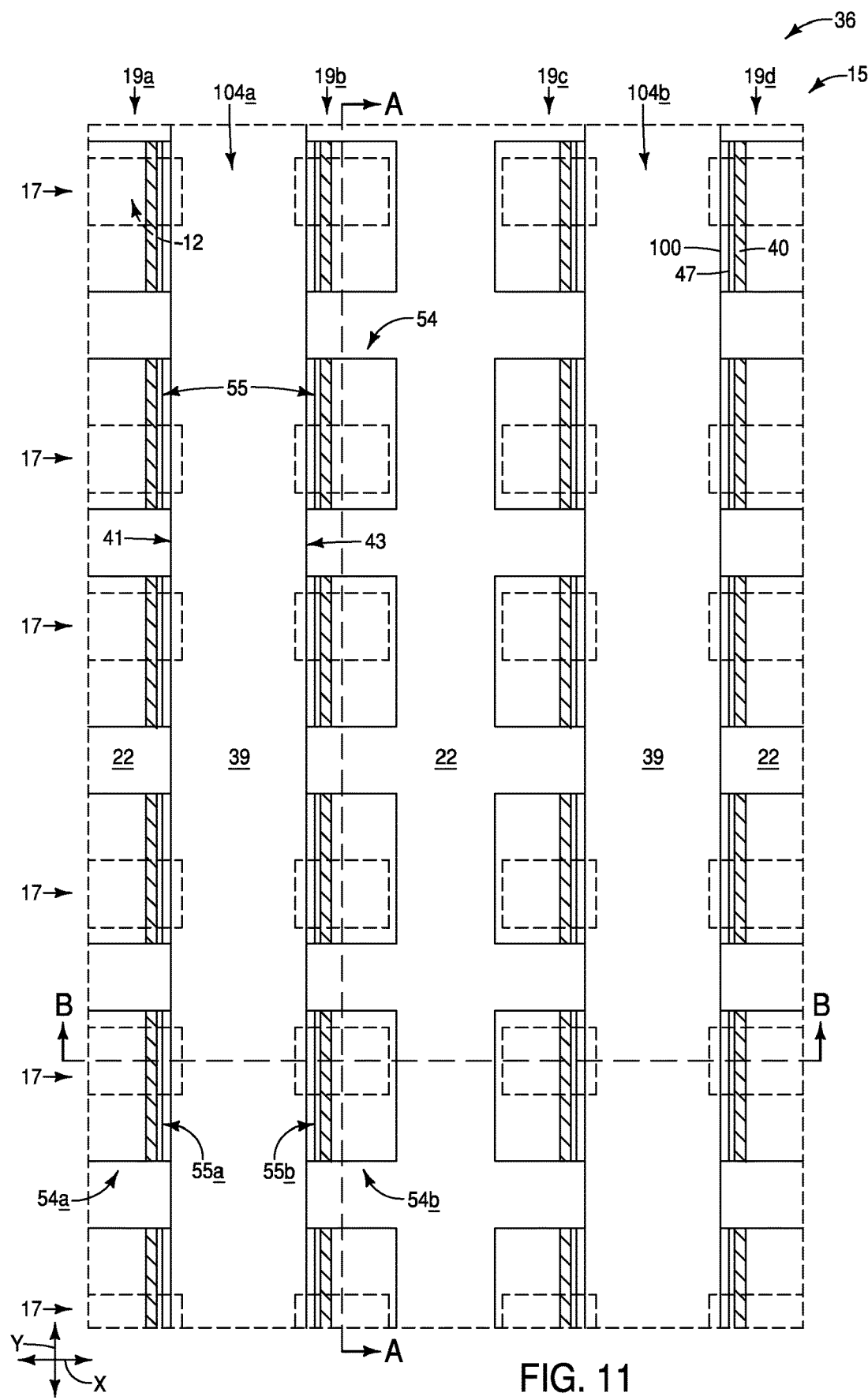
FIGS. 11-11C are diagrammatic views of the region of FIGS. 1-1B at an example process stage following that of FIGS. 10-10B.
Figure 11A:
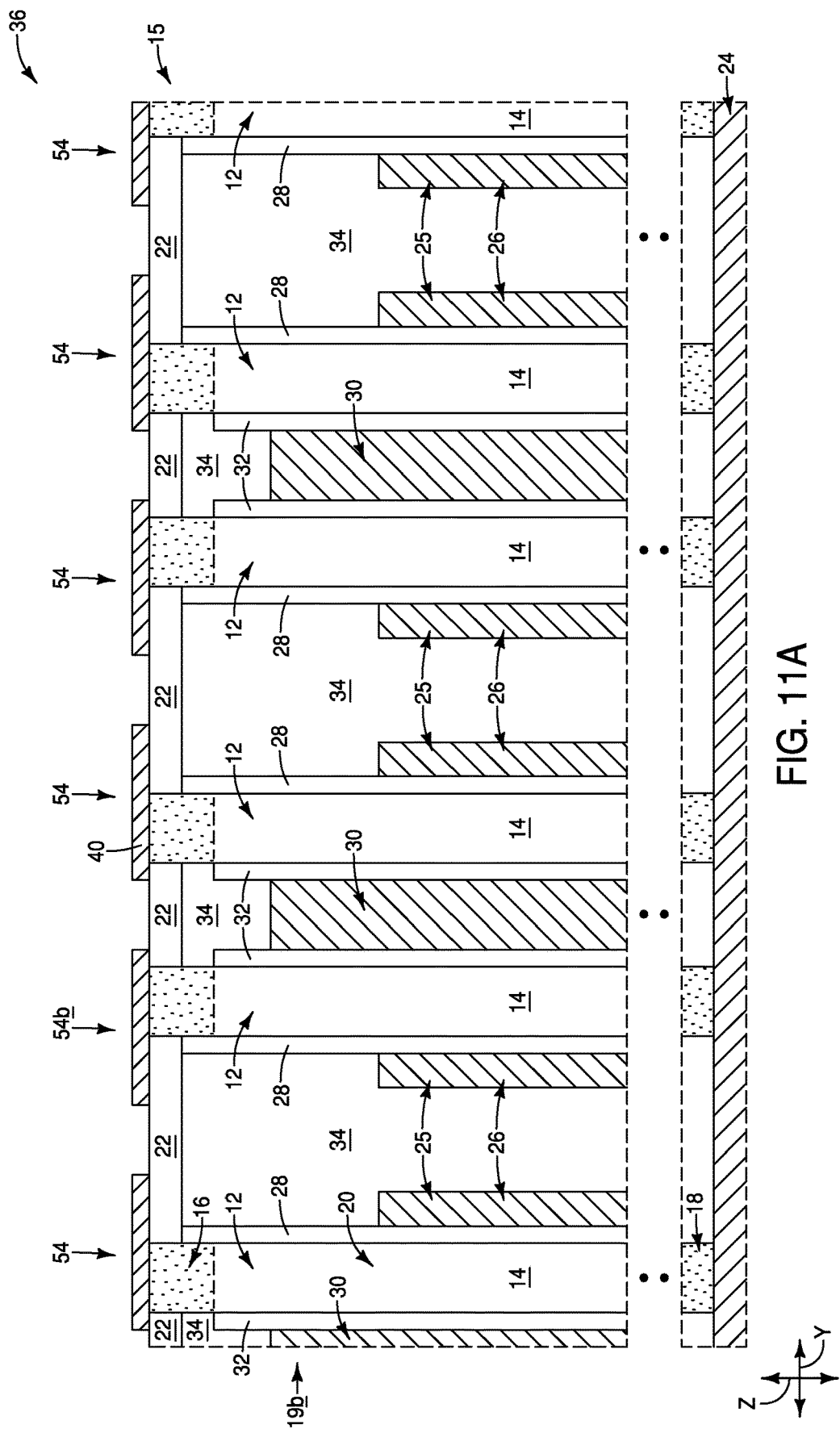
FIGS. 11A and 11B are cross-sectional side views along the lines A-A and B-B, respectively, of FIG. 11.
Figure 11B:
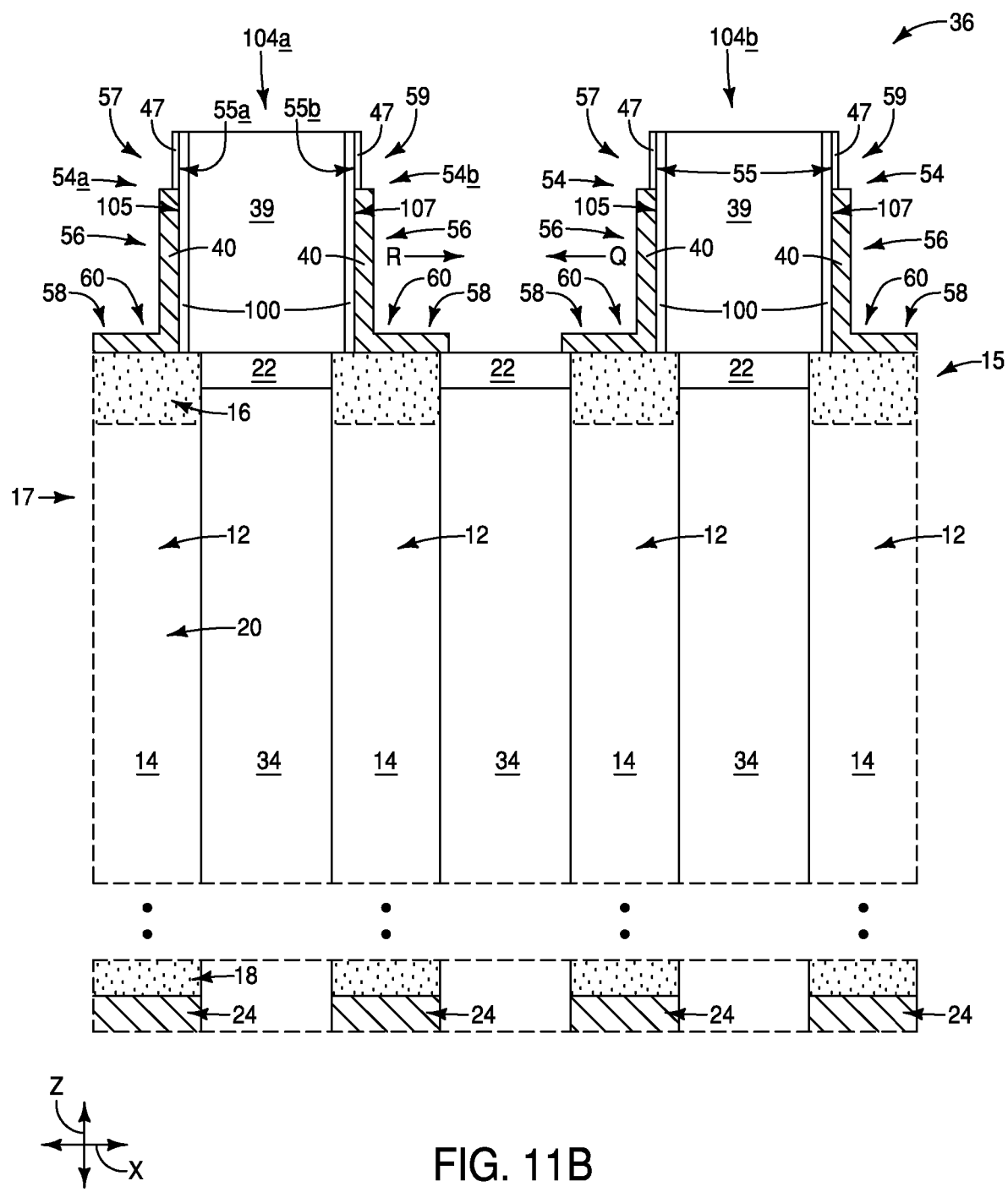
Figure 11C:
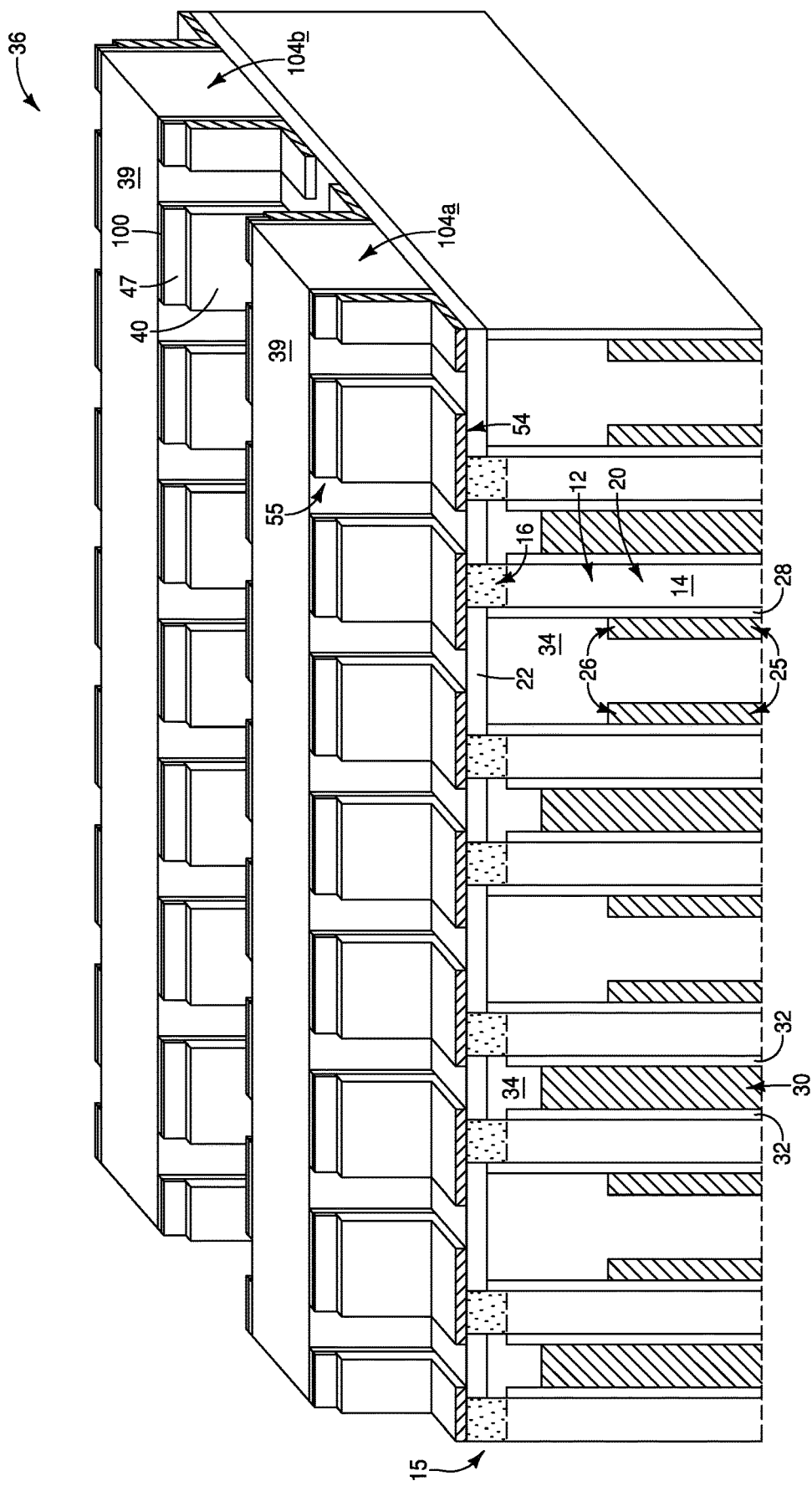

Referring to FIGS. 11-11C, the materials 51, 42 and 48 are removed with one or more suitable etches. The bottom electrodes 54 and the leaker-device-structures 55 remain.

Each of the bottom-electrode-structures 54 has a vertical segment 56 along one of sidewalls (105, 107) of a structure 104, and has a horizontal segment 58 along a source/drain region 16. The horizontal segments 58 join to the vertical segments 56 at corners 60. The corners 60 may be about 90° (i.e., may be approximately right angles), with the term "about 90°" meaning 90° to within reasonable tolerances of fabrication and measurement. In some embodiments, the term about 90° may mean 90°±10°.

In some embodiments, the horizontal segments 58 may be referred to as first segments and the vertical segments 56 may be referred to as second segments. The first and second segments 58 and 56 may or may not be substantially orthogonal to one another, depending on whether the sidewalls (105, 107) are vertical (as shown) or tapered.

In the illustrated embodiment, the vertical segments 56 are longer than the horizontal segments 58. In other embodiments, the segments 56 and 58 may be about the same length as one another, or the horizontal segments 58 may be longer than the vertical segments 56.

The bottom-electrode-structures 54 may be considered to be configured as angle plates, and in the shown embodiment are in one-to-one correspondence with the upper source/drain regions 16. Each of the bottom electrodes 54 may be considered to be electrically coupled with an associated source/drain region 16 of an associated pillar 12.

The bottom-electrode-structures 54 adjacent the first lateral sides 105 of the structures 104 may be considered to correspond to a first set 57 of the bottom-electrode-structures 54, and the bottom-electrode-structures 54 adjacent the second lateral sides 107 of the linear structures 104 may be considered to correspond to a second set 59 of the bottom-electrode-structures 54. The horizontal segments 58 of the bottom electrodes 54 within the first set 57 project in a first direction Q (with direction Q being shown in FIG. 11B), and the horizontal segments 58 of the bottom electrodes 54 within the second set 59 project in a second direction R (with direction R being shown in FIG. 11B). The direction R is opposite to the direction Q. In some embodiments, the bottom electrodes of the first set 57 may be considered to be substantially mirror images of the bottom electrodes of the second set 59, where the term "substantial mirror image" means a mirror image to within reasonable tolerances of fabrication and measurement.

Two of the bottom electrodes 54 of FIGS. 11-11B are labeled as 54a and 54b, and such may be referred to as a first and second bottom electrodes, respectively. The leaker-device-structures extending upwardly from the bottom electrodes 54a and 54b are labeled as 55a and 55b, and may be referred to as first and second leaker-device-structures, respectively.

Figure 12:
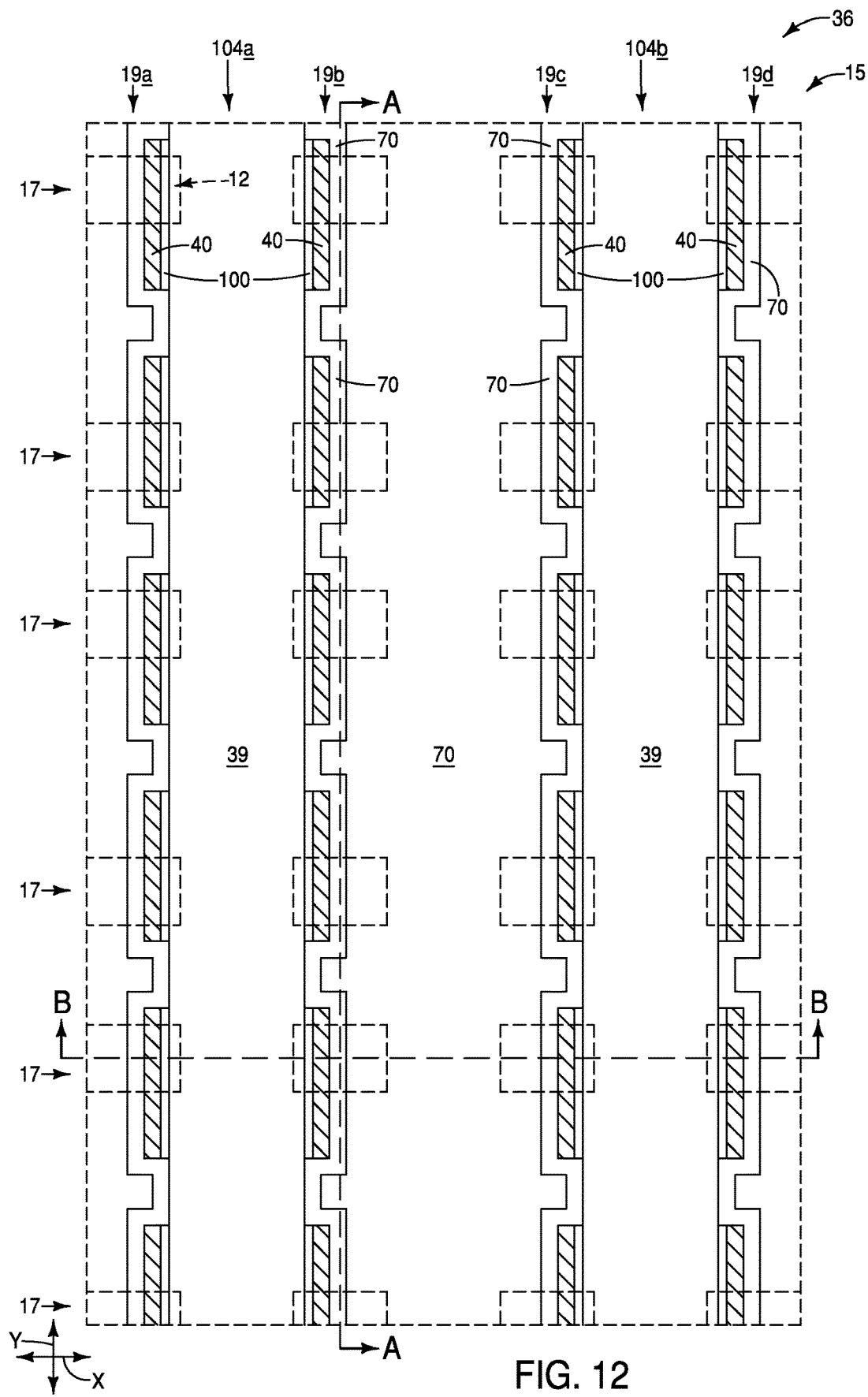
FIGS. 12-12B are diagrammatic views of the region of FIGS. 1-1B at an example process stage following that of FIGS. 11-11C.
Figure 12A:
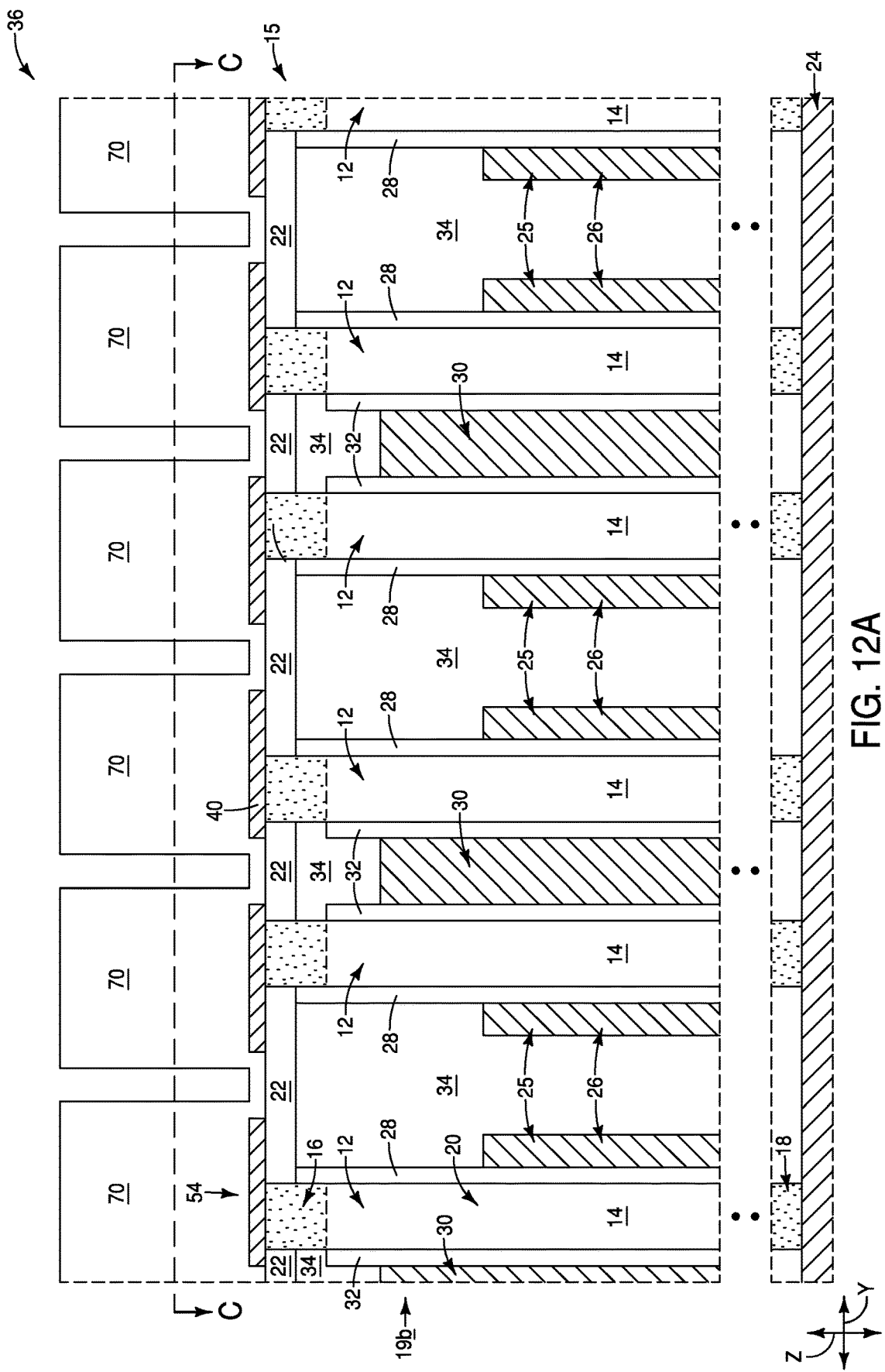
Figure 12B:
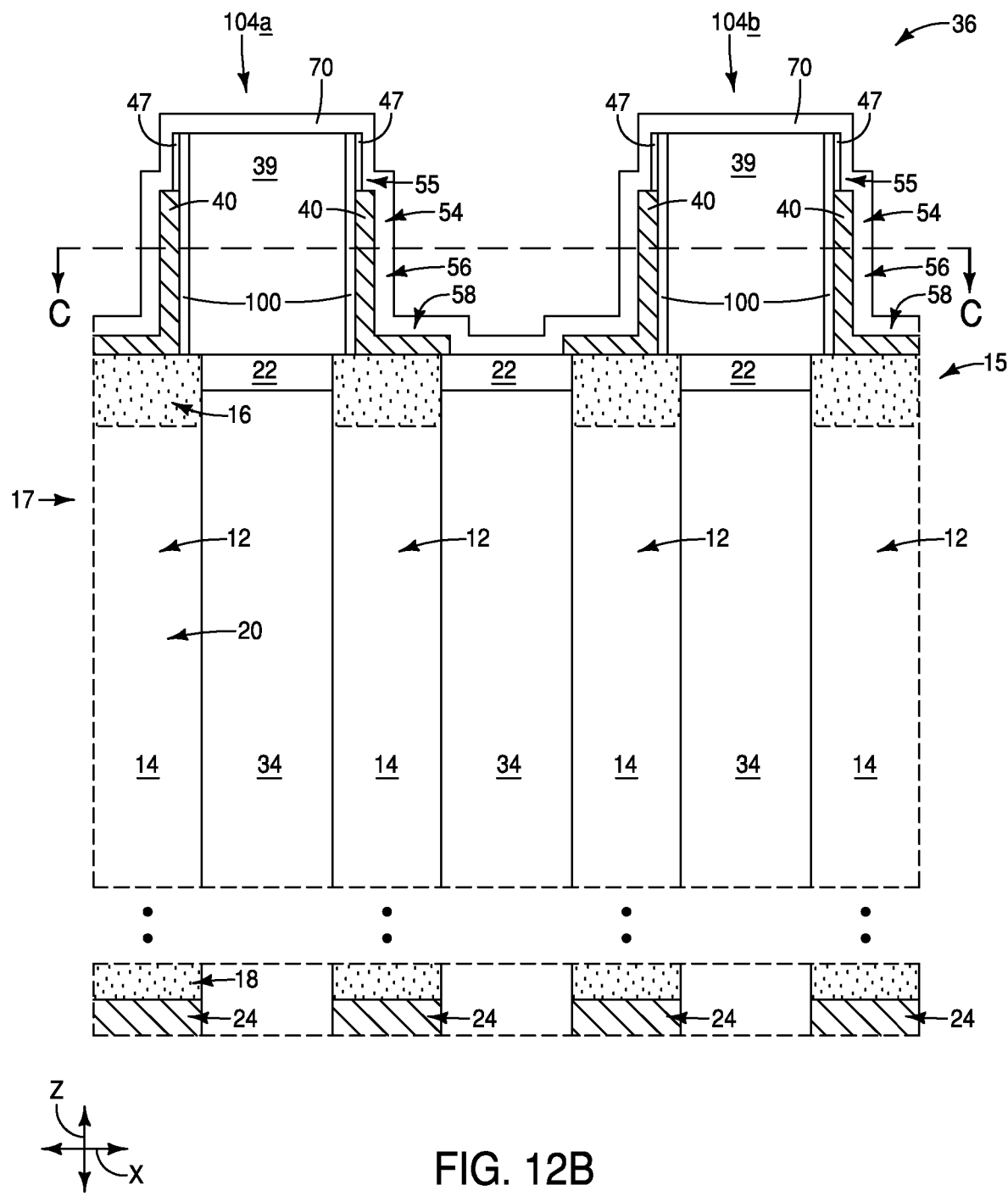

Referring to FIGS. 12-12B, capacitor-insulative-material (e.g., ferroelectric-insulative-material) 70 is formed to be over and directly against the bottom-electrode-structures 54. It is noted that FIG. 12 is a top-down view along the lines C-C of FIGS. 12A and 12B.

In the shown embodiment, the capacitor-insulative-material 70 extends across the material 22 between the bottom electrodes 54, as well as extending over the bottom electrodes. The material 70 also extends over the linear features 104. The capacitor-insulative-material 70 is laterally adjacent to the leaker-device-structures 55, is laterally adjacent to the vertical segments 56 of the bottom electrodes, and is over the horizontal segments 58 of the bottom electrodes.

The capacitor-insulative-material 70 may comprise any suitable composition or combination of compositions, including, for example, silicon dioxide, silicon nitride, etc. In some embodiments, the capacitor-insulative-material 70 may be ferroelectric-insulative-material; and in some example embodiments the ferroelectric-insulative-material may include one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The insulative-material 70 may be formed to any suitable thickness; and in some embodiments may be formed to a thickness within a range of from about 30 Å to about 250 Å.

Figure 13:
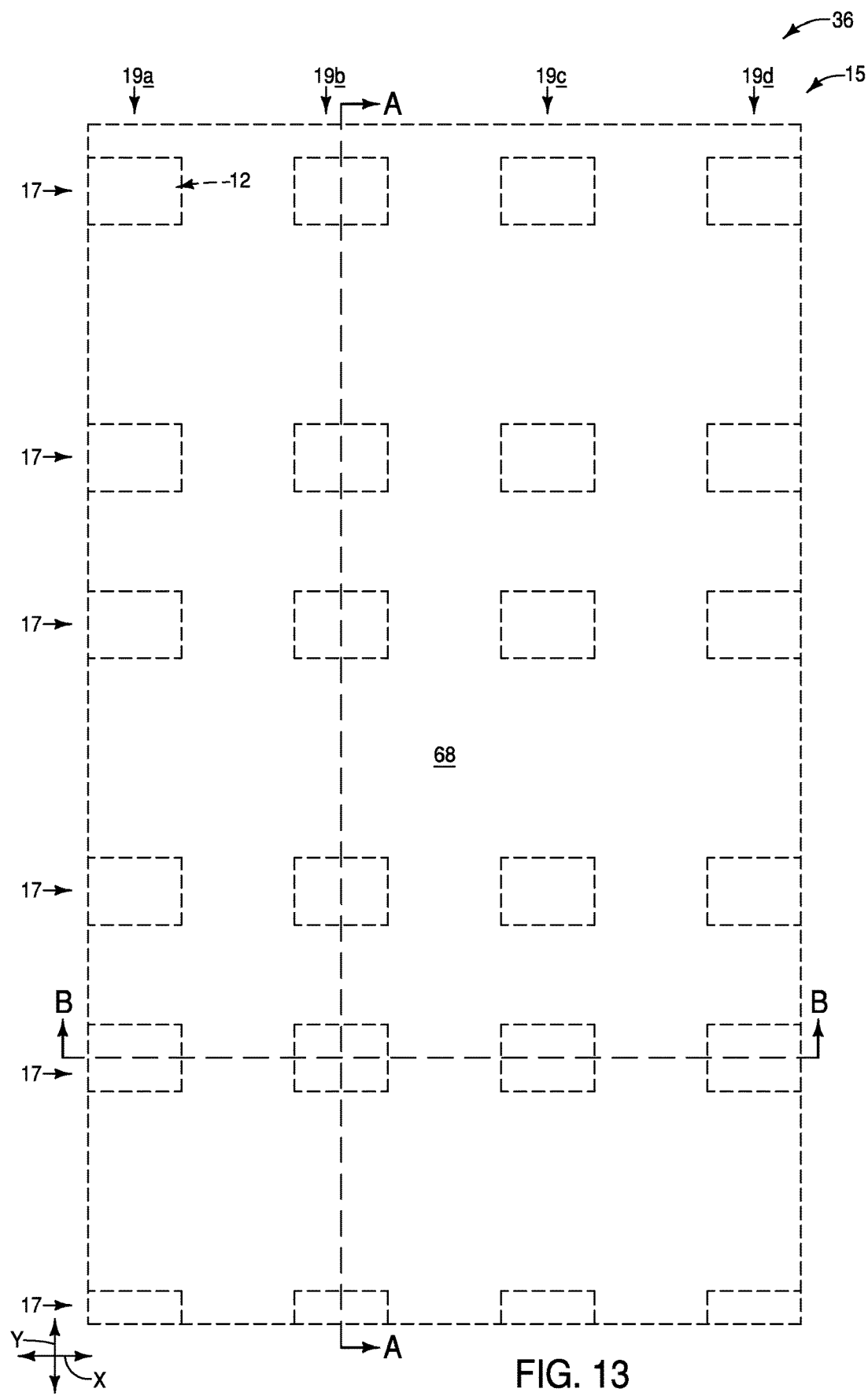
FIGS. 13-13B are diagrammatic views of the region of FIGS. 1-1B at an example process stage following that of FIGS. 12-12C.
Figure 13A:
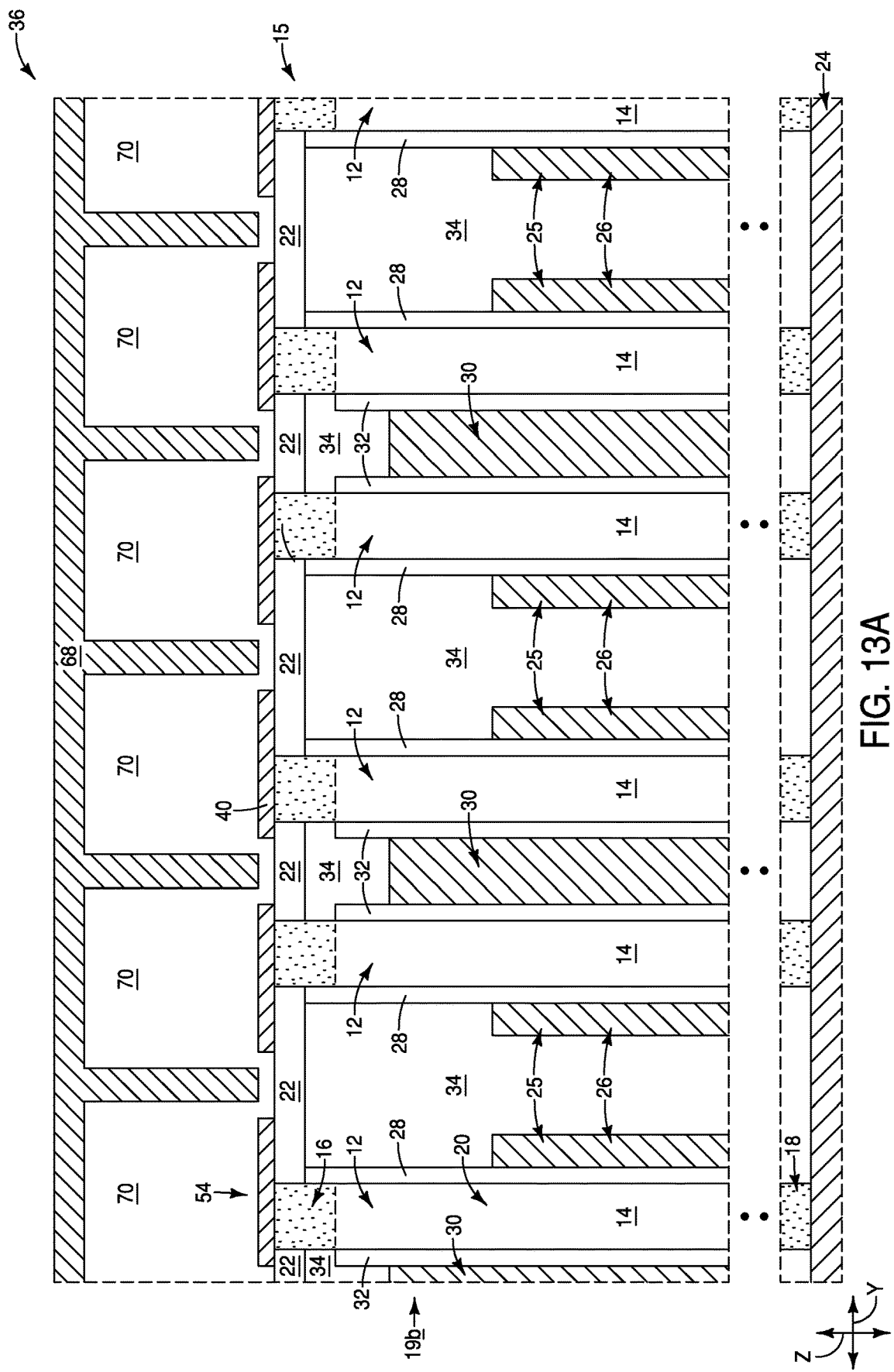
Figure 13B:
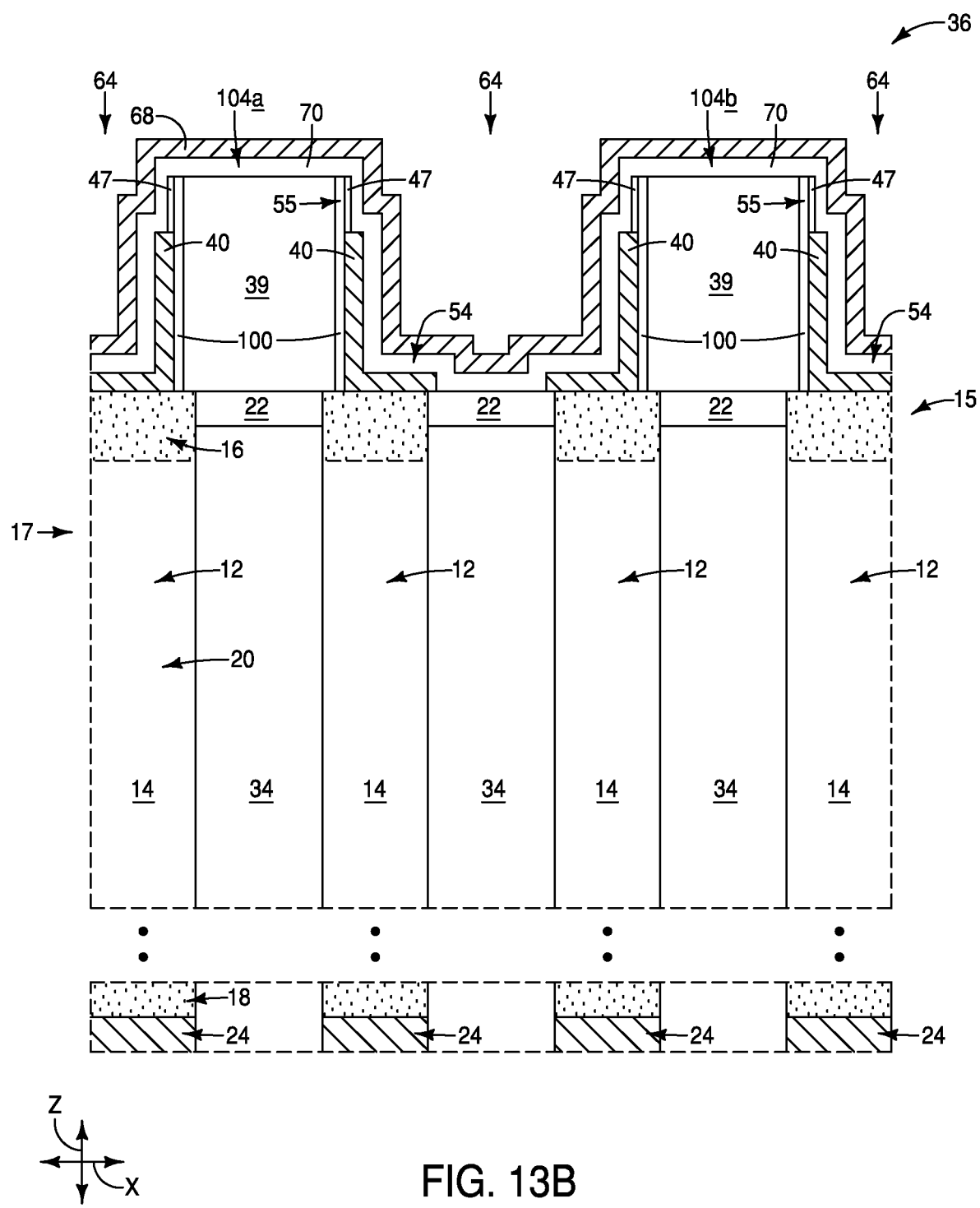

Referring to FIGS. 13-13B, top-electrode-material 68 is formed over the insulative-material 70.

The top-electrode-material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top-electrode-material 68 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten. In some embodiments, the top electrode material 68 may comprise, consist essentially of, or consist of titanium nitride.

The top-electrode-material 68 may have any suitable thickness, and in some embodiments may have a thickness of at least about 10 Å, at least about 100 Å, at least about 500 Å, etc.

The electrode materials 40 and 68 may comprise a same composition as one another in some embodiments, or may comprise different compositions relative to one another. In some embodiments, the electrode materials 40 and 68 may both comprise, consist essentially of, or consist of titanium nitride.

The embodiment of FIGS. 13-13B shows gaps 64 (FIG. 13B) in regions between the structures 104a and 104b. In some embodiments, the electrode material 68 may be formed thick enough to fill such gaps.

Figure 14:
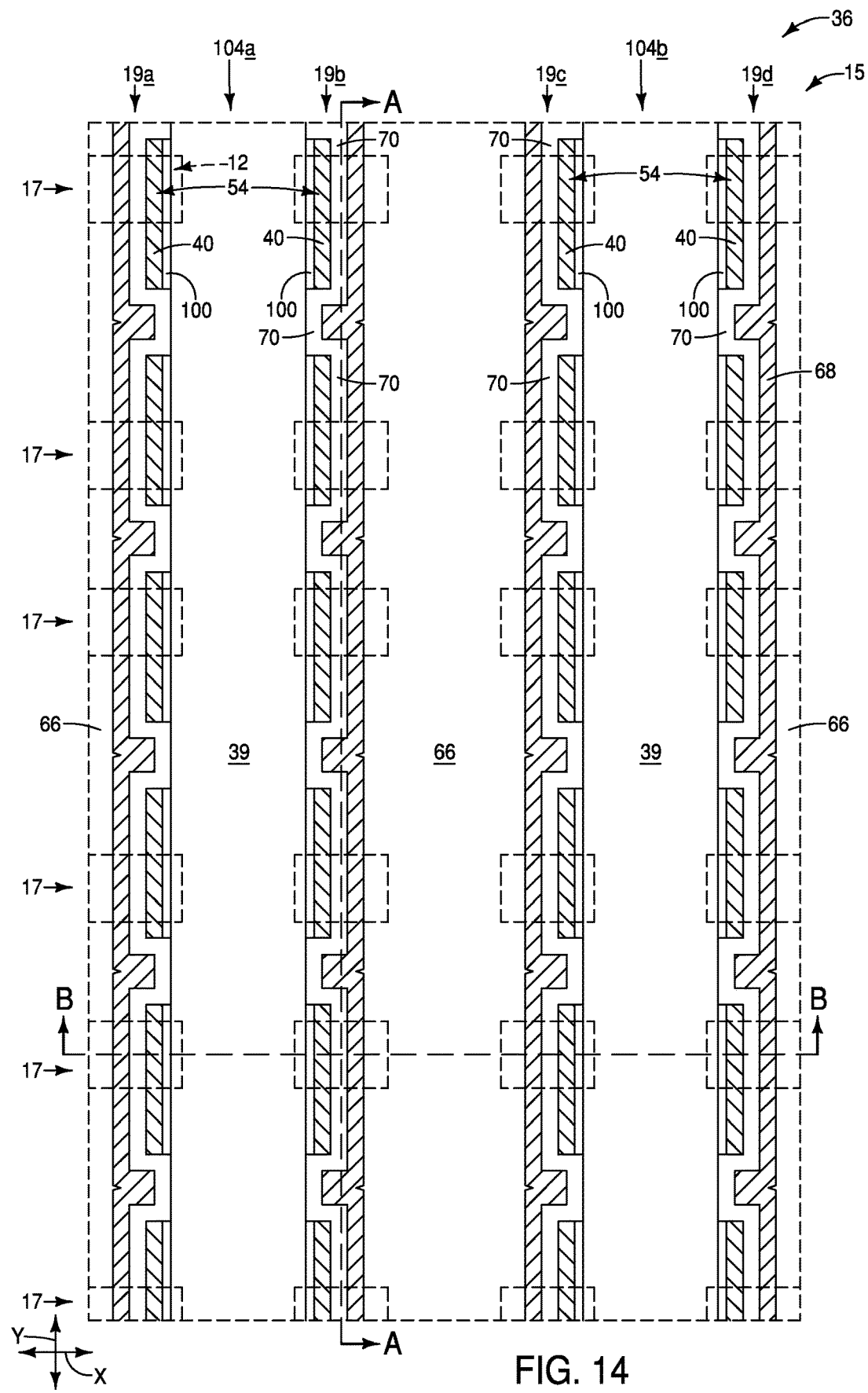
FIGS. 14-14B are diagrammatic views of the region of FIGS. 1-1B at an example process stage following that of FIGS. 13-13B.
Figure 14A:
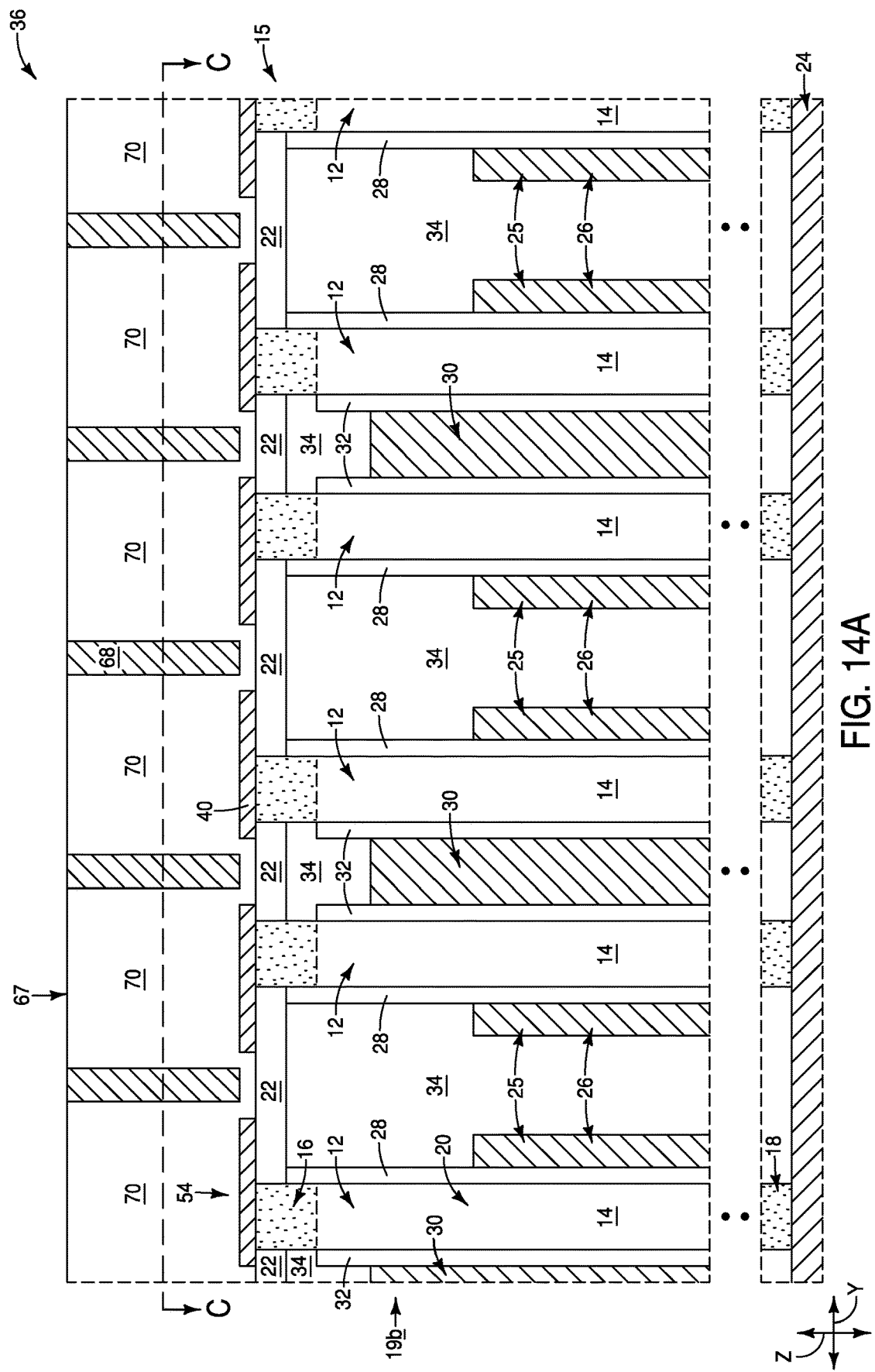
Figure 14B:
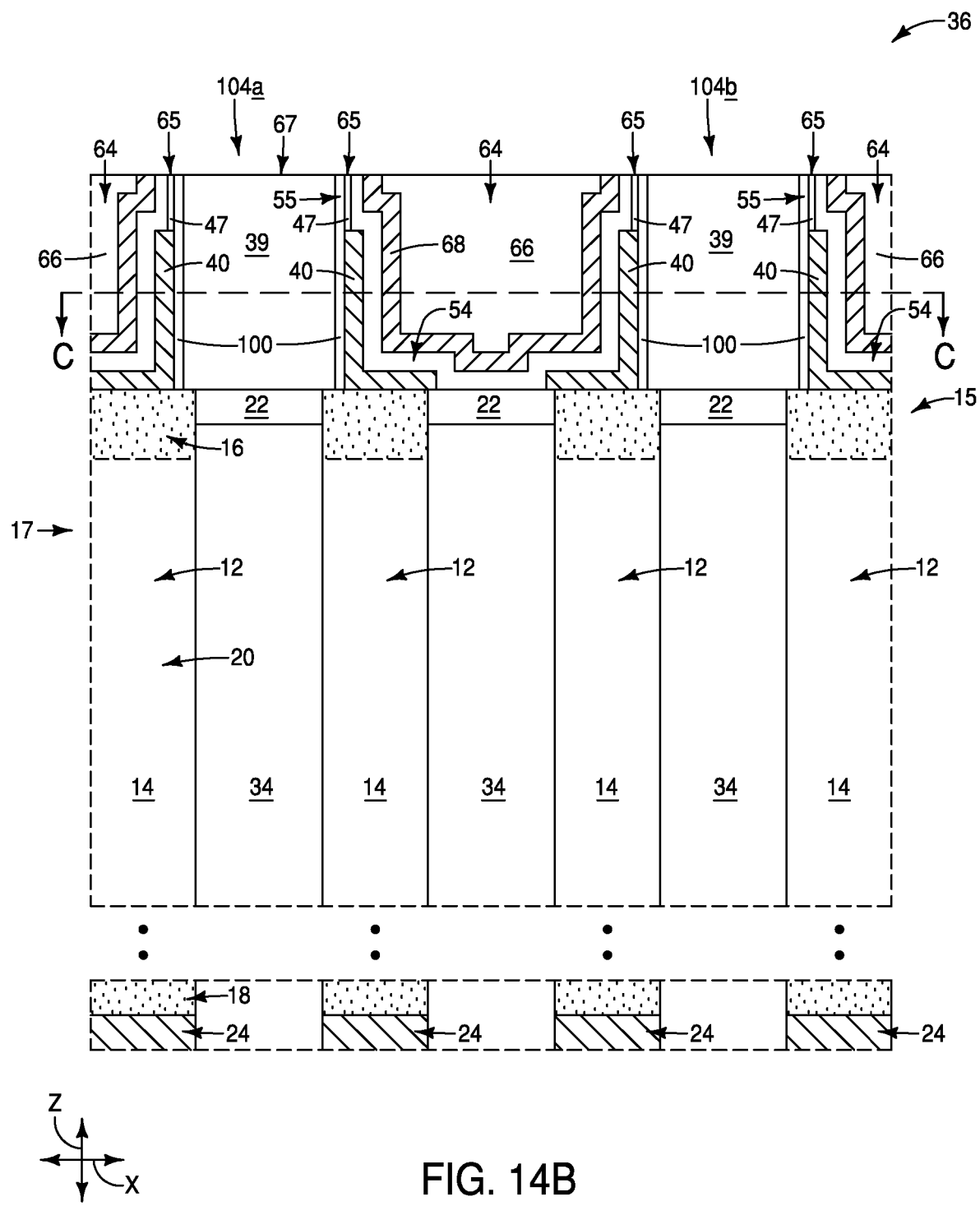

Referring to FIGS. 14-14B, protective material 66 is formed within the gaps 64, and subsequently planarization (e.g., CMP) is utilized to form a planarized surface 67. Upper edges 65 of the leaker-device-structures 55 are exposed along the surface 67.

The protective material 66 may comprise any suitable composition(s), such as, for example, silicon dioxide, silicon nitride, carbon, photoresist, etc. If the material 68 fills the gaps 64 at the process stage of FIGS. 13-13B, the protective material 66 of FIGS. 14-14B may be omitted.

Figure 15:
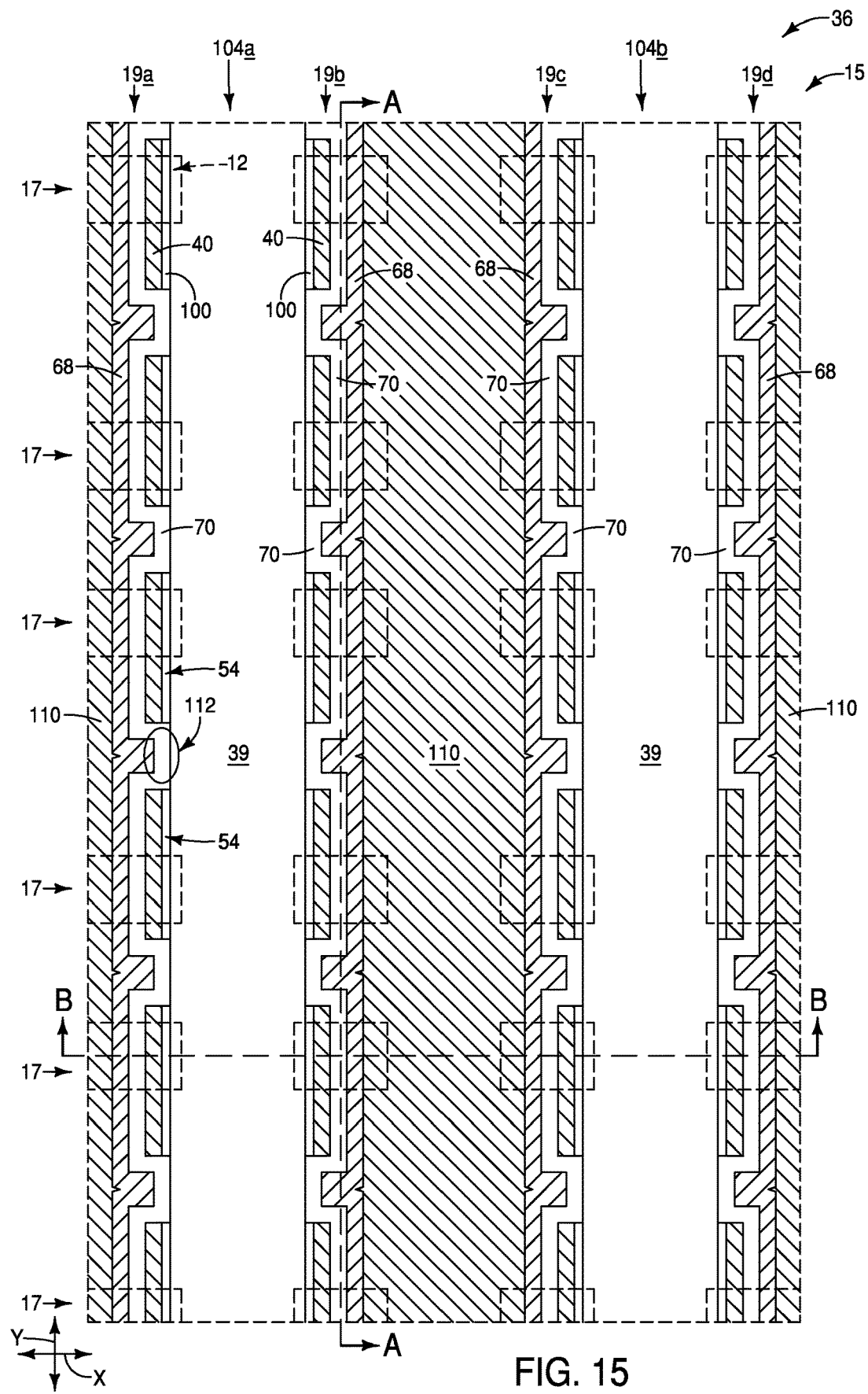
FIGS. 15-15B are diagrammatic views of the region of FIGS. 1-1B at an example process stage following that of FIGS. 14-14B.
Figure 15A:
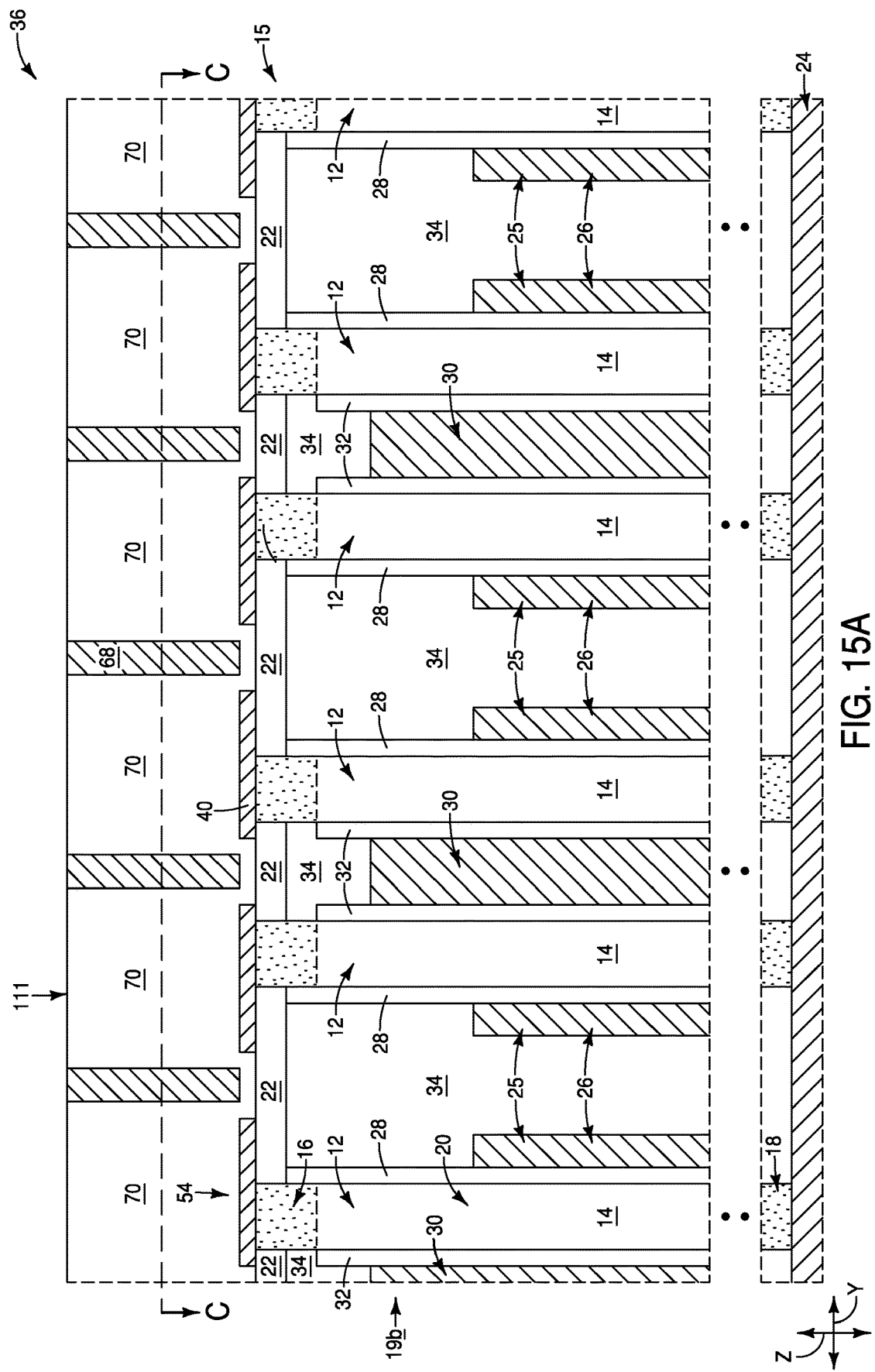
Figure 15B:
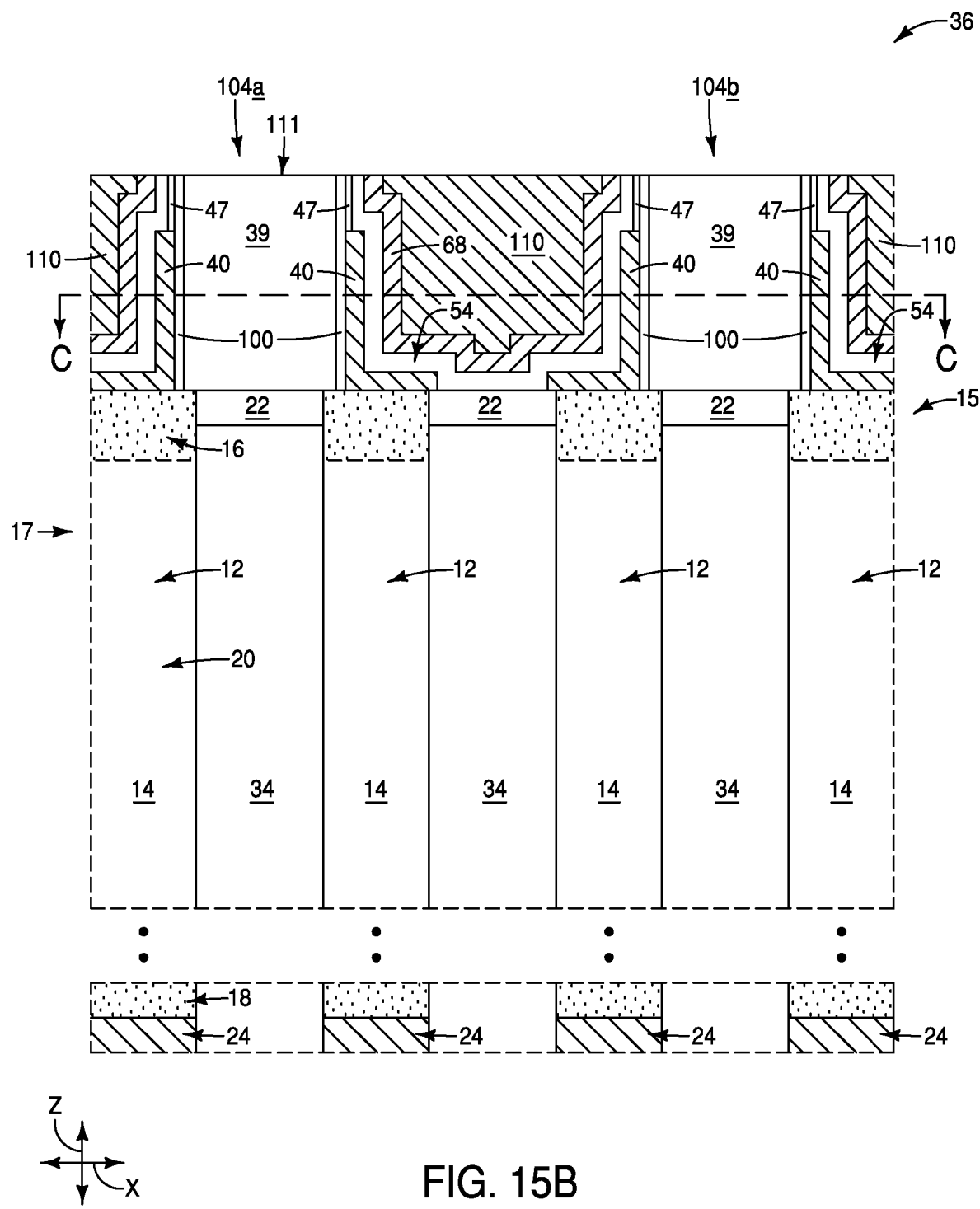

Referring to FIGS. 15-15B, the protective material 66 is removed, additional conductive material 110 is formed, and a planarized surface 111 is formed to expose the material 39 of the structures 104. If the conductive material 68 fills the gap 64 at the process stage of FIGS. 13-13B, the process stage of FIGS. 14-14B may be omitted and the process stage of FIGS. 15-15B may simply follow that of FIGS. 13-13B.

The conductive material 110 may comprise any of the compositions described above as being suitable for the conductive material 68, and may or may not comprise a same composition as the conductive material 68.

FIG. 15 shows that the insulative-material 70 extends into gaps in regions 112 between neighboring bottom electrodes 54. Only some of the regions 112 are labeled. The insulative-material 70 (particularly ferroelectric-insulative-material) within the regions 112 may undesirably enable cross-talk between adjacent bottom electrodes. Accordingly, some embodiments include methods of removing the insulative-material 70 from within the regions 112. In some embodiments, the regions 112 may be referred to as intervening regions.

Figure 16:
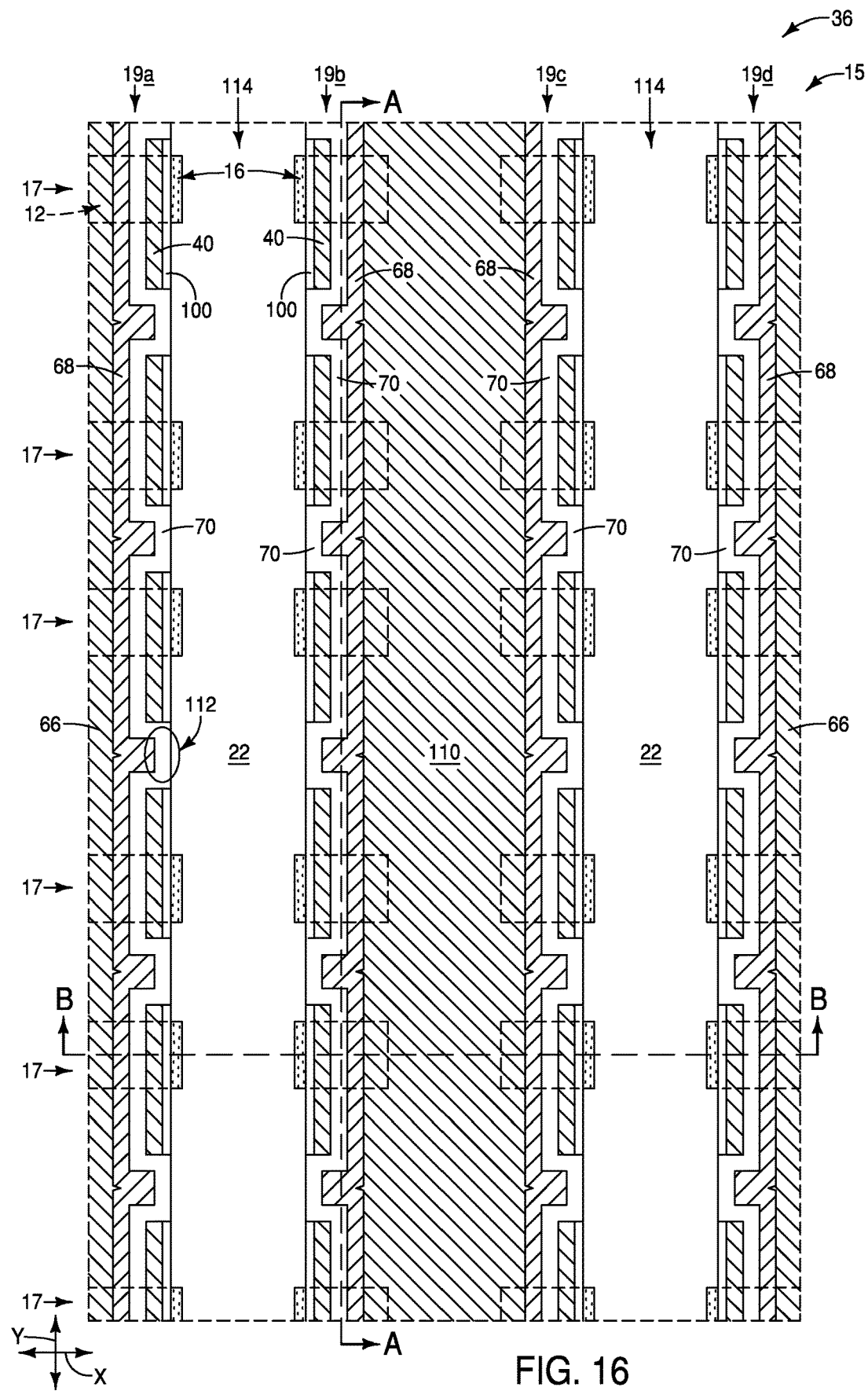
FIGS. 16-16B are diagrammatic views of the region of FIGS. 1-1B at an example process stage following that of FIGS. 15-15B.
Figure 16A:
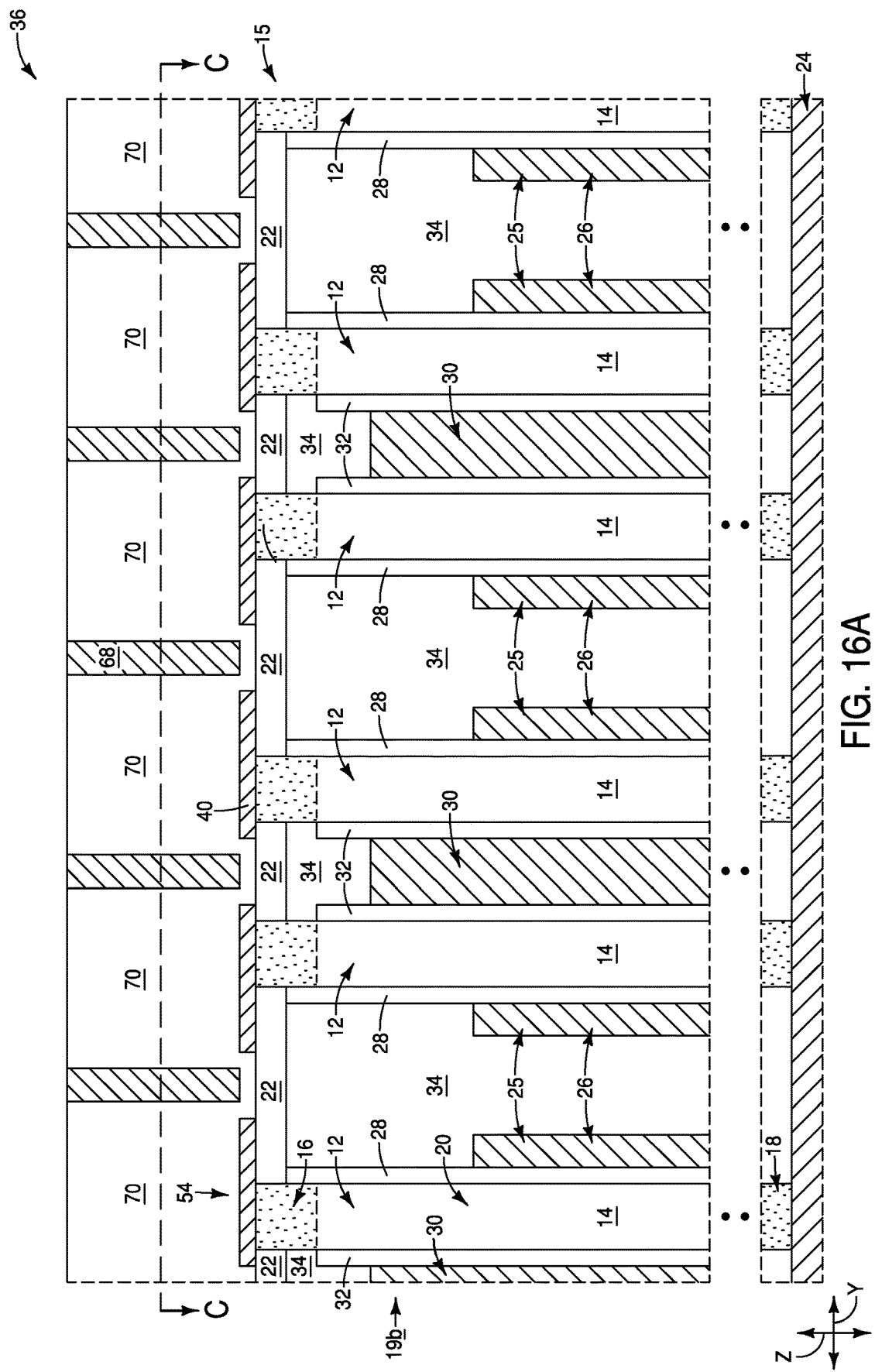
Figure 16B:
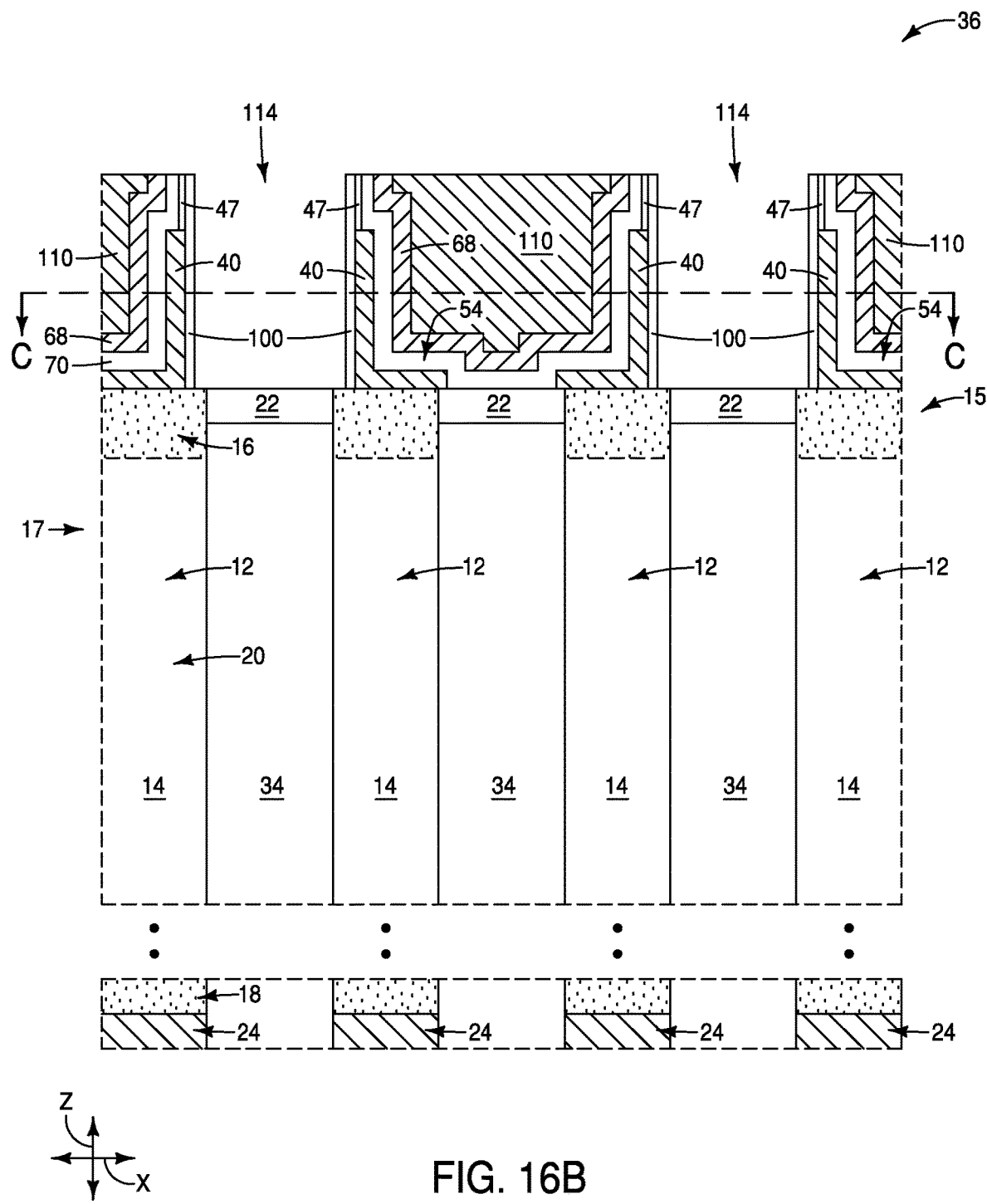

Referring to FIGS. 16-16B, the sacrificial material 39 (FIGS. 15-15B) is removed to form trenches (openings) 114. Portions (segments, regions) of the insulative-material 70 are exposed along sidewalls of the trenches 114 within the regions 112.

Figure 17:
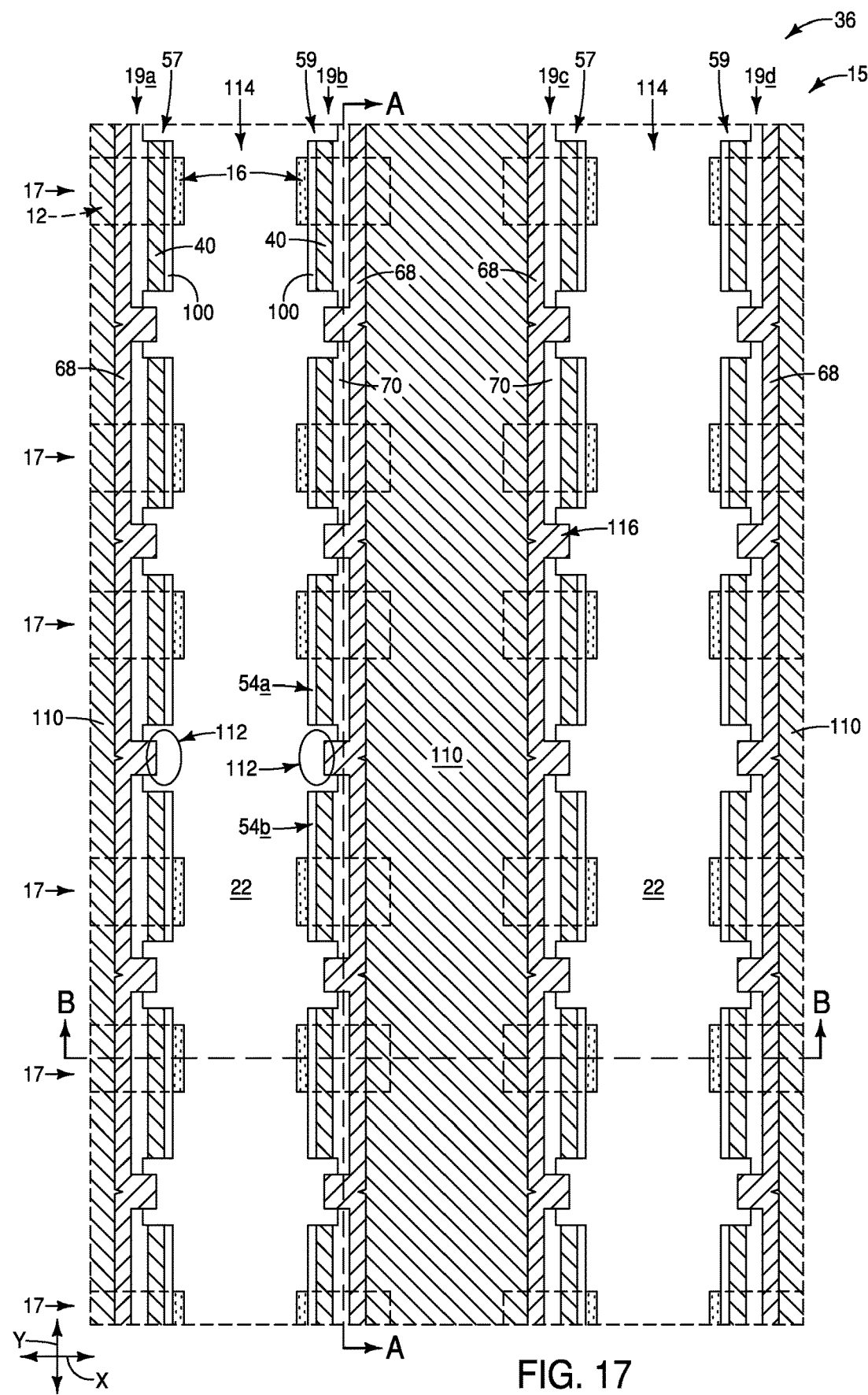
FIGS. 17-17B are diagrammatic views of the region of FIGS. 1-1B at an example process stage following that of FIGS. 16-16B.
Figure 17A:
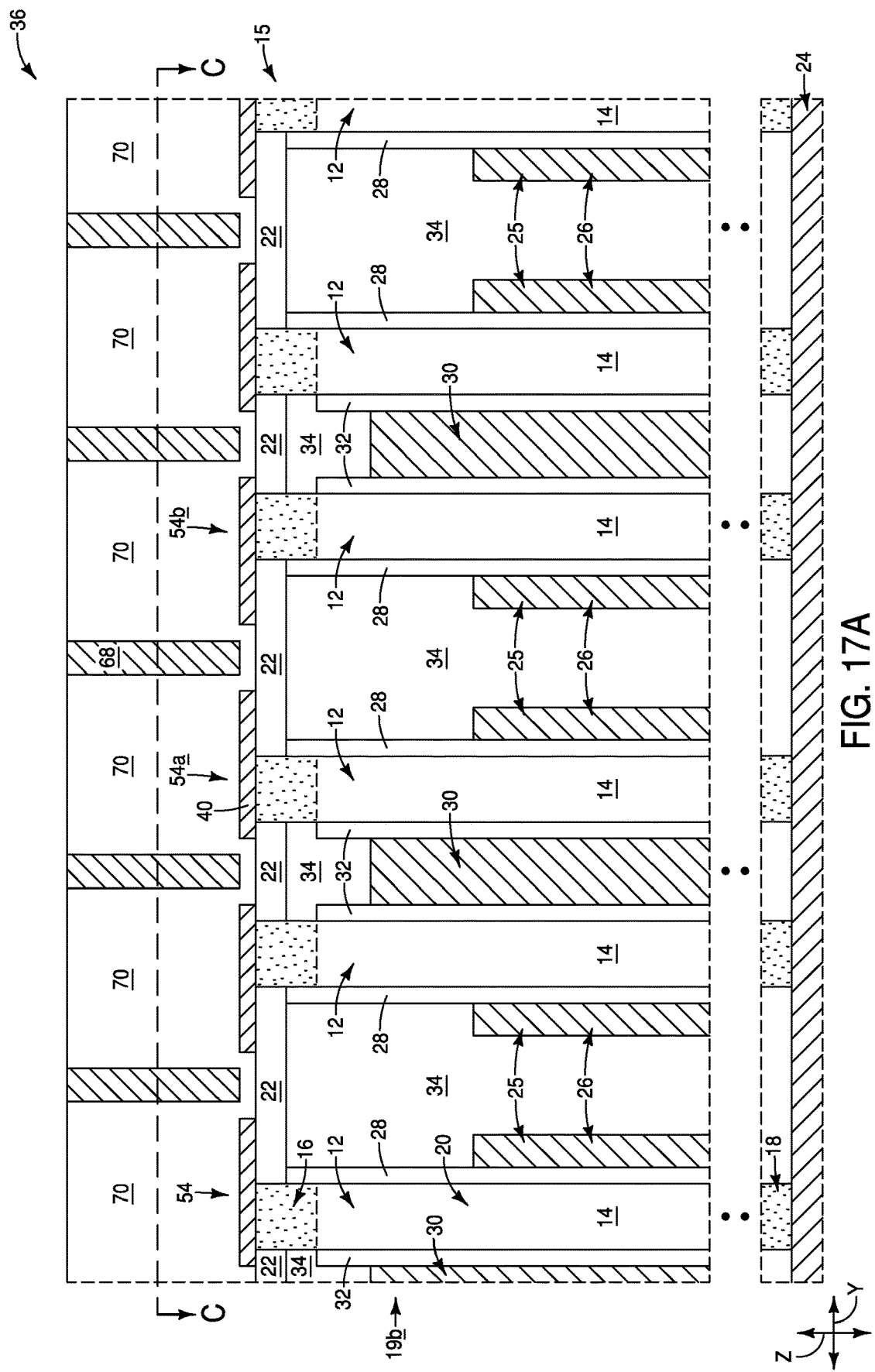
Figure 17B:
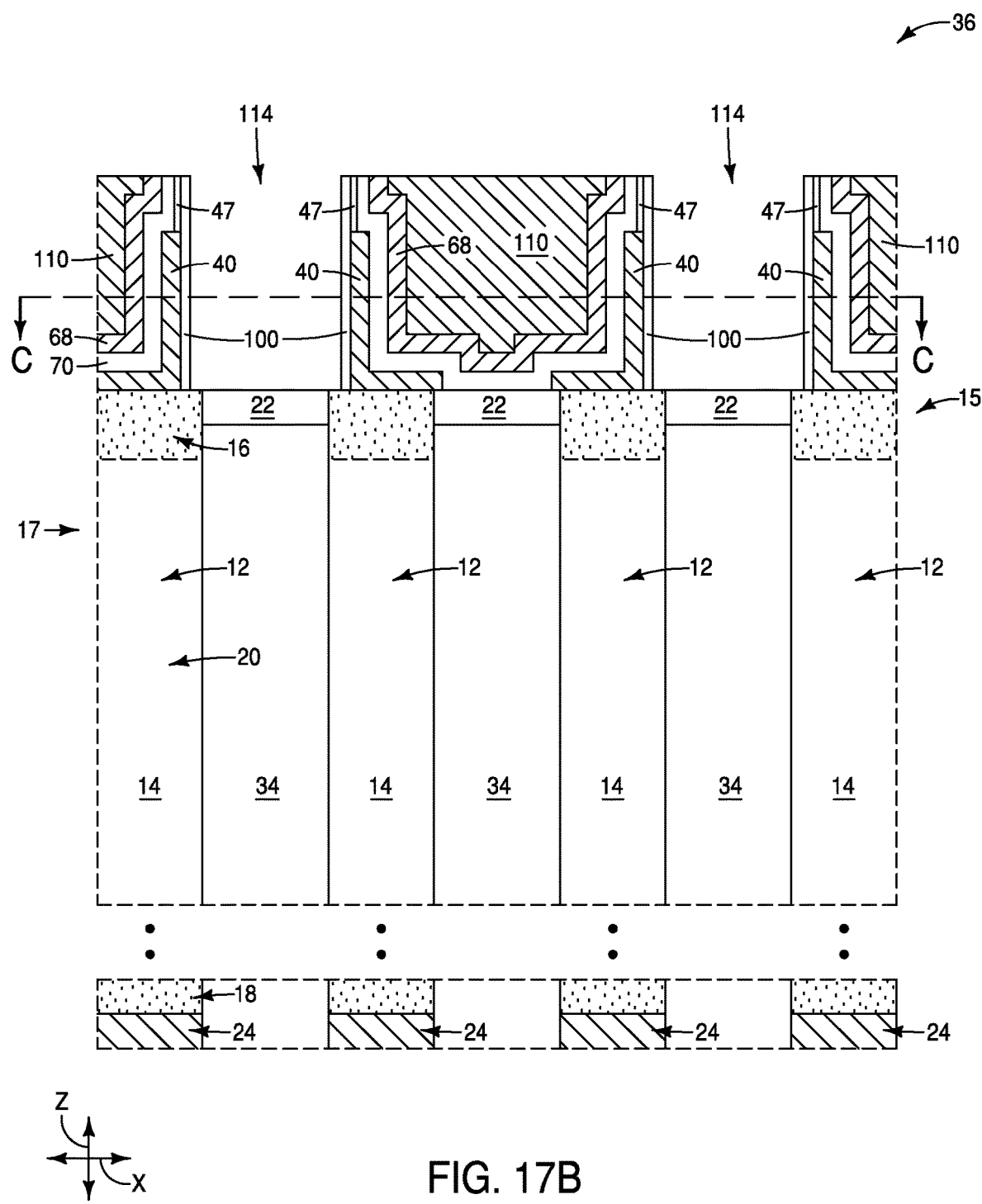
Figure 17C:
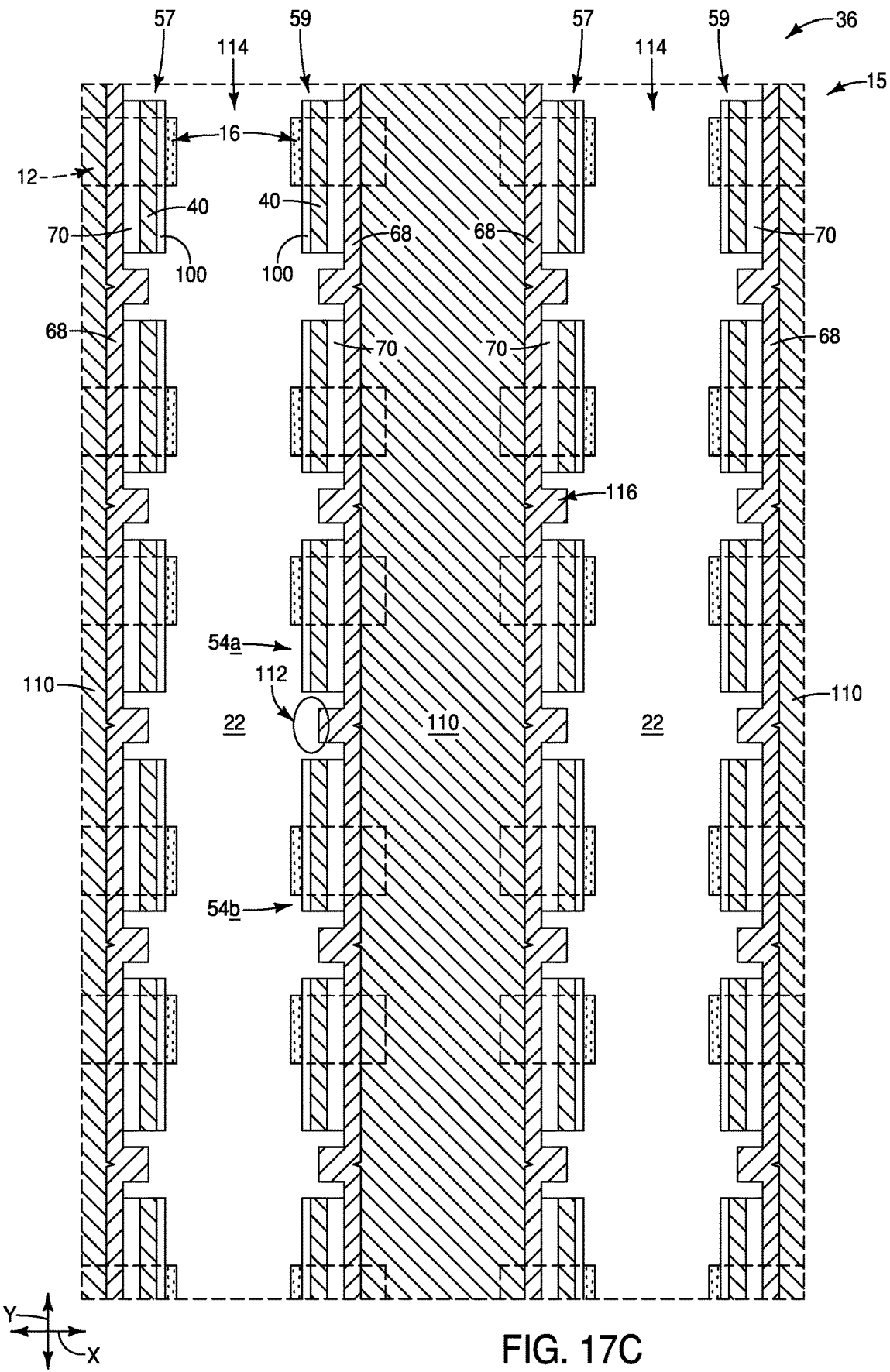
FIGS. 17C-17E are top-down sectional views analogous to the view of FIG. 17, and show alternative example embodiments.

Referring to FIGS. 17-17B, the exposed regions of the insulative-material 70 (i.e., the regions of material 70 exposed within the regions 112 of FIG. 16) are recessed to alleviate (or even prevent) cross-talk between neighboring bottom electrodes 54 that may occur without the recessing of the capacitor-insulative-material. FIG. 17 shows an embodiment in which the insulative-material 70 is recessed to a depth which removes it from being directly between longitudinally adjacent bottom electrodes 54 (e.g., from between the electrodes 54 labeled 54a and 54b in FIGS. 17 and 17a), which leaves a gap shown in a region 112 of FIG. 17a. In some embodiments, the entirety of the insulative-material 70 may be removed from within the regions 112, as shown in FIG. 17C. In some embodiments, the embodiment of FIG. 17 may be considered to have some of the insulative-material 70 extending longitudinally between the longitudinally-adjacent electrodes 54a and 54b, even though the material 70 is recessed from being directly between the electrodes 54a and 54b. In contrast, the embodiment of FIG.

17C has substantially none (or even absolutely none) of the material 70 extending longitudinally between the electrodes 54a and 54b.

Figure 17D:
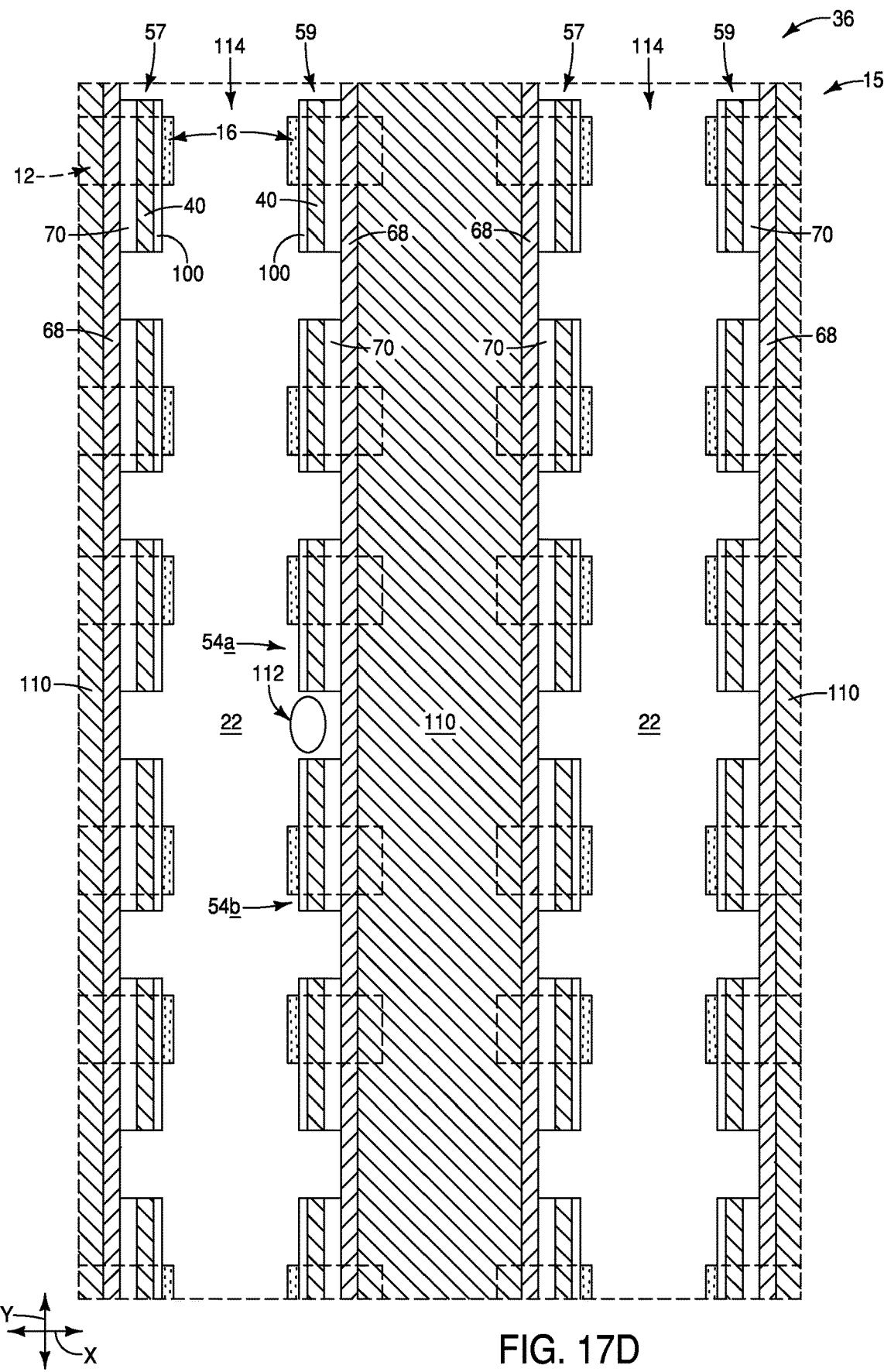
Figure 17E:
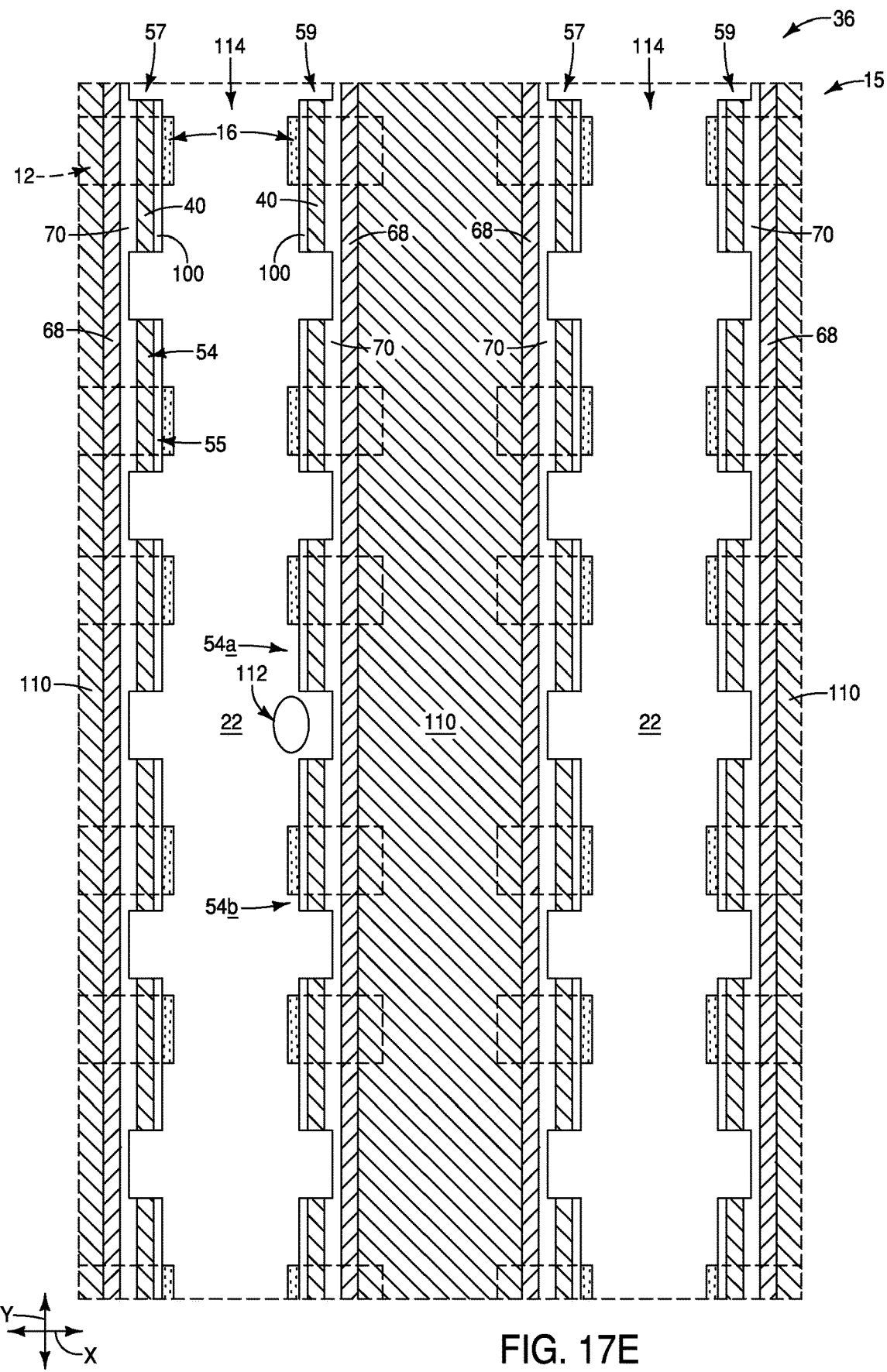

The embodiments of FIGS. 17 and 17C show portions (regions) 116 of the conductive material 68 projecting into the regions 112. In some embodiments, processing may be conducted to either remove the portions 116, or to eliminate formation of the portions 116. FIGS. 17D and 17E show embodiments in which the portions 116 of the conductive material 68 are omitted. FIG. 17D shows the material 70 substantially entirely omitted from the regions 112, and FIG. 17E shows the material 70 recessed within the regions 112 so that it is no longer directly between neighboring bottom electrodes (e.g., so that it is not directly between the longitudinally adjacent electrodes 54a and 54b).

In some embodiments, the configurations of FIGS. 17, 17C, 17D and 17E may be considered to have the capacitor-insulative-material 70 substantially absent (or entirely absent) from being directly between the bottom electrodes of the first and second sets 57 and 59; with the term "substantially absent" meaning absent to within reasonable tolerances of fabrication and measurement.

Figure 18:
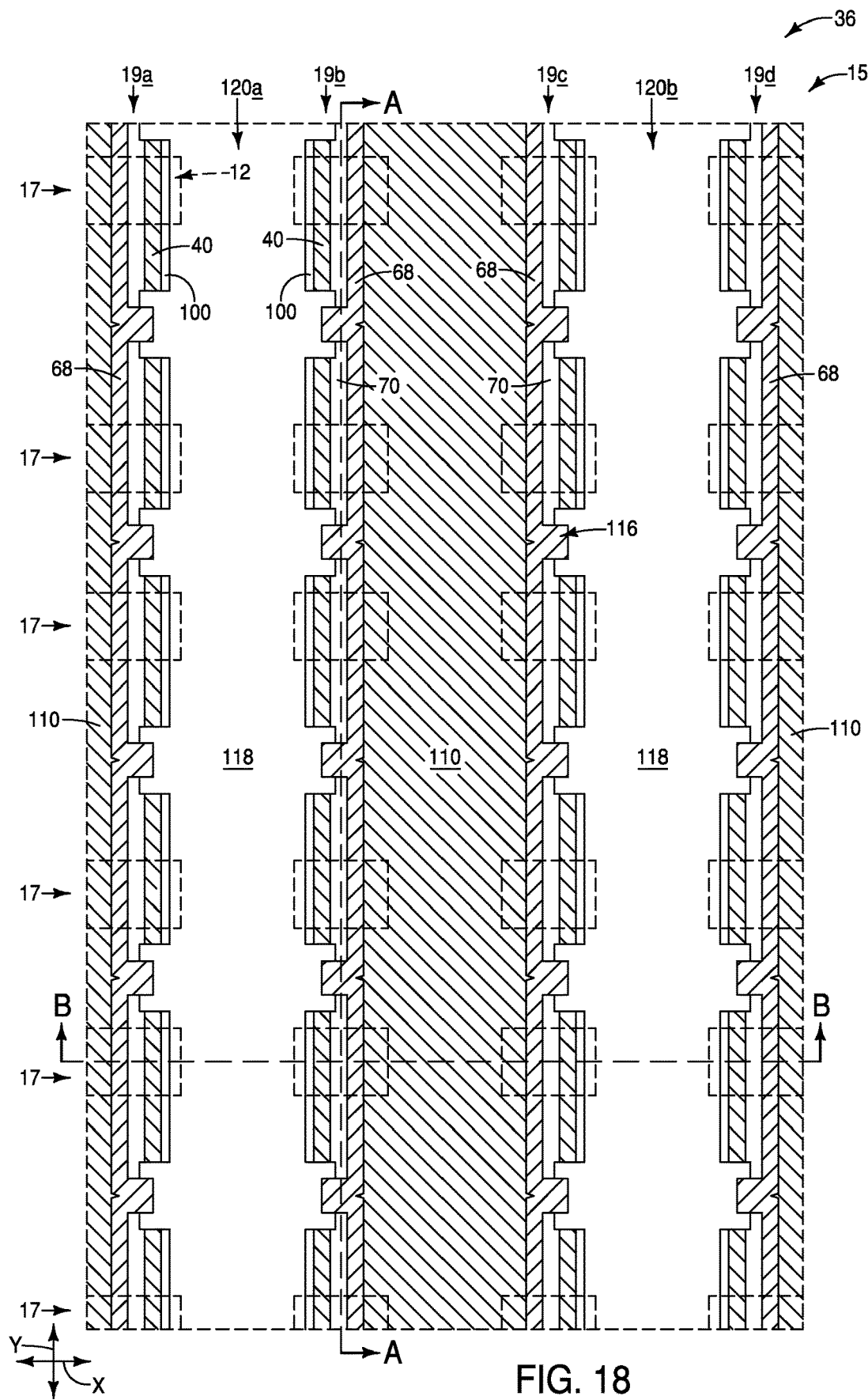
FIGS. 18-18B are diagrammatic views of the region of FIGS. 1-1B at an example process stage following that of FIGS. 17-17B.
Figure 18A:
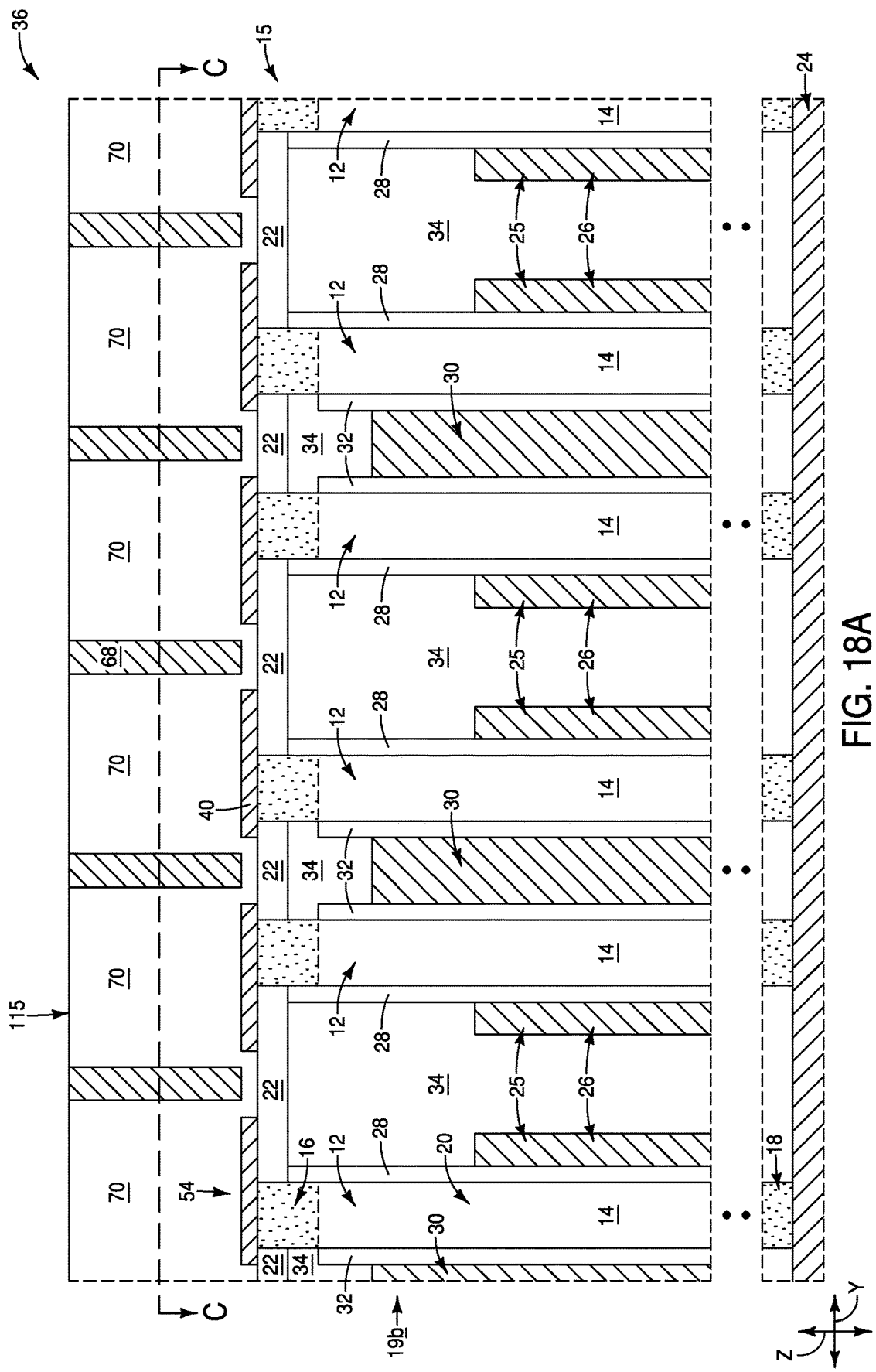
Figure 18B:
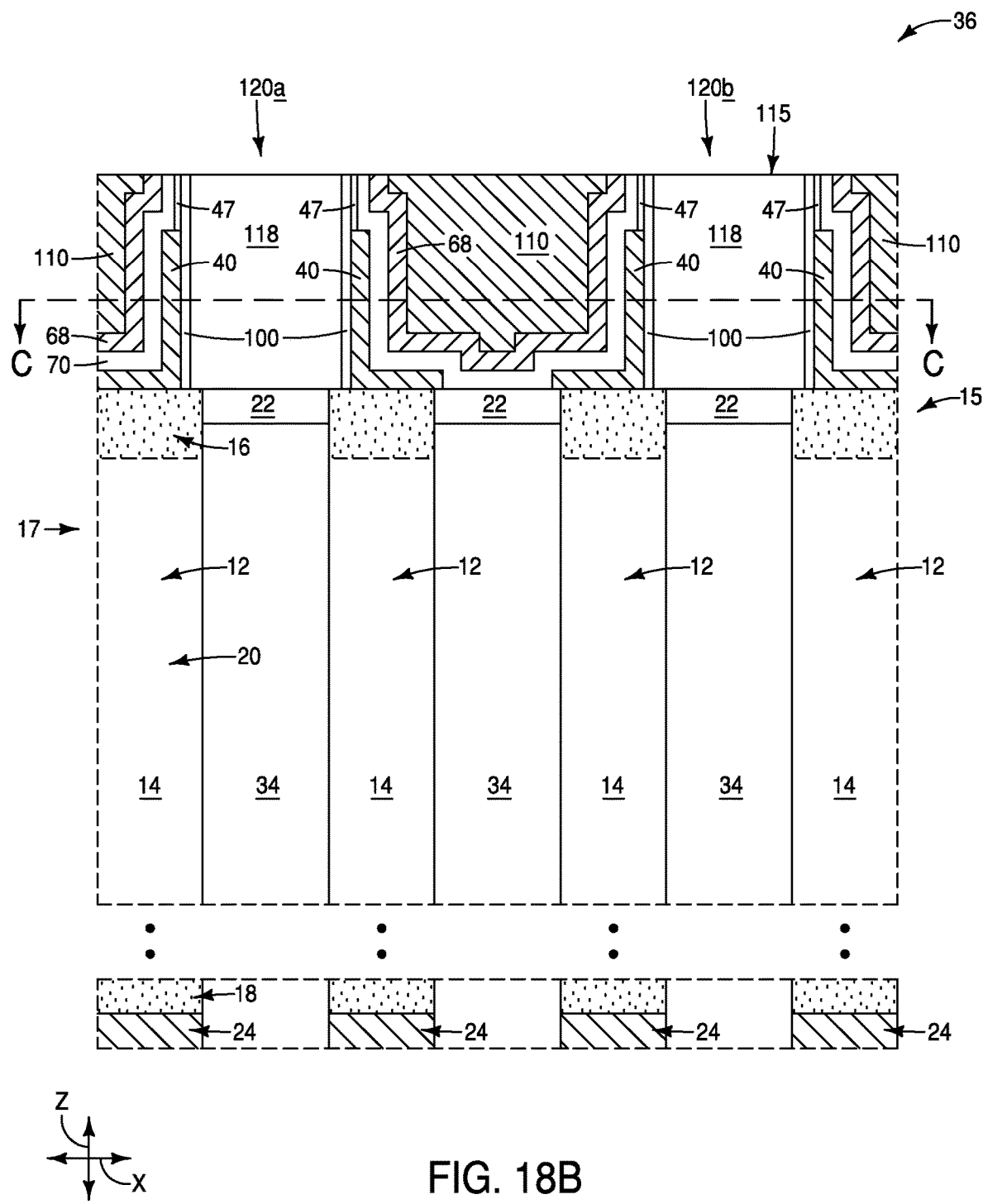

Referring to FIGS. 18-18B, insulative material 118 is formed within the trenches 114 (FIGS. 17-17B). The insulative material 118 may comprise any suitable composition(s), including, for example, one or more of silicon dioxide, silicon nitride, aluminum oxide, etc. The insulative materials 118 and 100 may be together considered to form linear structures 120 (labeled 120a and 120b). The linear structures 120 may be referred to as second linear structures to distinguish them from the linear structures 104 described above.

A planarized surface 115 is formed to extend across the materials 118, 100, 47, 70, 68 and 110.

Figure 19:
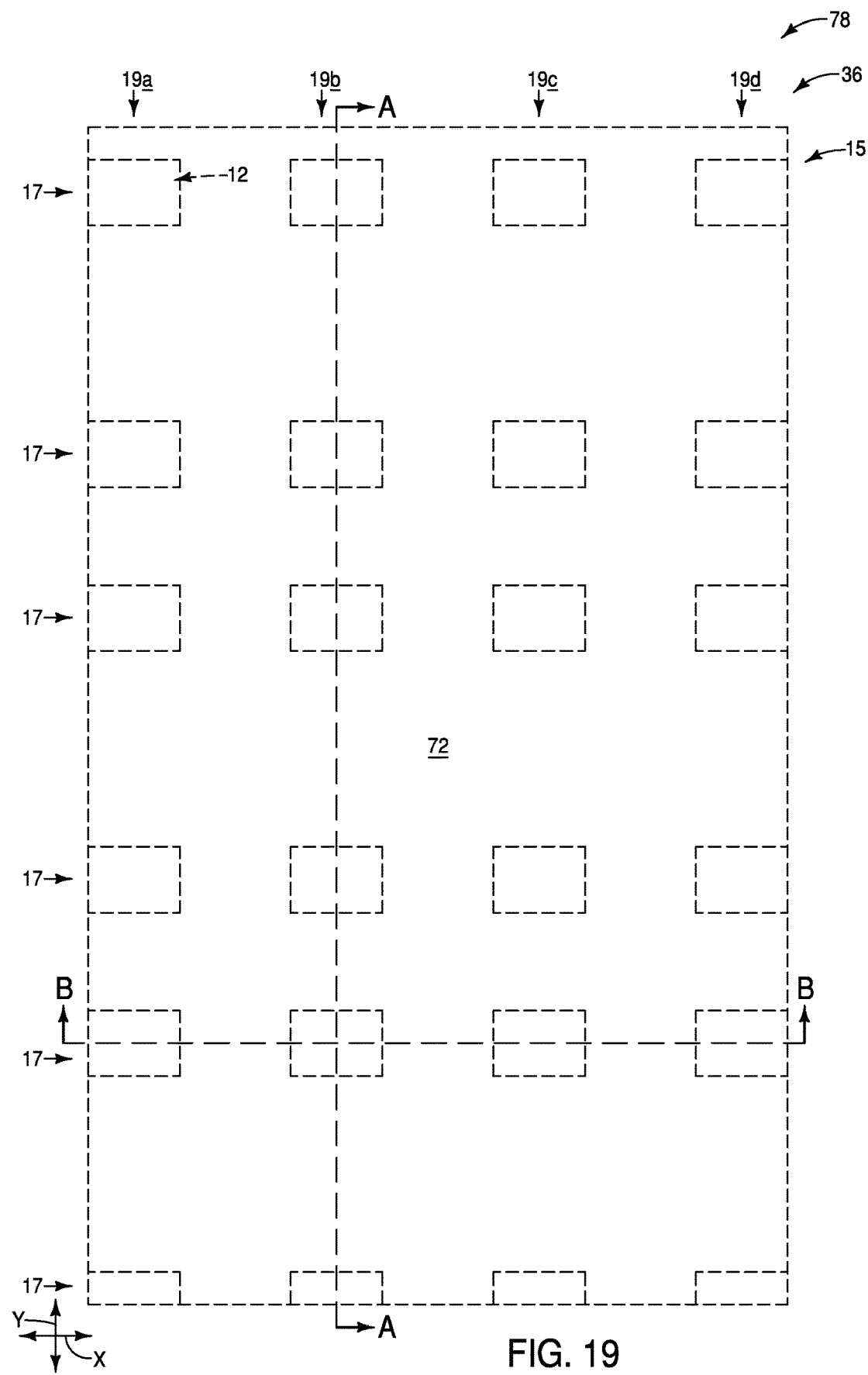
FIGS. 19-19B are diagrammatic views of the region of FIGS. 1-1B at an example process stage following that of FIGS. 18-18B.
Figure 19A:
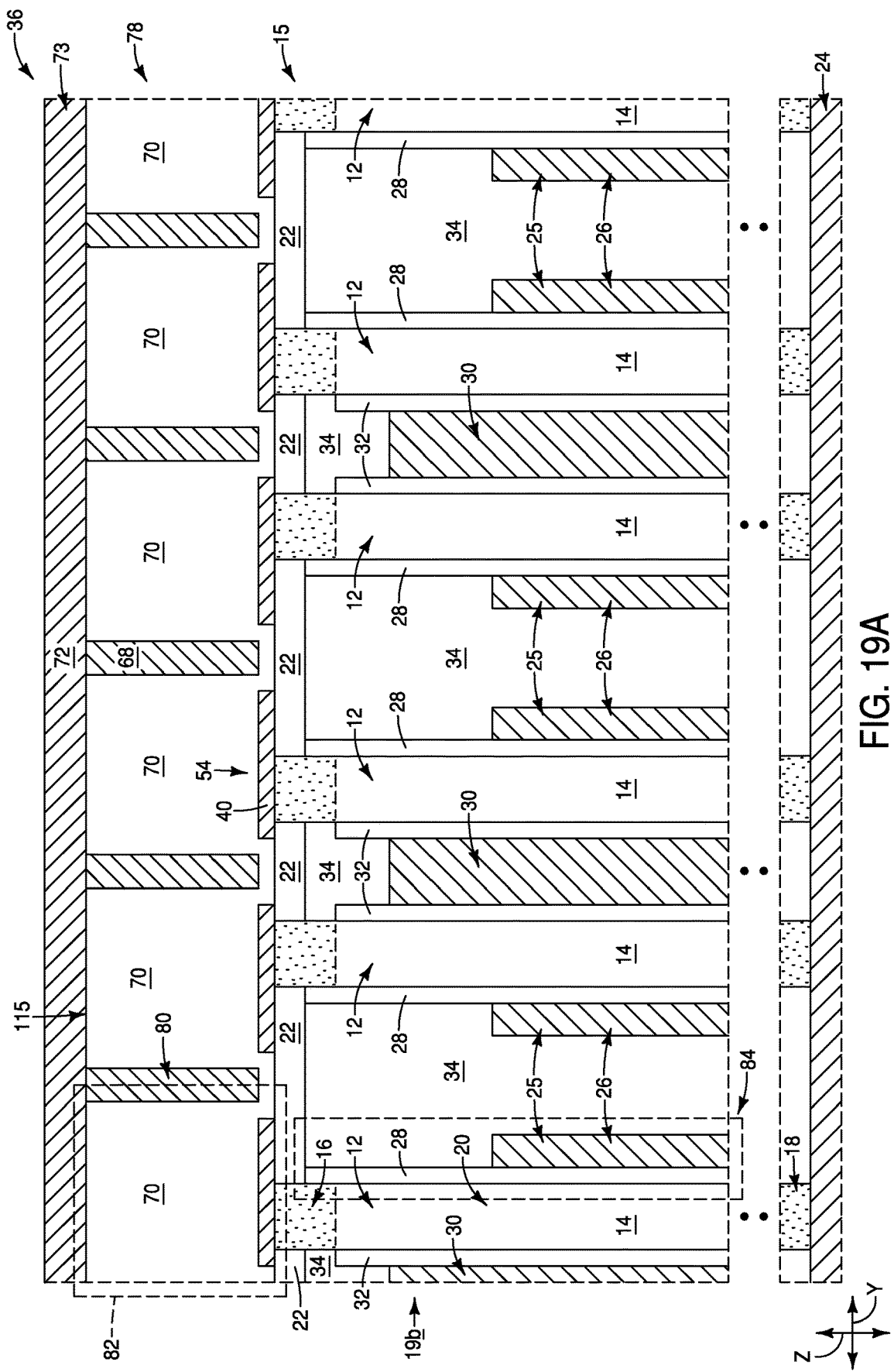
Figure 19B:
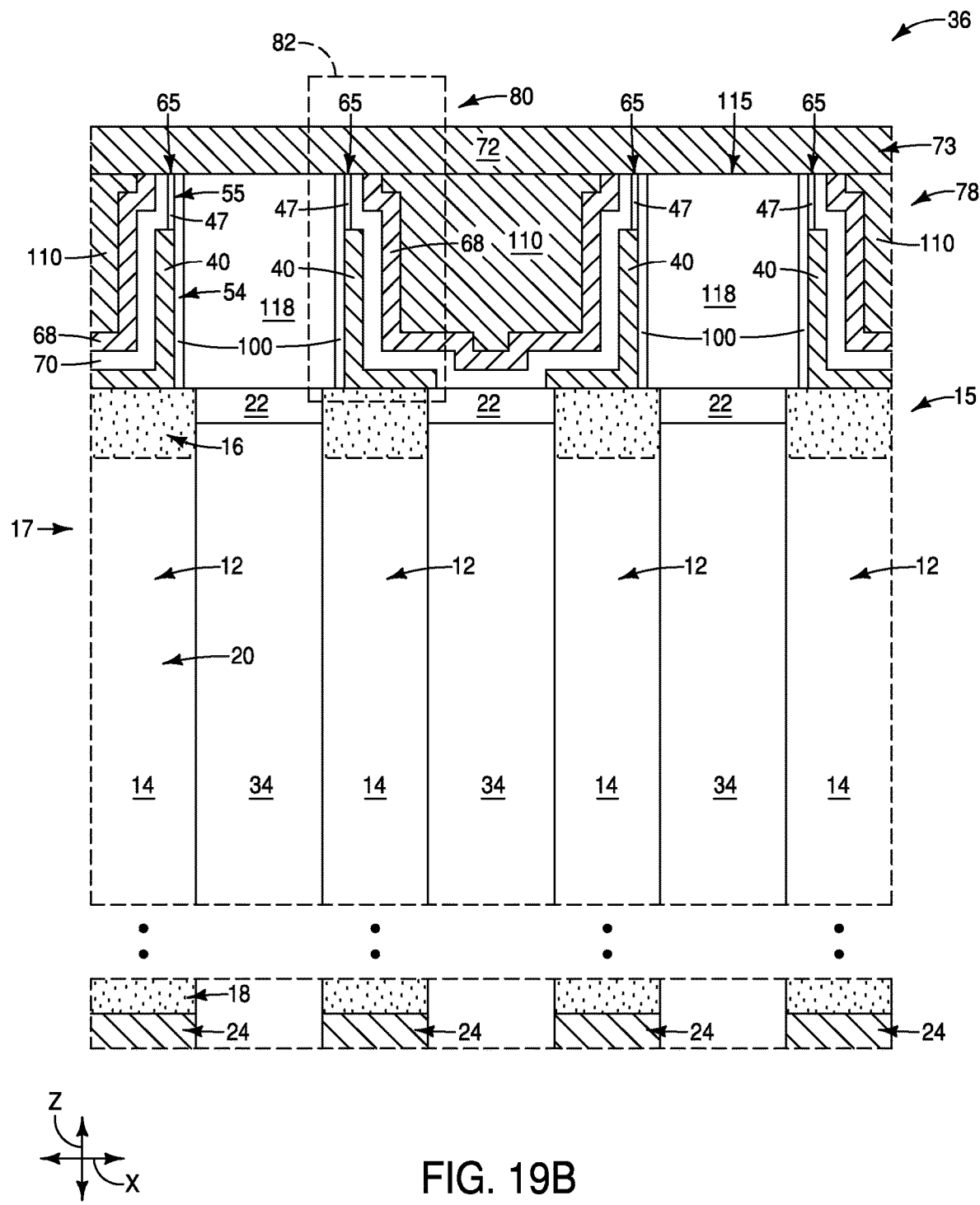

Referring to FIGS. 19-19B, additional top electrode material 72 is formed over the top electrode materials 68 and 110. The material 72 may be referred to as plate material. The material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The material 72 may or may not comprise a same composition as one or both of the materials 68 and 110. In some embodiments, the materials 68 and 110 comprise, consist essentially of, or consist of titanium nitride, and the material 72 comprises, consists essentially of, or consists of tungsten.

The conductive materials 68, 110 and 72 together form a top electrode (or a plate electrode) 73.

The top electrode 73 is directly against the upper edges 65 of the leaker-device-structures 55. Accordingly, the leaker-device-structures 55 extend between the bottom electrodes 54 and the top electrode 73, and are directly against the bottom electrodes 54 and the top electrode 73.

The bottom electrodes 54, capacitor-insulative-material 70, and top electrode 73 together form capacitors 82 (one of which is labeled in each of FIGS. 19A and 19B). The capacitors are incorporated into memory cells 80 (one of which is labeled in each of FIGS. 19A and 19B), with the memory cells forming a memory array 78.

In some embodiments, the leaker-device-structures (leaker devices) 55 may be considered to be resistive interconnects coupling bottom electrodes 54 to the top electrode 73 within the individual capacitors 82, and may be utilized to drain excess charge from the bottom electrodes 54 to alleviate or prevent undesired charge build-up. If the leaker devices 55 are too leaky, then one or more memory cells 80 may experience cell-to-cell disturb. If the leaker devices 55 are not leaky (conductive) enough, then excess charge from the bottom electrodes 54 may not be adequately drained. Persons of ordinary skill in the art will recognize how to calculate the resistance needed for the leaker devices 55 for a given memory array. In some embodiments, the leaker devices 55 may have resistance within a range of from about 0.1 megaohms to about 5 megaohms. Factors such as separation between adjacent memory cells, physical dimensions of the memory cells, the amount of charge placed in the memory cells, a size of the memory array, a frequency of operations conducted by the memory array, etc., may be considered when making a determination of the resistance appropriate for the leaker devices 55.

The integrated assembly 36 of FIGS. 19-19B may be considered to correspond to a portion of the memory array (memory device) 78. Such memory array includes the memory cells 80 which each include a capacitor 82. The capacitors each include one of the bottom electrodes 54; and includes regions of the insulative material 70 and the top electrode (plate electrode) 73.

The individual memory cells 80 each include an access transistor 84 coupled with the capacitor 82 (one of the access transistors 84 is diagrammatically indicated in FIG. 19A). Each of the access transistors 84 includes a pillar 12 and a region of a transistor gate 26 adjacent such pillar.

Each of the memory cells 80 is uniquely addressed by one of the wordlines 25 in combination with one of the digit lines 24. In some embodiments, the memory cells 80 may be considered to be substantially identical to one another, and to be representative of a large number of substantially identical memory cells which may be formed across the memory array 78. For instance, the memory array may comprise hundreds, thousands, hundreds of thousands, millions, hundreds of millions, etc., of the memory cells. The wordlines 25 may be representative of a large number of substantially identical wordlines that may extend along rows of the memory array, and the digit lines 24 may be representative of a large number of substantially identical digit lines that may extend along columns of the memory array. The term "substantially identical" means identical to within reasonable tolerances of fabrication and measurement.

In some embodiments, the capacitors 82 may be ferroelectric capacitors comprising ferroelectric-insulative-material 70. Accordingly, the memory array 78 may comprise FeRAM.

Some embodiments include recognition that it may be advantageous to sub-divide the top electrode 73 into multiple plates. Voltage to the individual plates may be independently controlled, which may enable the electric field across the material 70 to be tailored within specific regions of the memory array 78 during memory operations (e.g., READ/WRITE operations). Such may enable charge/discharge rates of the capacitors 82 to be increased, which may improve operational speeds associated with memory cells 80 of the memory array 78. It may be particularly advantageous for the top electrode material to be subdivided with slits extending along the column direction (i.e., the y-axis direction of the figures).

Figure 20:
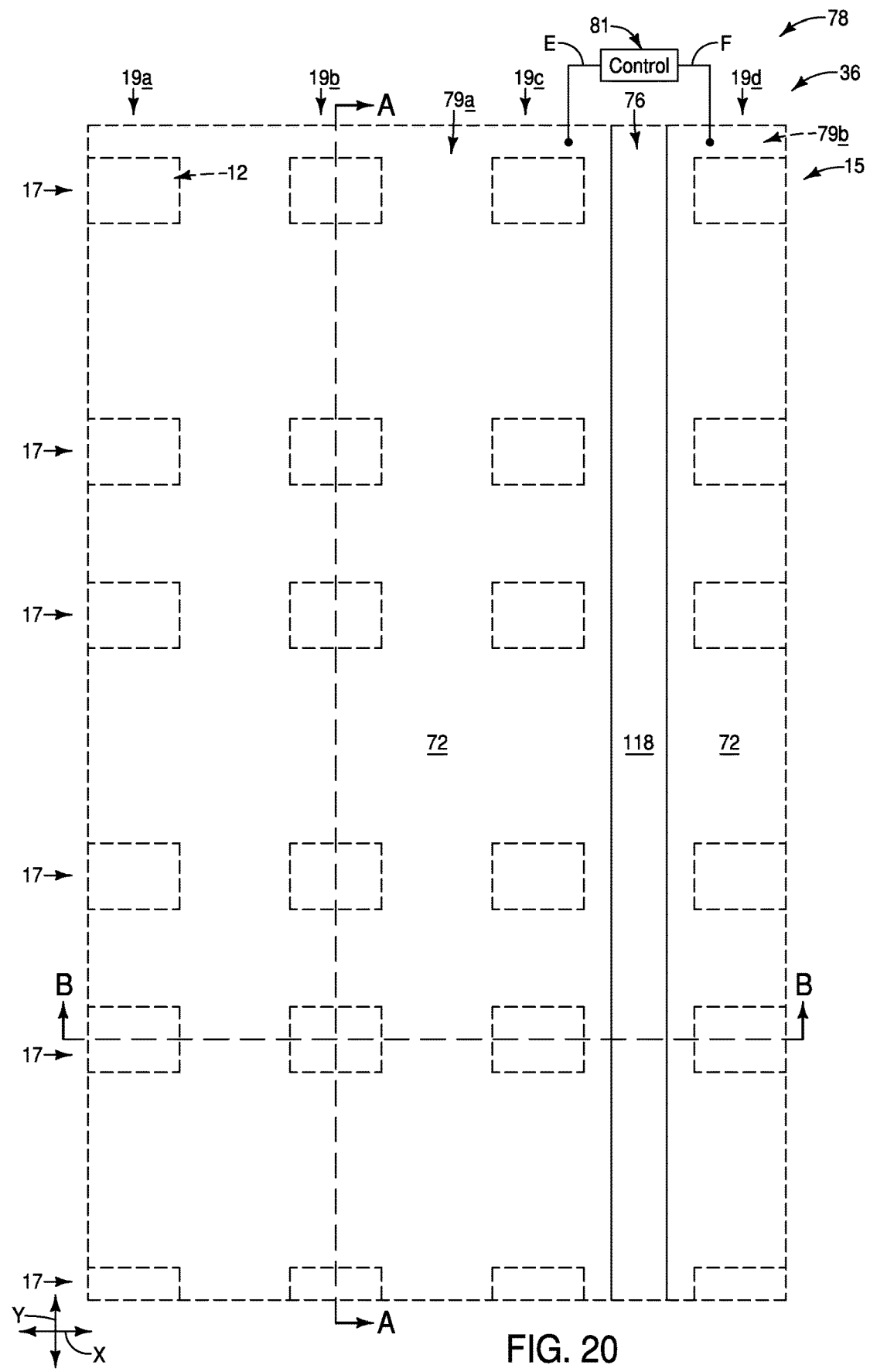
FIGS. 20-20B are diagrammatic views of the region of FIGS. 1-1B at an example process stage following that of FIGS. 19-19B.
Figure 20A:
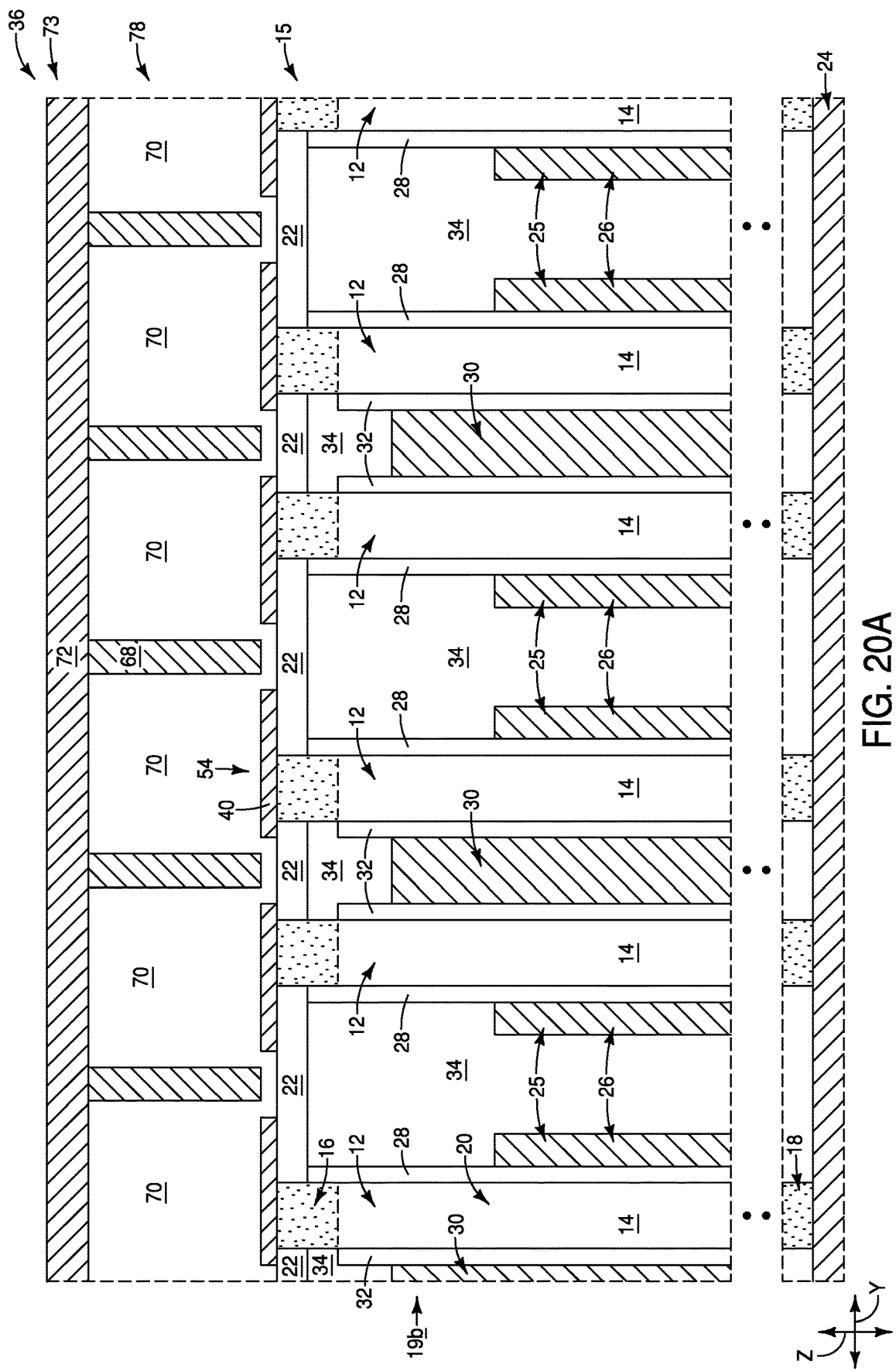
Figure 20B:
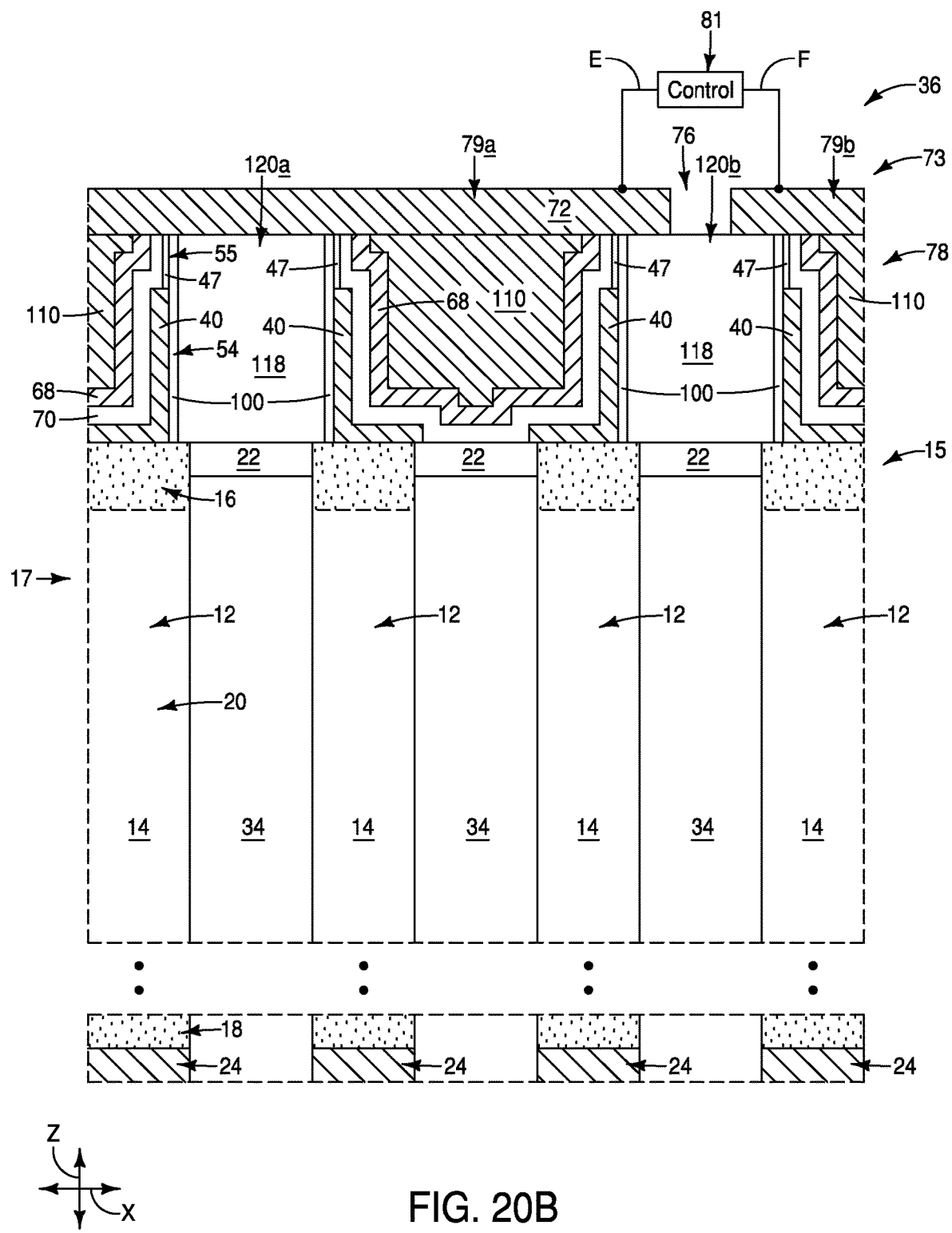

FIGS. 20-20B show the assembly 36 after a slit 76 is formed to extend through the top-electrode-material 72 (i.e., through the top electrode 73). In the shown embodiment, the slit 76 stops at the insulative material 118 of the insulative structure 120b. In other embodiments, the slits may penetrate into (or even through) the insulative material 118.

The slit 76 may be patterned with any suitable processing. For instance, a photoresist mask (not shown) may be used to define the location of the slit, one or more etches may be used to etch through the material 72 and form the slit in such location, and then the mask may be removed to leave the configuration of FIGS. 15-15B.

The illustrated slit 76 extends along the column direction (i.e., the illustrated y-axis direction) and is directly over the linear structure 120b. Although one slit 76 is shown, there may be additional slits formed in other embodiments.

The slit 76 subdivides the top electrode 73 into plate structures (plates) 79a and 79b. Although two of the plates 79 are formed in the shown embodiment, in other embodiments there may be a different number of plates formed depending on the number of the slits 76 formed. Generally, there will be at least two of the plates 79 formed utilizing the slit(s) 76.

Control circuitry 81 (which may also be referred to as a control circuit) may be utilized to provide desired voltages to the plates 79 (i.e., to independently control voltages to the different plates 79).

The illustrated plates 79a and 79b may be at a different voltage relative to one another. Specifically, one of the plates may be at a first voltage, and another of the plates may be at a second voltage which is different than the first voltage. In the shown embodiment, the control circuitry 81 provides voltages E and F to the separate plates 79a and 79b. If there are more than two of the plates 79, the control circuitry 81 may provide a different voltage to at least one of the plates relative to at least one other of the plates.

The memory array 78 of FIGS. 20-20B may have any suitable configuration. An example FeRAM array 78 is described schematically with reference to FIG. 21. The memory array includes a plurality of substantially identical memory cells 80, which each include a ferroelectric capacitor 82 and an access transistor 84. Wordlines 25 extend along rows of the memory array, and digit lines 24 extend along columns of the memory array. Each of the memory cells is uniquely addressed utilizing a combination of a wordline and a digit line. The wordlines extend to driver circuitry (Wordline Driver Circuitry) 130, and the digit lines 24 extend to detecting (sensing) circuitry (Sense Amplifier Circuitry) 140. The top electrodes of the capacitors 82 are shown coupled with plate structures 79, and the plate structures are shown to be coupled with the control circuitry 81.

At least some of the circuitry 130, 140 and 81 may be directly under the memory array 78. One or more of the circuitries 130, 140 and 81 may include CMOS, and accordingly some embodiments may include CMOS-under-array architecture.

Figure 21:
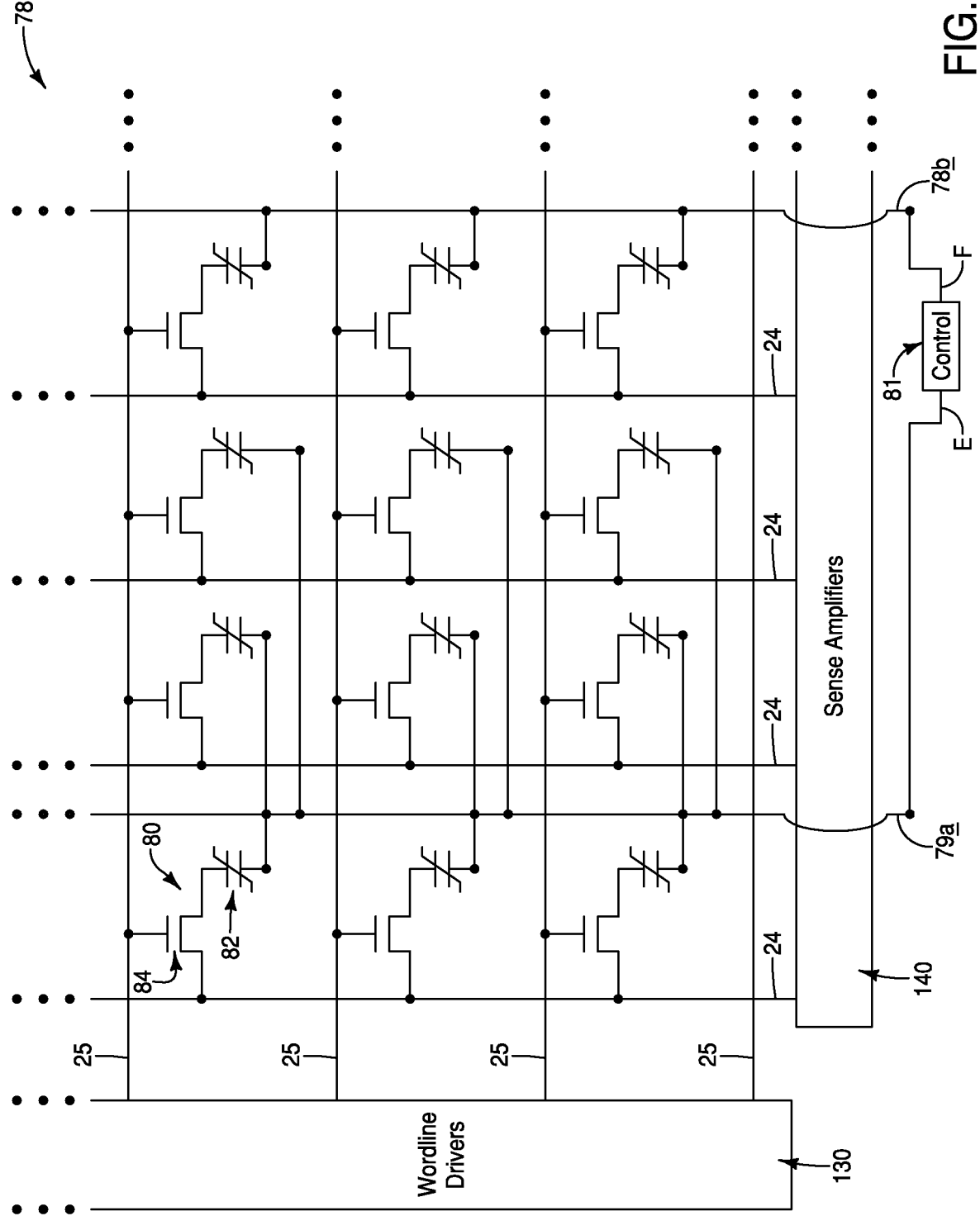
FIG. 21 is a schematic diagram of an example memory array comprising ferroelectric capacitors.
Figure 22:
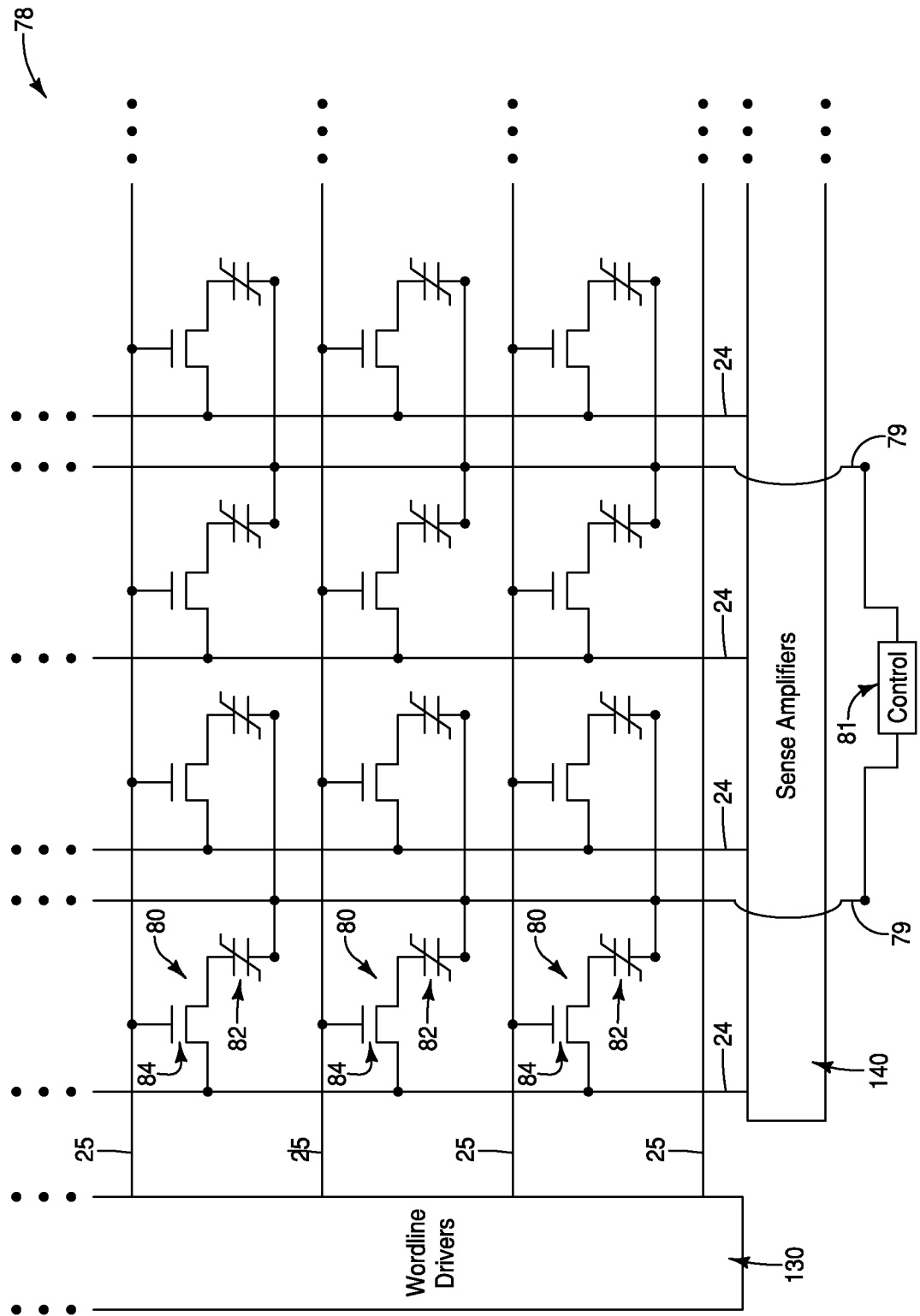
FIG. 22 is a schematic diagram of another example memory array comprising ferroelectric capacitors.

FIGS. 20 and 21 show an embodiment in which a plate structure is shared by three columns of memory cells. In other embodiments, a different number of memory cells may share a plate structure, depending on the number of slits 76 that are formed. For instance, FIG. 22 schematically illustrates a region of the memory array 78 similar to that of FIG. 21, except that two columns memory cells 80 share each of the plate structures 79.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first bottom electrode and a second bottom electrode. The first and second bottom electrodes are adjacent to one another, and an intervening region is directly between the first and second bottom electrodes. Insulative-material is adjacent to the first and second bottom electrodes. The insulative-material is substantially not within the intervening region. Top-electrode-material is adjacent to the insulative-material.

Some embodiments include an integrated assembly having pillars arranged in an array. The array comprises a row direction and a column direction. The pillars have upper source/drain regions, lower source/drain regions, and channel regions between the upper and lower source/drain regions. Gating structures are proximate to the channel regions and extend along the row direction. Conductive structures are beneath the pillars and are coupled with the lower source/drain regions. The conductive structures extend along the column direction. Insulative structures are above the pillars and extend along the column direction. Each of the insulative structures has a first lateral side and an opposing second lateral side, and is associated with a pair of the columns of the pillars along said first and second lateral sides. Bottom electrodes are coupled with the upper source/drain regions. The bottom electrodes are configured as angle plates. The angle plates have horizontal segments adjacent to the upper source/drain regions and have vertical segments extending upwardly from the horizontal segments. The vertical segments are adjacent to the lateral sides of the insulative structures. The bottom electrodes include a first set adjacent the first lateral sides and include a second set adjacent the second lateral sides. Insulative-material is adjacent the bottom electrodes. The insulative-material is substantially absent from regions directly between the bottom electrodes of the first set and from regions directly between the bottom electrodes of the second set. Top-electrode-material is adjacent to the insulative-material.

Some embodiments include a method of forming an integrated assembly. A construction is formed to have an array of pillars comprising semiconductor material. The array comprises rows and columns, with the rows extending along a row direction and with the columns extending along a column direction. The pillars have upper source/drain regions, lower source/drain regions, and channel regions between the upper and lower source/drain regions. The construction includes gating structures which extend along the row direction, and which are proximate to the channel regions, and includes conductive structures which extend along the column direction, and which are coupled with the lower source/drain regions. The construction includes a first insulative material between the upper source/drain regions of the pillars. An upper surface of the construction extends across the first insulative material and across upper surfaces of the upper source/drain regions. Linear structures are formed over the upper surface and extend along the column direction. Each of the linear structures has a first lateral side and an opposing second lateral side, and is associated with a pair of columns of the pillars along said first and second lateral sides. The linear structures comprise sacrificial material and another material along lateral sidewalls of the sacrificial material. Sidewalls of the linear structures are along said other material. Bottom-electrode-material is formed conformally along the linear structures and along regions of the upper surface between the linear structures. The bottom-electrode-material is patterned into bottom-electrode-structures. The other material is removed from regions between the bottom-electrode-structures. Capacitor-insulative-material is formed adjacent to the bottom-electrode-structures and along the regions between the bottom-electrode-structures. The sacrificial material is removed to expose segments of the capacitor-insulative-material material along the regions between the bottom-electrode-structures. At least portions of the exposed segments of capacitor-insulative-material are removed. Top-electrode-material is formed adjacent to the capacitor-insulative-material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a bottom electrode;
   a planar structure comprising top-electrode-material spaced over the bottom electrode; and
   a leaker device extending from the bottom electrode to the top-electrode-material.

2. The integrated assembly of claim 1 wherein the top-electrode-material has a slit that extends along a direction same as a direction of a digit line.

3. The integrated assembly of claim 1 wherein the leaker device extends from a top-most surface of the bottom electrode to a bottommost surface of the top-electrode-material.

4. The integrated assembly of claim 1 wherein the leaker device comprises one or more of titanium, nickel and niobium in combination with one or more of germanium, silicon, oxygen, nitrogen and carbon.

5. The integrated assembly of claim 1 wherein the leaker device comprises a continuous layer.

6. The integrated assembly of claim 5 wherein the leaker device comprises a thickness within a range of from about 6 Å to about 15 Å.

7. An integrated assembly, comprising:
   a bottom electrode;
   an insulative rail supporting the bottom electrode and extending along a direction same as a direction of a digit line; and
   capacitor-insulative-material extending along the bottom electrode.

8. The integrated assembly of claim 7 wherein the insulative rail comprises a sacrificial material.

9. The integrated assembly of claim 7 wherein the insulative rail comprises one or more of silicon, low-density silicon dioxide and carbon.

10. The integrated assembly of claim 9 wherein the silicon comprises one or both of amorphous silicon and polycrystalline silicon.

11. An integrated assembly, comprising:
    a first bottom electrode comprising a pair of angle plates;
    a second bottom electrode comprising a pair of angle plates extending in an opposite direction to the first bottom electrode; and
    capacitor-insulative-material extending between the same one plate of each pair of angle plates of the first and second bottom electrodes.

12. The integrated assembly of claim 11 wherein each pair of angle plates comprises a L-shape.

13. The integrated assembly of claim 11 wherein the capacitor-insulative-material is the only material directly between each of the same one plate of each pair of angle plates of the first and second bottom electrodes.

14. The integrated assembly of claim 11 wherein the capacitor-insulative-material extends along both of the first and second bottom electrodes.

* * * * *